US012639492B2

(12) United States Patent
Pathak et al.

(10) Patent No.: US 12,639,492 B2
(45) Date of Patent: May 26, 2026

(54) APPARATUSES, COMPUTER-IMPLEMENTED METHODS, AND COMPUTER PROGRAM PRODUCTS FOR REAL-TIME ENVIRONMENT DIGITAL TWIN SIMULATING

(71) Applicant: INTELLIGRATED HEADQUARTERS, LLC, Mason, OH (US)

(72) Inventors: Mayank Pathak, Pittsburgh, PA (US); Thomas Henry Evans, Morgantown, WV (US); Jagtar Singh, Pittsburgh, PA (US)

(73) Assignee: INTELLIGRATED HEADQUARTERS, LLC, Mason, OH (US)

( * ) Notice: Subject to any disclaimer, the term of this patent is extended or adjusted under 35 U.S.C. 154(b) by 1301 days.

(21) Appl. No.: 17/466,545

(22) Filed: Sep. 3, 2021

(65) Prior Publication Data

US 2023/0076433 A1     Mar. 9, 2023

(51) Int. Cl.
G06F 30/27        (2020.01)
G06N 20/00        (2019.01)
G06Q 10/0637      (2023.01)
G06Q 10/0639      (2023.01)

(52) U.S. Cl.
CPC ............. *G06F 30/27* (2020.01); *G06N 20/00* (2019.01); *G06Q 10/06375* (2013.01); *G06Q 10/0639* (2013.01)

(58) Field of Classification Search
CPC ......... G06F 30/27; G06F 30/20; G06N 20/00; G06Q 10/06375; G06Q 10/0639
See application file for complete search history.

(56) References Cited

U.S. PATENT DOCUMENTS

2012/0191630 A1*   7/2012   Breckenridge ........ G06N 20/00
                                                    706/12
2022/0134537 A1*   5/2022   Chadalavada Vijay Kumar .........
                                                    B25J 9/163
                                                    700/250

OTHER PUBLICATIONS

He F, Ong SK, Nee AY. An integrated mobile augmented reality digital twin monitoring system. Computers. Aug. 12, 2021;10(8):99. (Year: 2021).*
Liu S, Lu S, Li J, Sun X, Lu Y, Bao J. Machining process-oriented monitoring method based on digital twin via augmented reality. The International Journal of Advanced Manufacturing Technology. Apr. 2021;113:3491-508. (Year: 2021).*

(Continued)

*Primary Examiner* — Eunhee Kim
(74) *Attorney, Agent, or Firm* — Alston & Bird LLP

(57) ABSTRACT

Embodiments of the present disclosure provide for improved real-world environment simulation and processing thereof. Some embodiments enable real-time simulating of a real-world environment, and/or visualization of portion(s) of the corresponding simulated environment. Some embodiments enable accurate testing of alteration(s) to a real-world environment utilizing simulated environment(s) to determine the effects of such alteration(s), and apply alteration(s) that are determined from said simulations to improve operation of the real-world environment. Such alteration(s) may be applied automatically to enable a self-optimizing environment based on such simulation(s).

18 Claims, 16 Drawing Sheets

(56) References Cited

OTHER PUBLICATIONS

J. C. Jones, A. Panken and J. A. Lopez, "Surrogate-Based Optimization for Radar Surveillance Requirements to Support RWC and CA for Unmanned Aircraft," 2018 IEEE/AIAA 37th Digital Avionics Systems Conference (DASC), London, UK, 2018, pp. 1-10, doi: 10.1109/DASC.2018.8569321. (Year: 2018).*

Raschka S. Model evaluation, model selection, and algorithm selection in machine learning. arXiv preprint arXiv:1811.12808. Nov. 13, 2018. (Year: 2018).*

López, Carlos Eduardo Belman. "Real-time event-based platform for the development of digital twin applications." The International Journal of Advanced Manufacturing Technology 116, No. 3 (2021): 835-845. (Year: 2021).*

Yang Z, Al-Dahidi S, Baraldi P, Zio E, Montelatici L. A novel concept drift detection method for incremental learning in nonstationary environments. IEEE transactions on neural networks and learning systems. Mar. 26, 2019;31(1):309-20. (Year: 2019).*

* cited by examiner

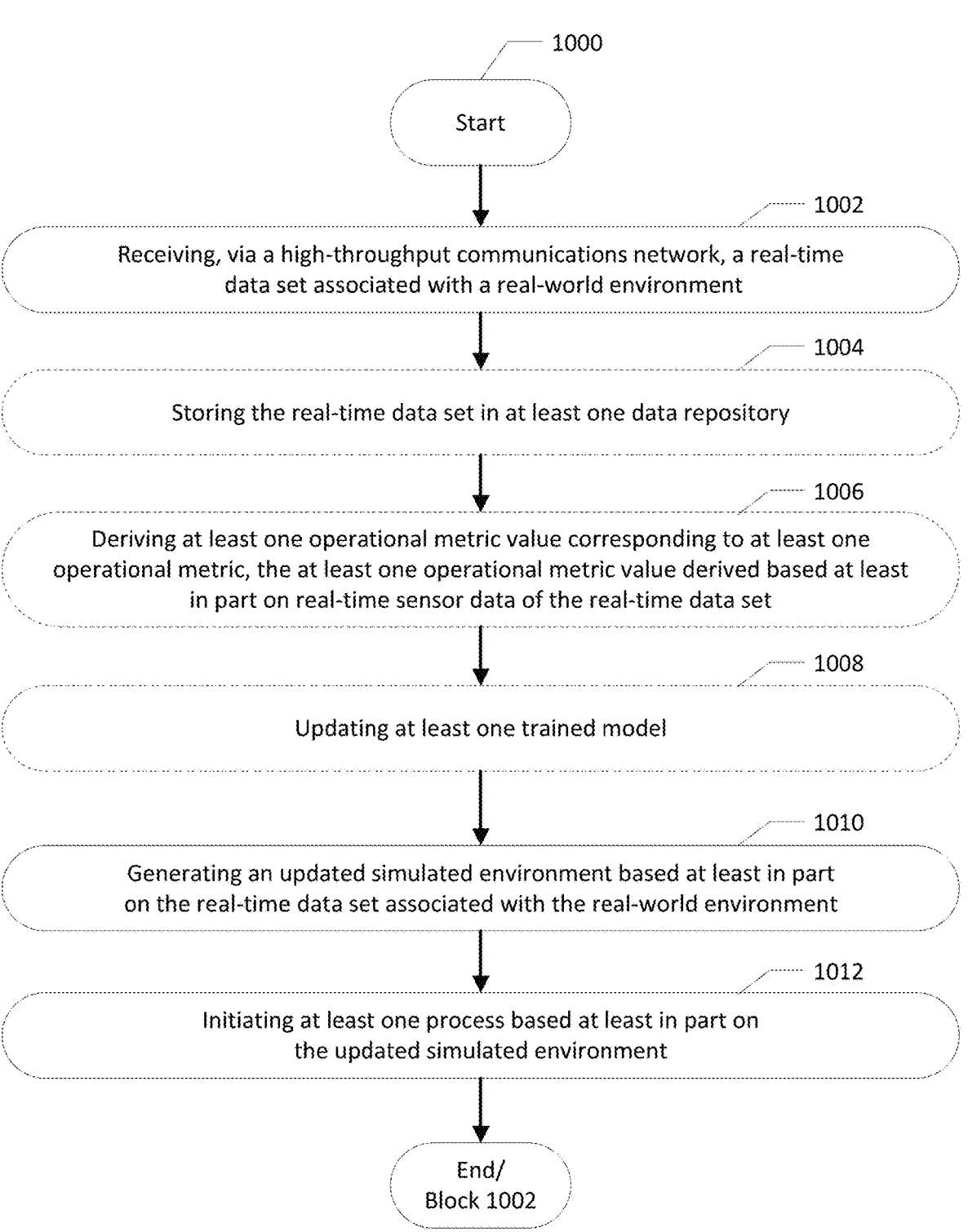

1000

Start

1002

Receiving, via a high-throughput communications network, a real-time data set associated with a real-world environment

1004

Storing the real-time data set in at least one data repository

1006

Deriving at least one operational metric value corresponding to at least one operational metric, the at least one operational metric value derived based at least in part on real-time sensor data of the real-time data set

1008

Updating at least one trained model

1010

Generating an updated simulated environment based at least in part on the real-time data set associated with the real-world environment

1012

Initiating at least one process based at least in part on the updated simulated environment End/
Block 1002

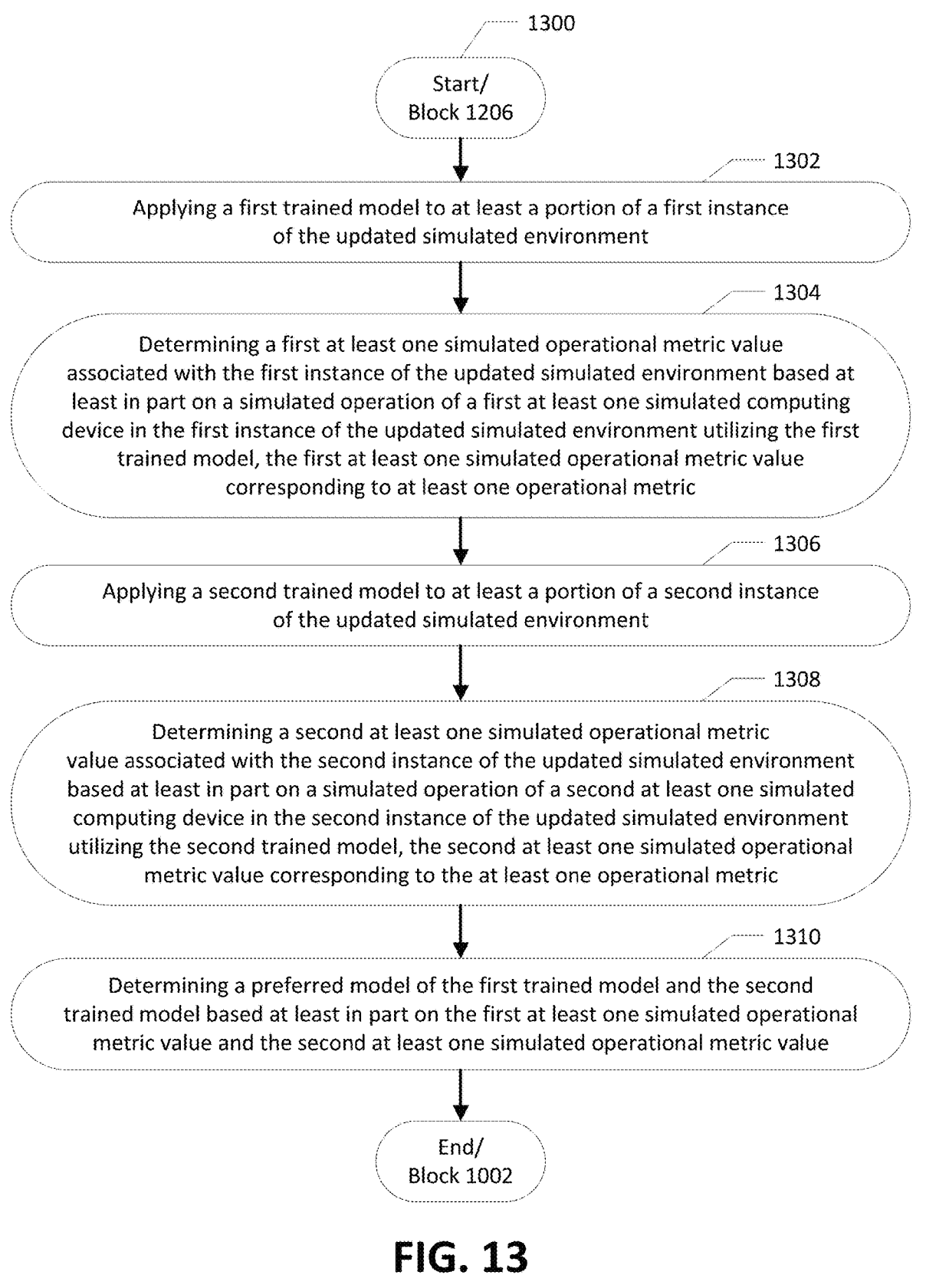

Start/
Block 1206

1302

Applying a first trained model to at least a portion of a first instance of the updated simulated environment

1304

Determining a first at least one simulated operational metric value associated with the first instance of the updated simulated environment based at least in part on a simulated operation of a first at least one simulated computing device in the first instance of the updated simulated environment utilizing the first trained model, the first at least one simulated operational metric value corresponding to at least one operational metric

1306

Applying a second trained model to at least a portion of a second instance of the updated simulated environment

1308

Determining a second at least one simulated operational metric value associated with the second instance of the updated simulated environment based at least in part on a simulated operation of a second at least one simulated computing device in the second instance of the updated simulated environment utilizing the second trained model, the second at least one simulated operational metric value corresponding to the at least one operational metric

1310

Determining a preferred model of the first trained model and the second trained model based at least in part on the first at least one simulated operational metric value and the second at least one simulated operational metric value End/
Block 1002

FIG. 13

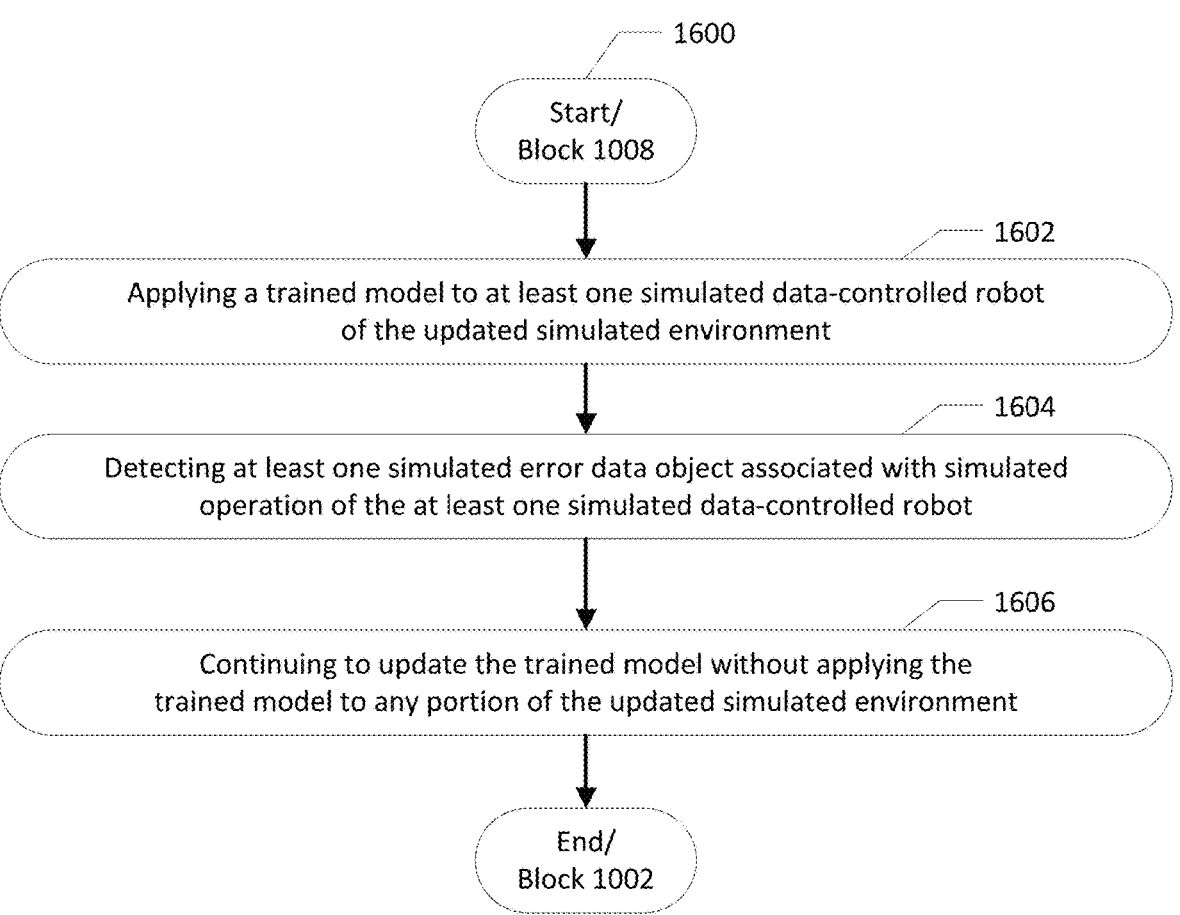

Start/
Block 1008

1600

1602

Applying a trained model to at least one simulated data-controlled robot
of the updated simulated environment

1604

Detecting at least one simulated error data object associated with simulated
operation of the at least one simulated data-controlled robot

1606

Continuing to update the trained model without applying the
trained model to any portion of the updated simulated environment End/
Block 1002

FIG. 16

APPARATUSES, COMPUTER-IMPLEMENTED METHODS, AND COMPUTER PROGRAM PRODUCTS FOR REAL-TIME ENVIRONMENT DIGITAL TWIN SIMULATING

TECHNOLOGICAL FIELD

Embodiments of the present disclosure generally relate to simulating an environment, and specifically to real-time maintenance and use of a simulated environment for visualization and/or controlling elements of a corresponding real-world environment.

BACKGROUND

In various contexts, entities operate within a particular environment to accomplish various tasks. Often, such operations continue within the environment without any ability to accurately determine whether altering one or more elements in the environment would be worthwhile, detrimental, or have no effect. Applicant has discovered problems with current implementations for simulating an environment. Through applied effort, ingenuity, and innovation, Application has solved many of these identified problems by developing solutions embodied in the present disclosure, which are described in detail below.

BRIEF SUMMARY

In general, embodiments of the present disclosure provided herein provide improved environment simulating using real-time data. Other implementations for providing improved environment simulating using real-time data will be, or will become, apparent to one with skill in the art upon examination of the following figures and detailed description. It is intended that all such additional implementations be included within this description be within the scope of the disclosure, and be protected by the following claims.

In accordance with a first aspect of the present disclosure an example computer-implemented method is provided. The example computer-implemented method provides for improved environment simulating and visualization. The example computer-implemented methods are performed via any of a myriad of computing devices in hardware, software, firmware, and/or any combination thereof as described herein. One example implementation of the computer-implemented method includes receiving, via a high-throughput communications network, real-time data set associated with a real-world environment. The example computer-implemented method further includes generating an updated simulated environment based at least in part on the real-time data set associated with the real-world environment. The example computer-implemented method further includes initiating at least one process based at least in part on the updated simulated environment.

Additionally or alternatively, in some embodiments of the example computer-implemented method, initiating the at least one process based at least in part on the updated simulated environment includes causing rendering of a user interface representing at least a portion of the updated simulated environment.

Additionally or alternatively, in some embodiments of the example computer-implemented method, initiating the at least one process based at least in part on the updated simulated environment includes identifying at least one real-time operational metric value associated with the updated simulated environment, the at least one real-time operational metric value corresponding to at least one operational metric; retrieving at least one historical operational metric value associated with the real-world environment, the at least one operational metric value corresponding to the at least one operational metric; and causing rendering of a dashboard interface comprising data representing a trend of the at least one operational metric based at least in part on the at least one real-time operational metric value and the at least one historical operational metric value.

Additionally or alternatively, in some embodiments of the example computer-implemented method, the example computer-implemented method further includes initiating the at least one process based at least in part on the updated simulated environment includes causing rendering of an augmented reality interface representing at least a portion of the updated simulated environment.

Additionally or alternatively, in some embodiments of the example computer-implemented method, initiating the at least one process based at least in part on the updated simulated environment includes applying a trained model to at least a portion of the updated simulated environment; and determining at least one simulated operational metric value associated with the updated simulated environment based at least in part on a simulated operation of at least one simulated computing device in the updated simulated environment utilizing the trained model.

Additionally or alternatively, in some embodiments of the example computer-implemented method, the example computer-implemented method further includes causing rendering of a dashboard interface comprising at least the at least one simulated operational metric value corresponding to at least one operational metric.

Additionally or alternatively, in some embodiments of the example computer-implemented method, the example computer-implemented method further includes receiving at least one operational metric value associated with operation of the real-world environment, the at least one operational metric value corresponding to at least one operational metric; determining comparison results by comparing the at least one operational metric value associated with operation of the real-world environment with the at least one simulated operational metric value associated with the updated simulated environment; determining the comparison results indicate the at least one simulated operational metric value improve the at least one operational metric compared to the at least one operational metric value associated with the operation of the real-world environment; and in response to determining the comparison results indicate the at least one simulated operational metric value improve the at least one operational metric compared to the at least one operational metric value associated with the operation of the real-world environment: automatically configuring at least one computing device in the real-world environment utilizing the trained model.

Additionally or alternatively, in some embodiments of the example computer-implemented method, the example computer-implemented method further includes identifying updated accuracy data associated with an updated version of the trained model and previous accuracy data associated with an implemented version of the trained model; determining an improvement threshold is satisfied based at least in part on the updated accuracy data and the previous accuracy data, where the computer-implemented method applies the updated version of the trained model to at least the portion of the updated simulated environment in response to determining the improvement threshold is satisfied.

Additionally or alternatively, in some embodiments of the example computer-implemented method, the example computer-implemented method further includes identifying updated accuracy data associated with a trained model and previous accuracy data associated with an implemented version of the trained model; determining an improvement threshold is not satisfied based at least in part on the updated accuracy data and the previous accuracy data; and in response to determining the improved threshold is not satisfied, continuing to update the trained model without applying the trained model to any portion of the updated simulated environment.

Additionally or alternatively, in some embodiments of the example computer-implemented method, initiating the at least one process based at least in part on the updated simulated environment includes reconfiguring at least a portion of the updated simulated environment; determining at least one simulated operational metric associated with the updated simulated environment based at least in part on a simulated operation of the updated simulated environment after reconfiguration; receiving at least one operational metric value associated with operation of the real-world environment; determining comparison results by comparing the at least one operational metric value associated with operation of the real-world environment with the at least one simulated operational metric value associated with the updated simulated environment after reconfiguration; and in response to determining the comparison results indicate the at least one simulated operational metric value improves the at least one operational metric compared to the at least one operational metric value associated with the operation of the real-world environment: automatically configuring at least one computing device in the real-world environment in accordance with the reconfiguration of the updated simulated environment.

Additionally or alternatively, in some embodiments of the example computer-implemented method, initiating the at least one process based at least in part on the updated simulated environment includes applying a trained model to at least one simulated data-controlled robot of the updated simulated environment; detecting at least one simulated error data object associated with simulated operation of the at least one simulated data-controlled robot; and in response to detecting at least one simulated error data object, continuing to update the trained model without applying the trained model to any portion of the updated simulated environment.

Additionally or alternatively, in some embodiments of the example computer-implemented method, the example computer-implemented method further includes applying a trained model to at least one simulated data-controlled robot of the updated simulated environment; generating simulated data associated with simulated operation of the at least one simulated data-controlled robot of the updated simulated environment; and updating the trained model based at least in part on the simulated data associated with simulated operation of the at least one simulated data-controlled robot.

Additionally or alternatively, in some embodiments of the example computer-implemented method, initiating the at least one process based at least in part on the updated simulated environment includes applying a first trained model to at least a portion of a first instance of the updated simulated environment; determining a first at least one simulated operational metric value associated with the first instance of the updated simulated environment based at least in part on a simulated operation of a first at least one simulated computing device in the first instance of the updated simulated environment utilizing the first trained model, the first at least one simulated operational metric value corresponding to at least one operational metric; applying a second trained model to at least a portion of a second instance of the updated simulated environment; determining a second at least one simulated operational metric value associated with the second instance of the updated simulated environment based at least in part on a simulated operation of a second at least one simulated computing device in the second instance of the updated simulated environment utilizing the second trained model, the second at least one simulated operational metric value corresponding to the at least one operational metric; and determining a preferred model of the first trained model and the second trained model based at least in part on the first at least one simulated operational metric value and the second at least one simulated operational metric value.

Additionally or alternatively, in some embodiments of the example computer-implemented method, the example computer-implemented method further includes storing the real-time data set, the real-time data set retrieved during generation of a second updated environment.

Additionally or alternatively, in some embodiments of the example computer-implemented method, the real-time data set comprises a plurality of sensor data types, the plurality of sensor data types comprising LiDAR data, distance data, pressure sensor data, temperature data, and/or image data.

Additionally or alternatively, in some embodiments of the example computer-implemented method, the real-time data set comprises data-controlled robot movement data, at least one real-time operational metric value, and real-time sensor data.

Additionally or alternatively, in some embodiments of the example computer-implemented method, the example computer-implemented method further includes deriving at least one operational metric value corresponding to at least one operational metric, the at least one operational metric value derived based at least in part on real-time sensor data of the real-time data set.

Additionally or alternatively, in some embodiments of the example computer-implemented method, initiating the at least one process based at least in part on the updated simulated environment includes causing rendering of a user interface representing at least a portion of the updated simulated environment, the user interface dynamically updating as new real-time data is received; and simultaneously while causing rendering of the user interface: applying a trained model to at least a portion of the updated simulated environment; and determining at least one simulated operational metric value associated with the updated simulated environment based at least in part on a simulated operation of at least one simulated computing device in the updated simulated environment utilizing the trained model.

In accordance with a second aspect of the present disclosure, an apparatus is provided. The example apparatus provides for improved environment simulating and visualization. In one example embodiment, the example apparatus includes at least one processor and at least one memory having computer-coded instructions stored thereon, the computer-coded instructions configured to, in execution with the at least one processor, cause the apparatus to perform any one of the computer-implemented methods described herein. In another example embodiment, the example apparatus includes means for performing each step of any one of the computer-implemented methods described herein.

In accordance with a third aspect of the present disclosure, a computer program product is provided. The example computer program product provides for improved environment simulating and visualization. In one example embodiment, the example computer program product includes at least one non-transitory computer-readable storage medium having computer program code stored thereon that, in execution with at least one processor, configures the computer program product for performing any one of the computer-implemented methods described herein.

BRIEF DESCRIPTION OF THE DRAWINGS

Figure 1:
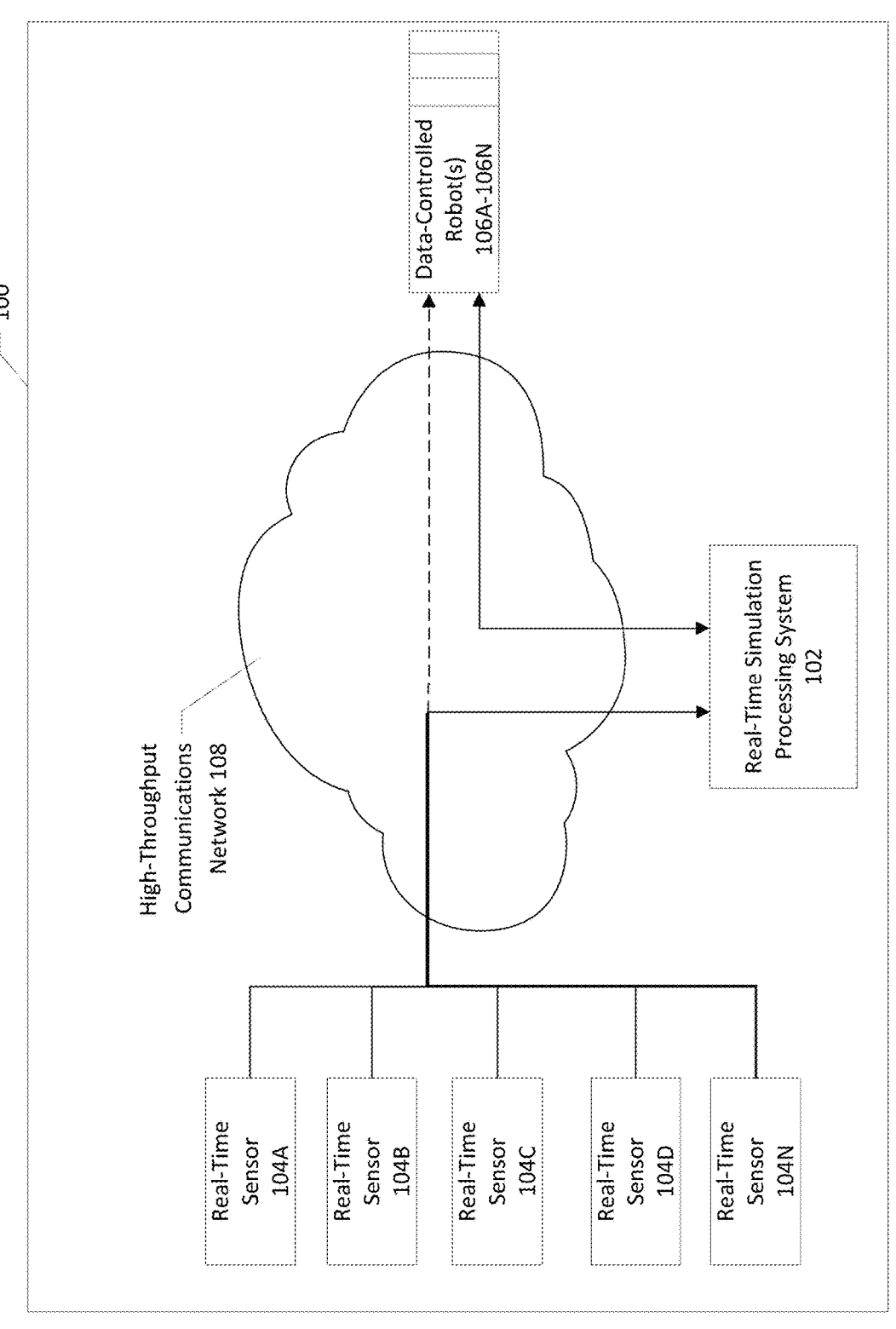
Figure 2:
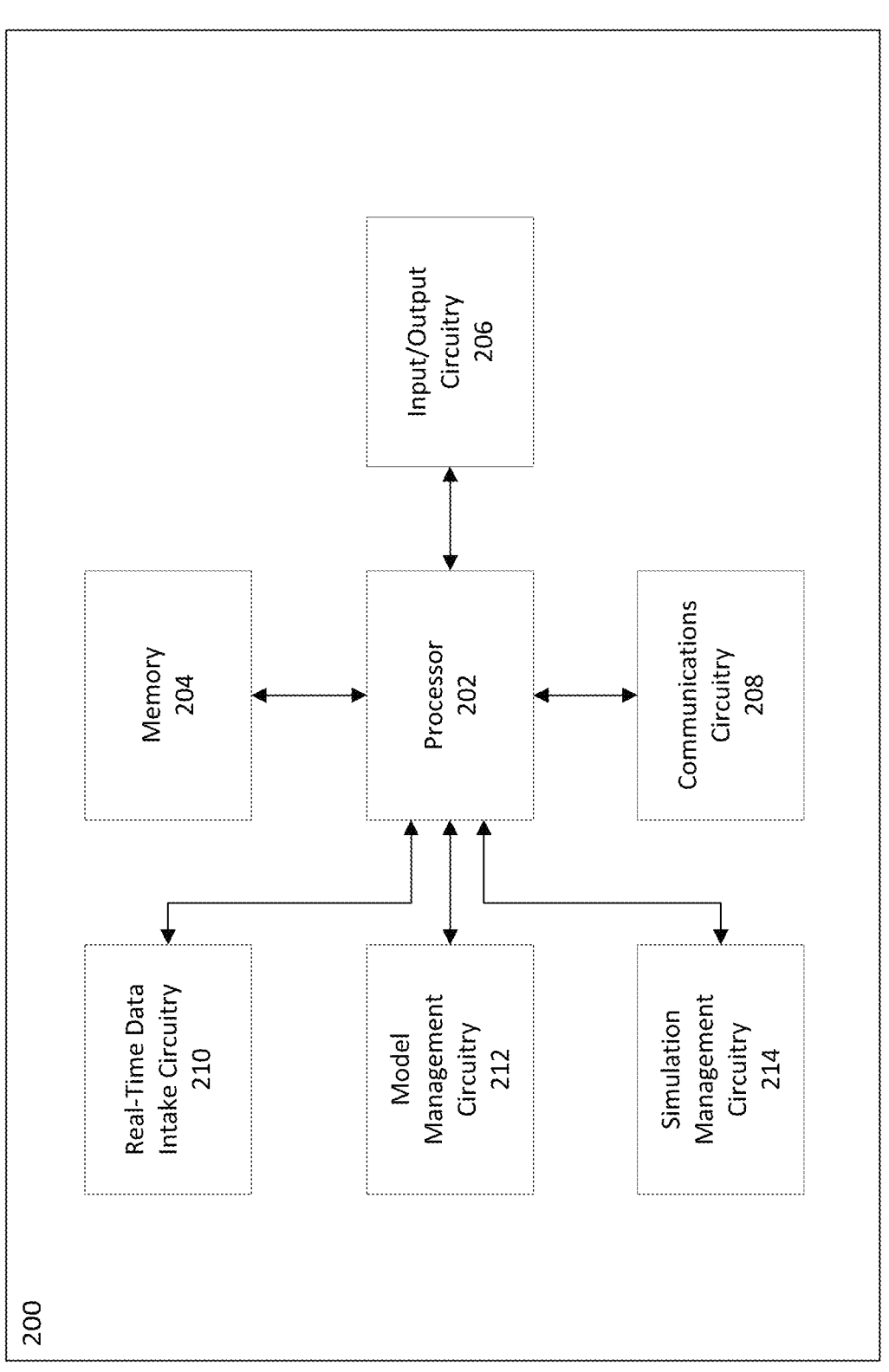
Figure 3:
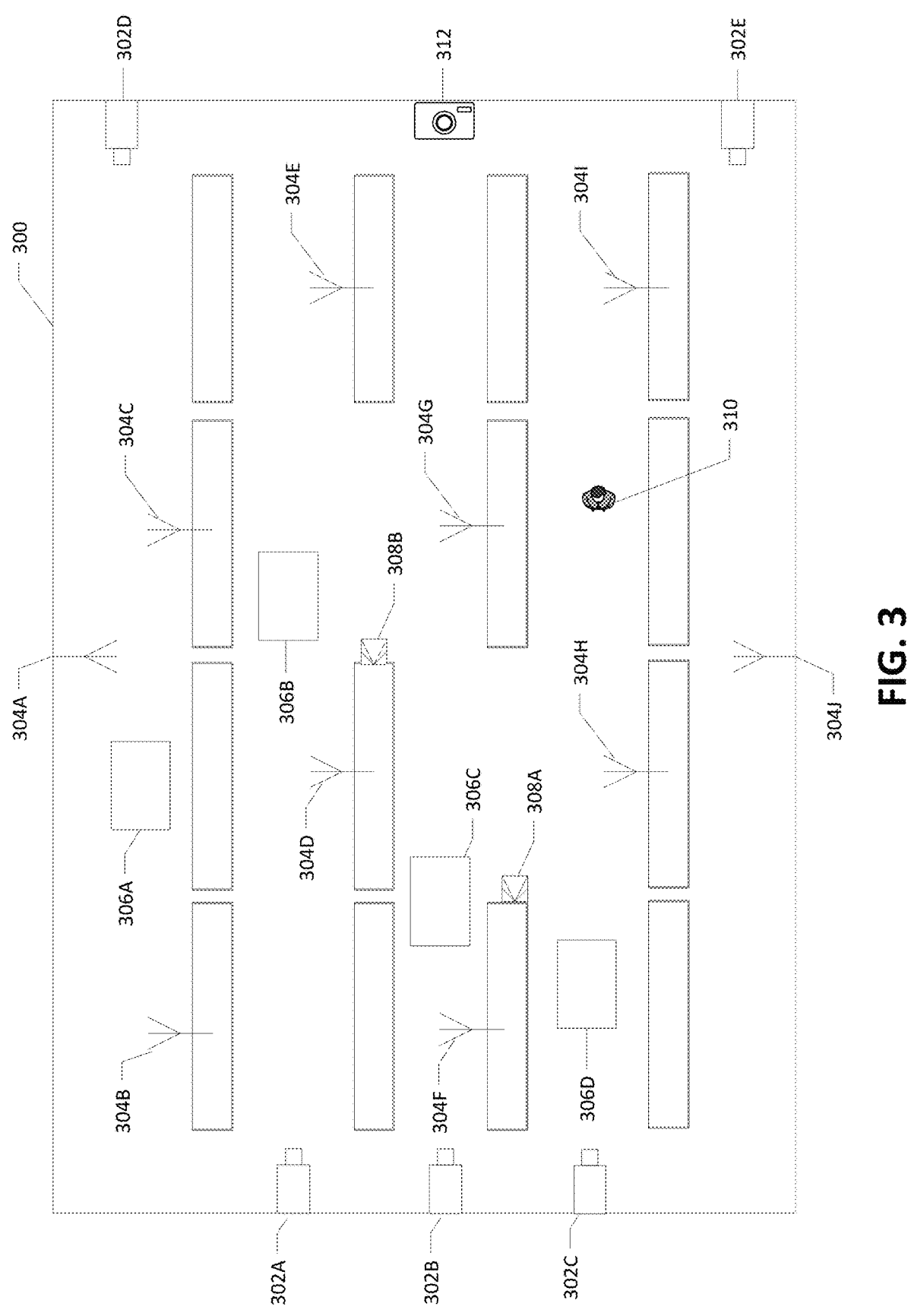
Figure 4:
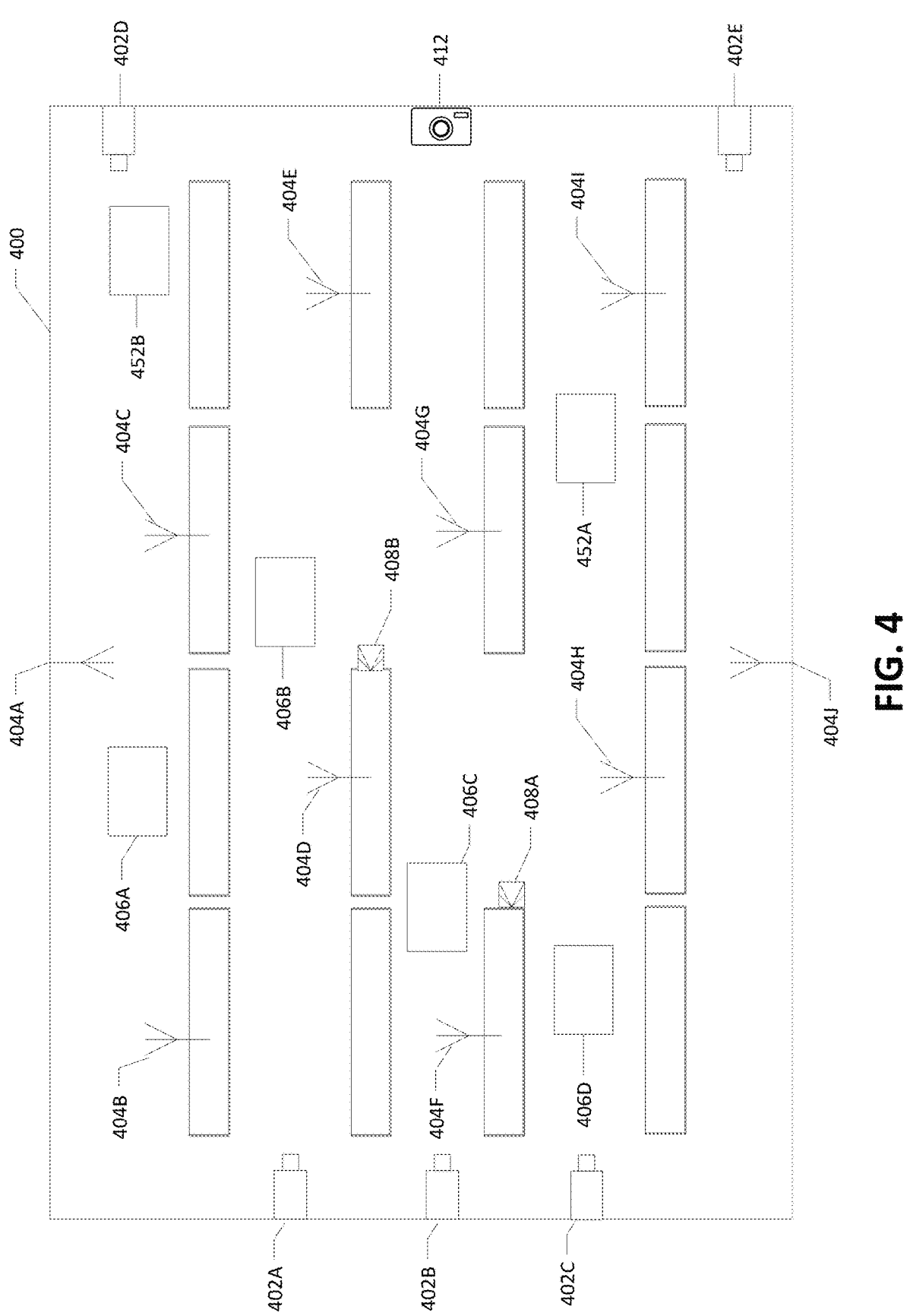
Figure 5:
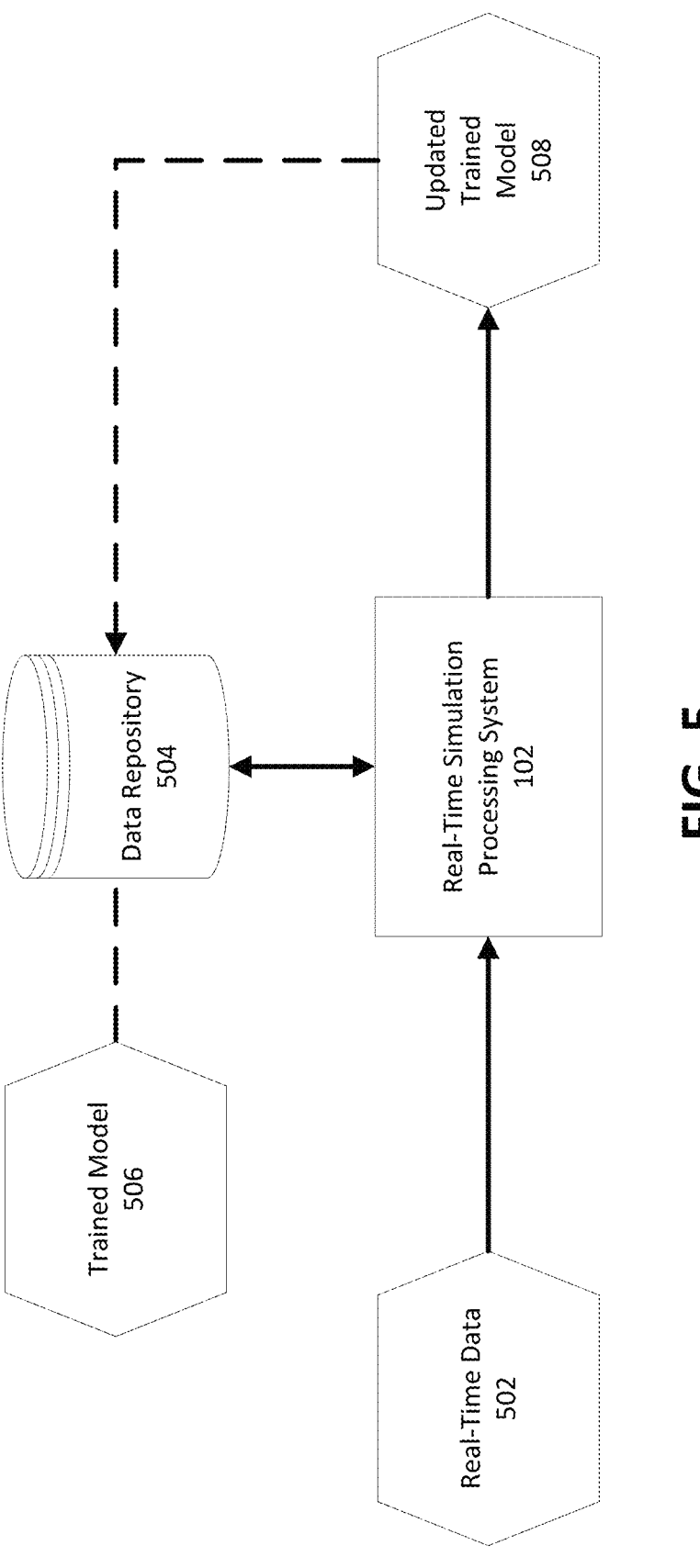
Figure 6:
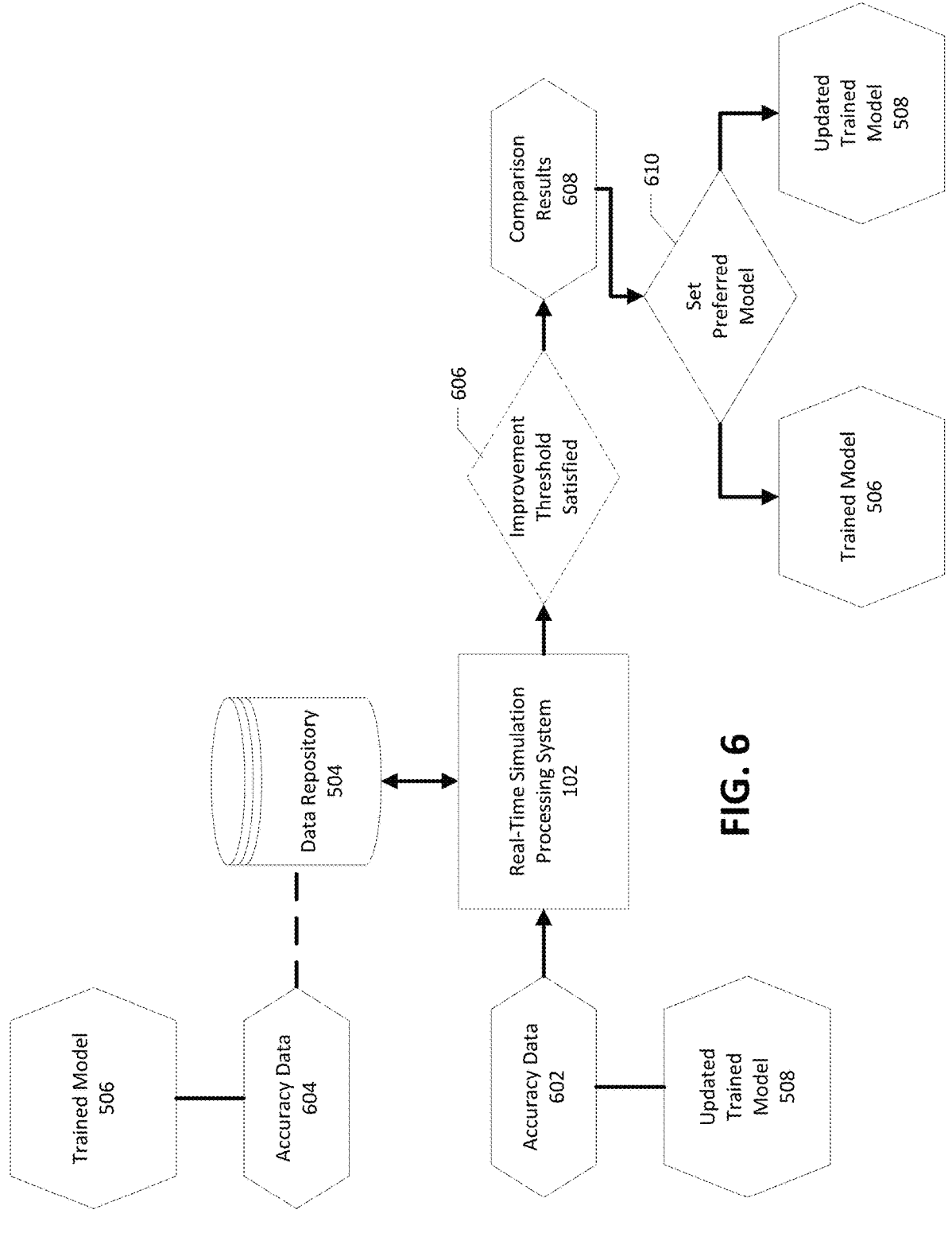
Figure 7:
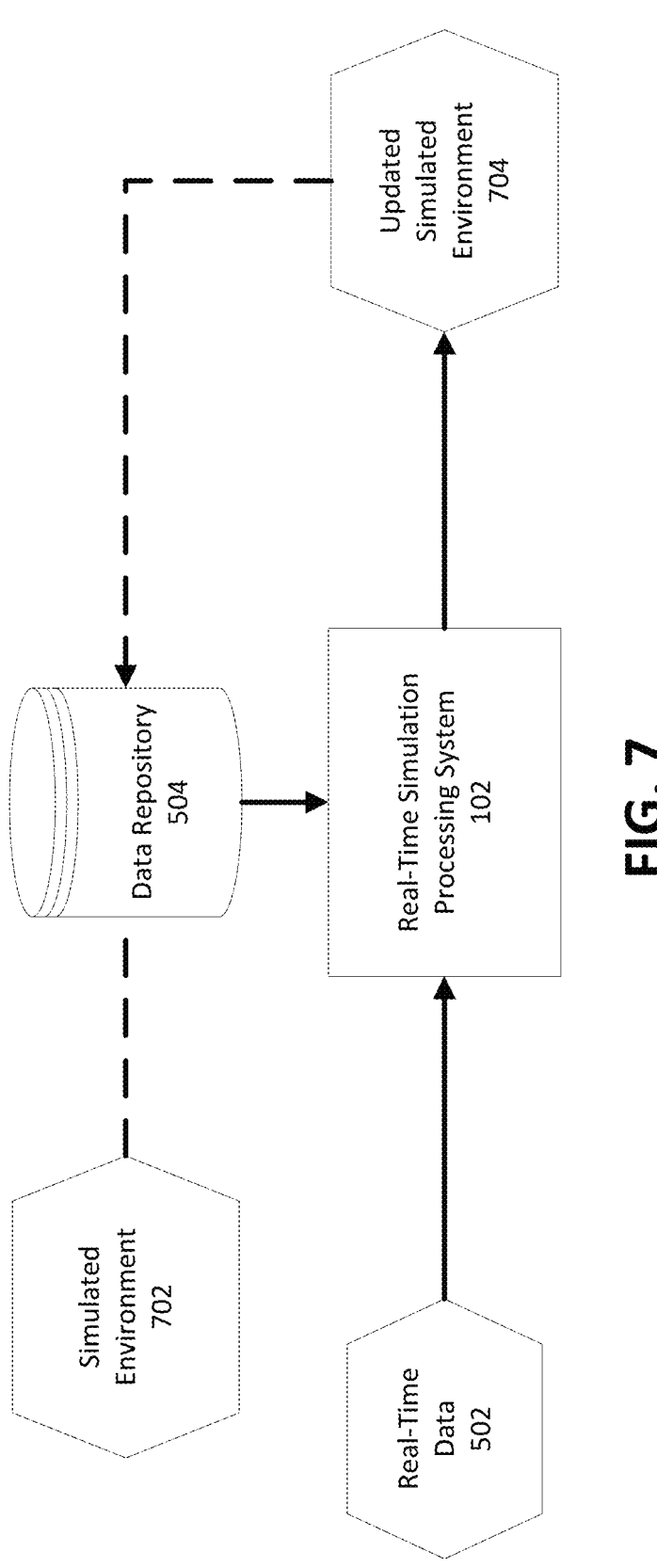
Figure 8:
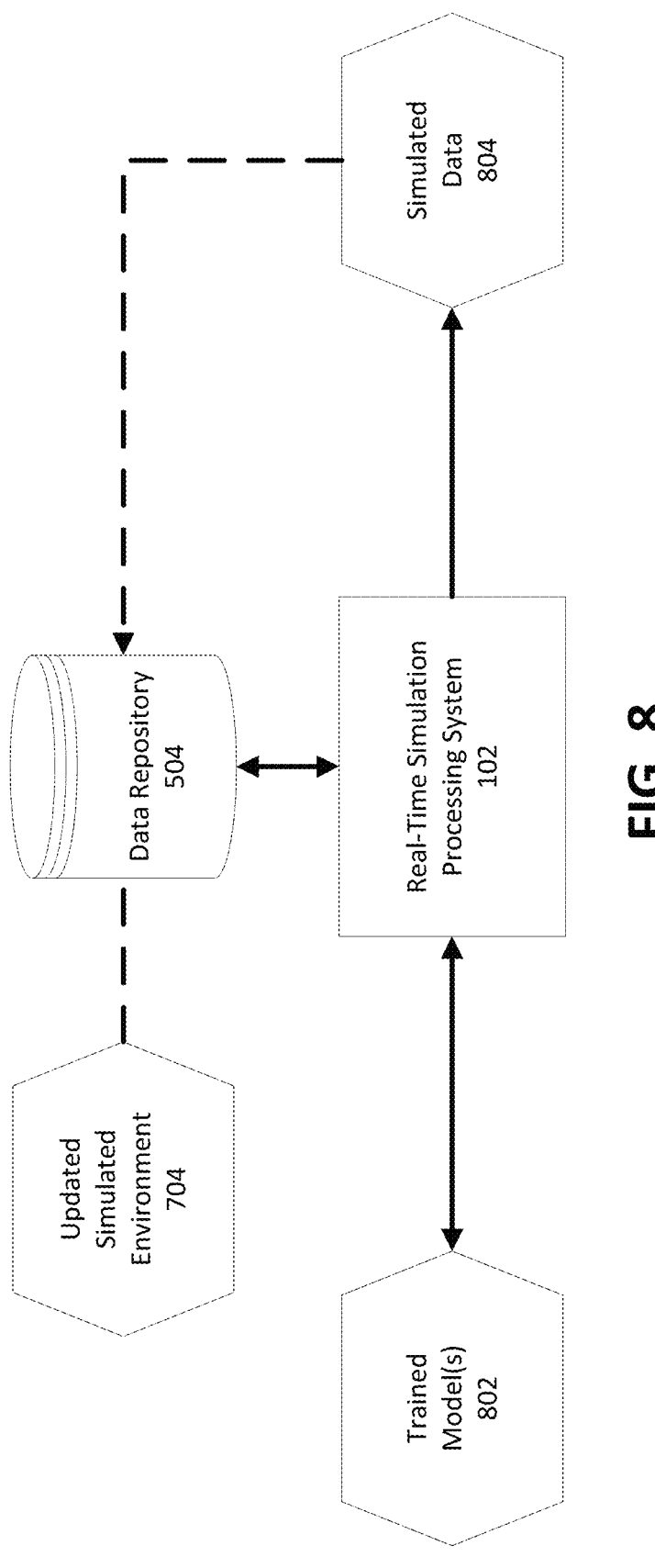
Figure 9:
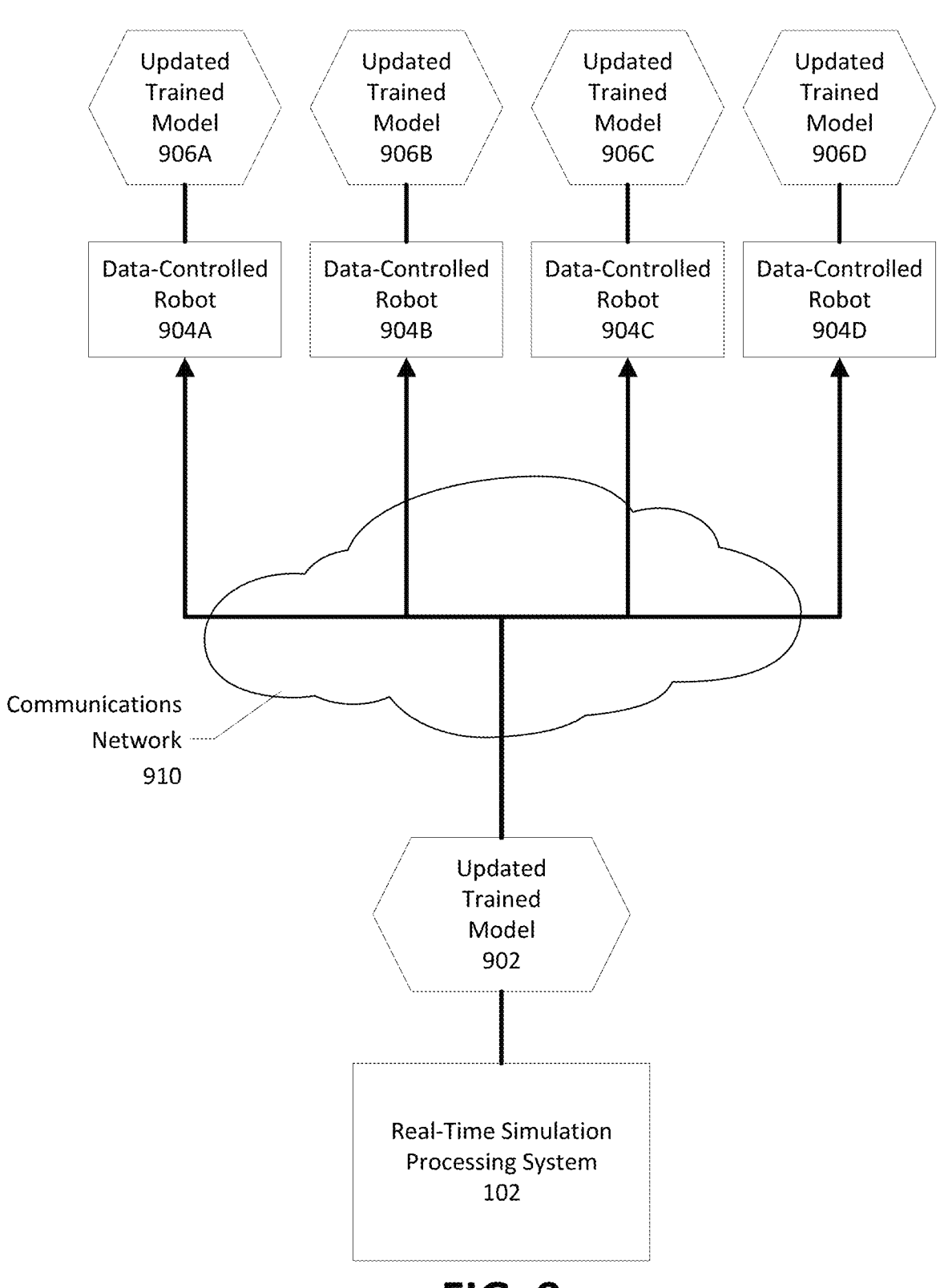
Figure 11:
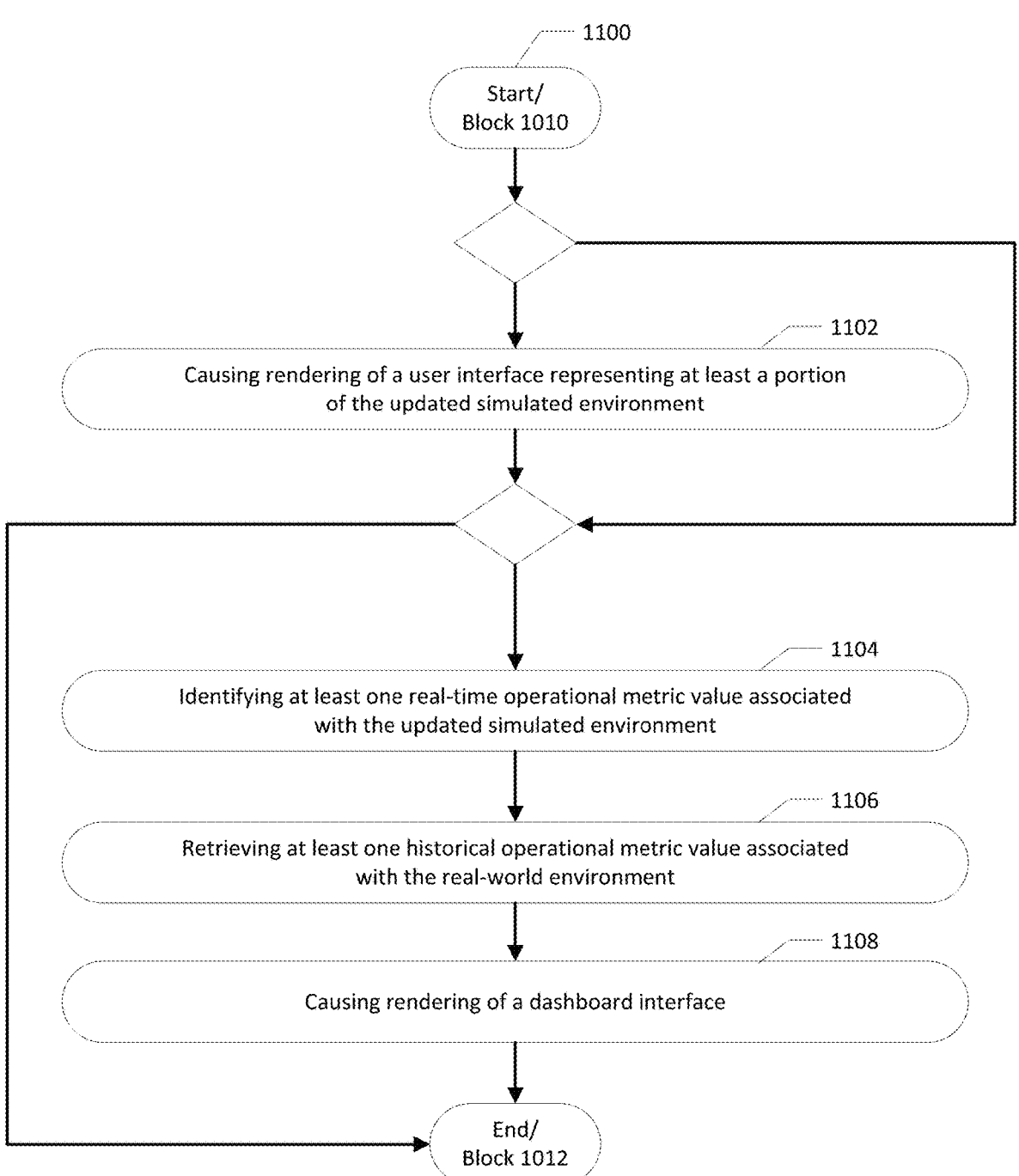
Figure 12:
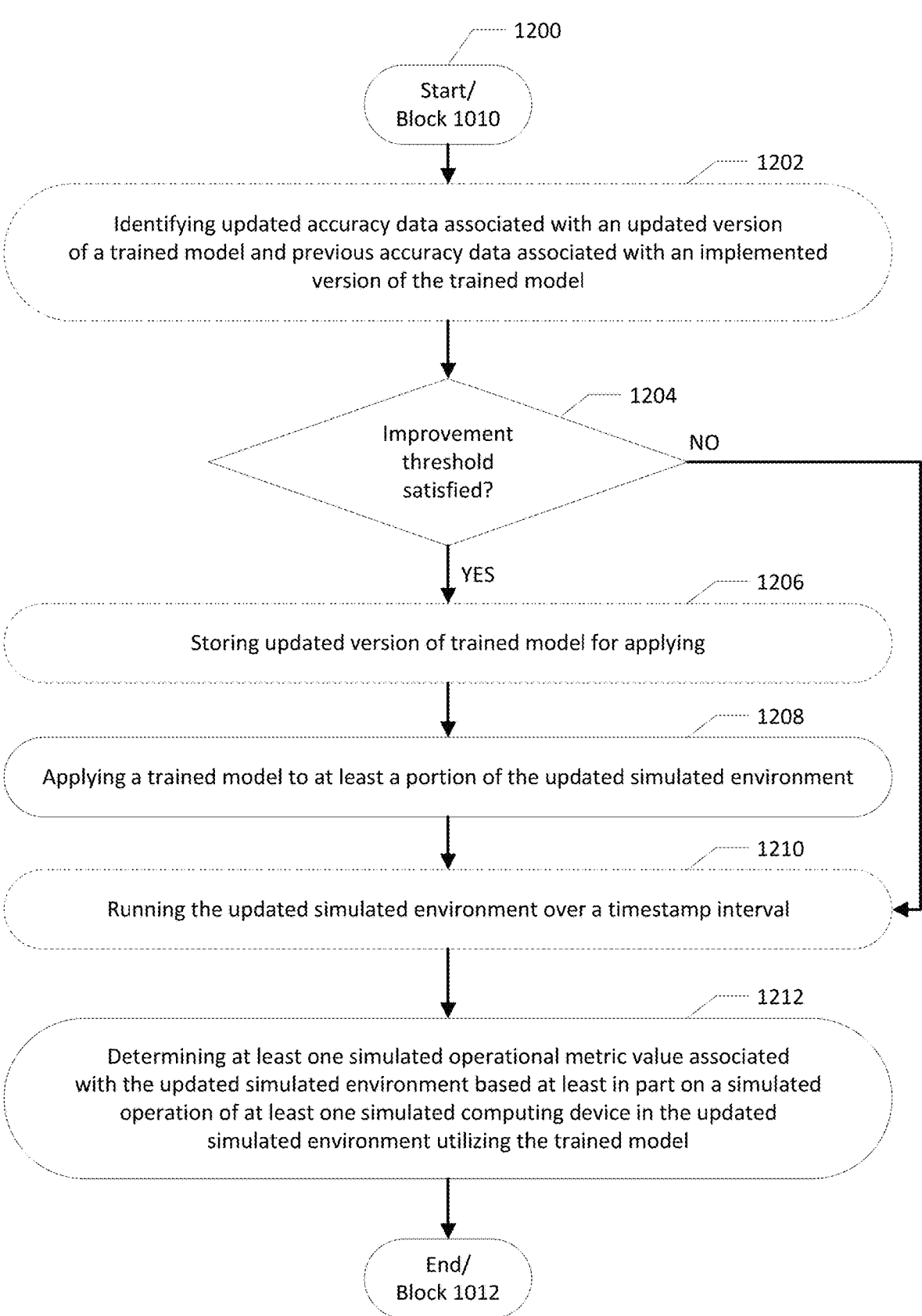
Figure 14:
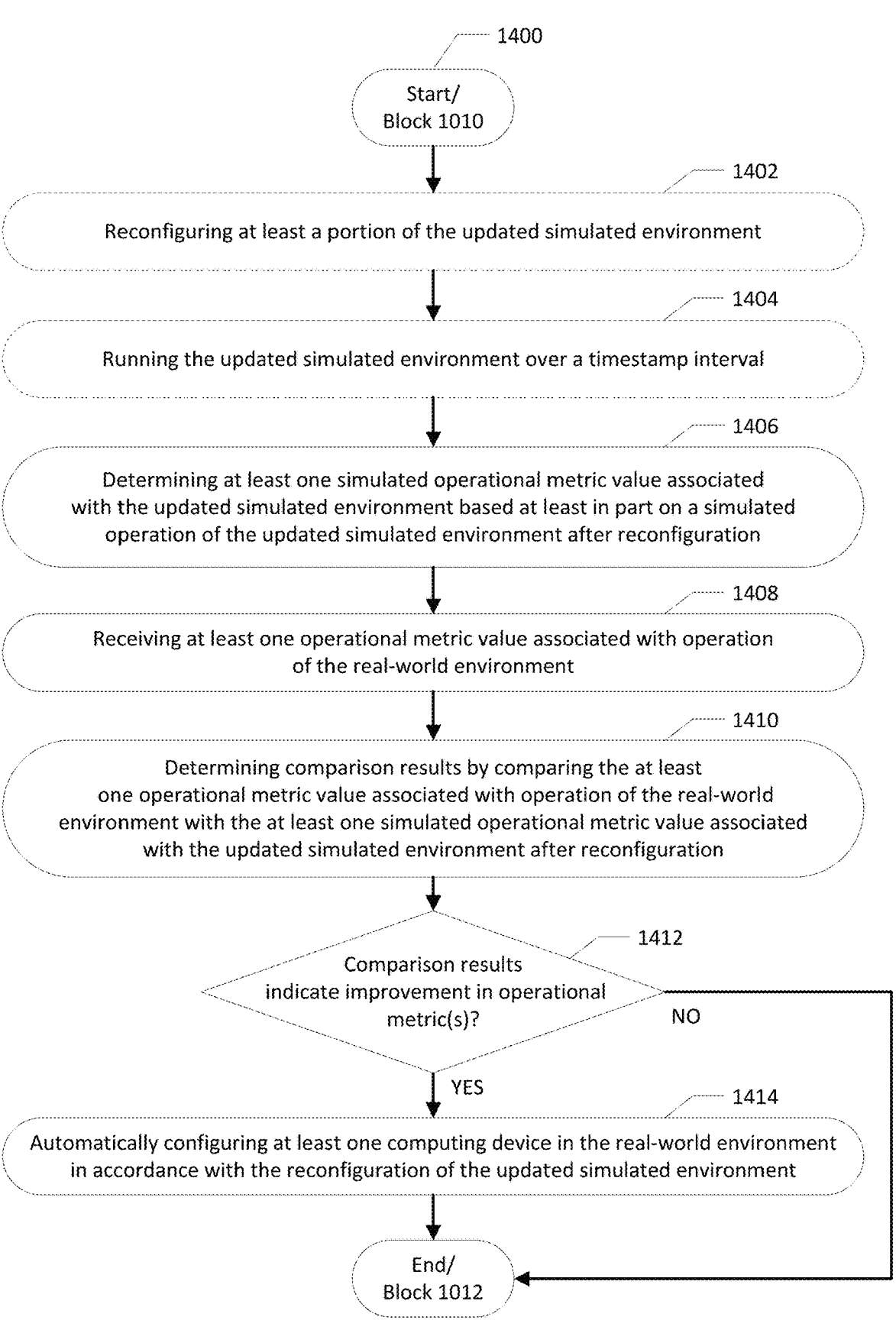
Figure 15:
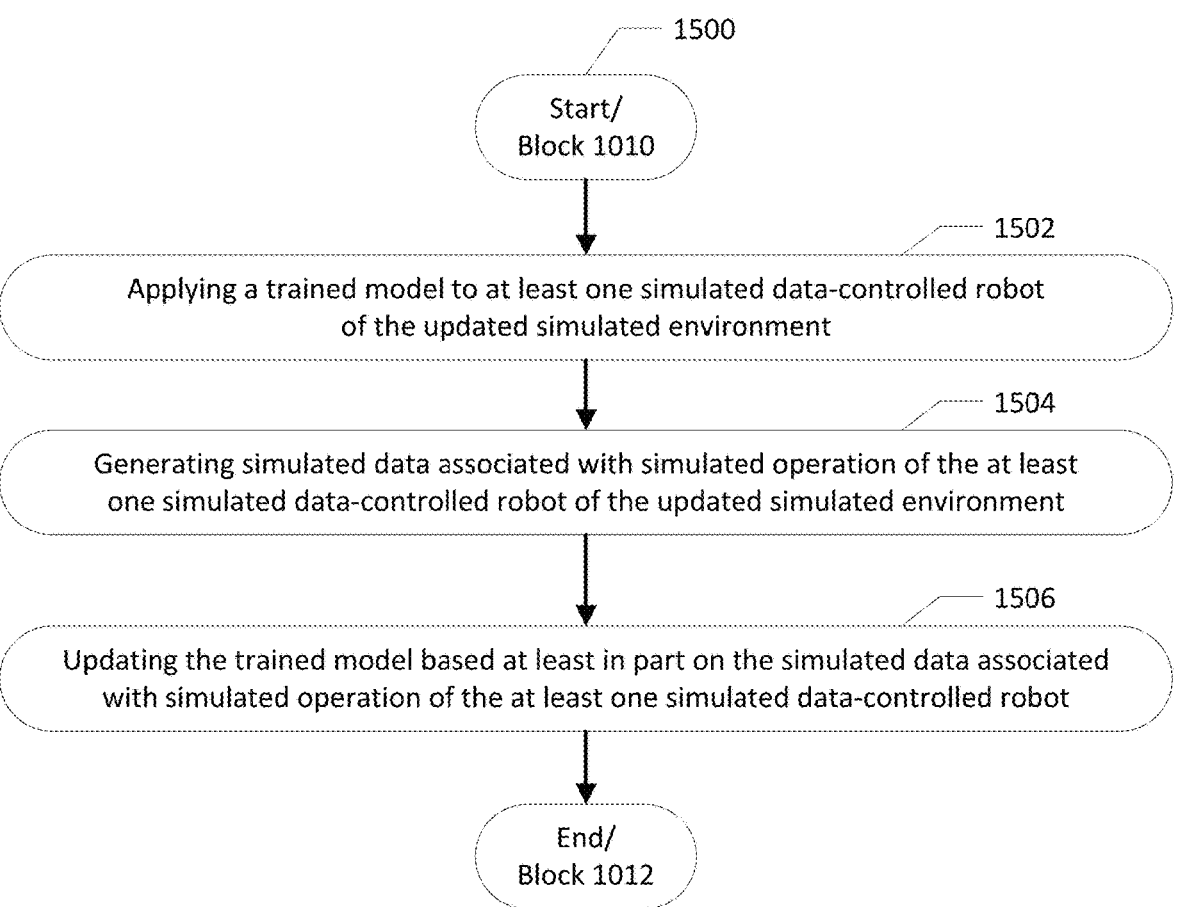

Having thus described the embodiments of the disclosure in general terms, reference now will be made to the accompanying drawings, which are not necessarily drawn to scale, and wherein:

FIG. 1 illustrates a block diagram of a system that may be specially configured within which embodiments of the present disclosure may operate;

FIG. 2 illustrates a block diagram of an example real-time simulation apparatus that may be specially configured in accordance with some example embodiments of the present disclosure;

FIG. 3 illustrates an example visualization of a warehouse environment in an example context for environment simulation in accordance with at least some example embodiments of the present disclosure;

FIG. 4 illustrates an example visualization of a simulated warehouse environment in an example context for environment simulation in accordance with at least some example embodiments of the present disclosure;

FIG. 5 illustrates an example data flow for updating a trained model in accordance with at least some example embodiments of the present disclosure;

FIG. 6 illustrates an example data flow for trained model validation via simulation for deployment in accordance with at least some example embodiments of the present disclosure;

FIG. 7 illustrates an example data flow for simulated environment updating in accordance with at least some example embodiments of the present disclosure;

FIG. 8 illustrates an example data flow for applying a trained model to at least a portion of a simulated environment in accordance with at least some example embodiments of the present disclosure;

FIG. 9 illustrates an example data flow for deploying an updated trained model to data-controlled robots in a real-world environment in accordance with at least some example embodiments of the present disclosure;

FIG. 10 illustrates a flowchart depicting example operations of an example process for generating and utilizing a simulated environment in accordance with at least some example embodiments of the present disclosure;

FIG. 11 illustrates a flowchart depicting example operations of an example process for rendering user interface(s) associated with a simulated environment in accordance with at least some example embodiments of the present disclosure;

FIG. 12 illustrates a flowchart depicting example operations for applying a trained model to a simulated environment in accordance with at least some example embodiments of the present disclosure;

FIG. 13 illustrates a flowchart depicting example operations for determining a preferred model in accordance with at least some example embodiments of the present disclosure;

FIG. 14 illustrates a flowchart depicting example operations for automatically configuring computing device(s) based on operation of a simulated environment in accordance with at least some example embodiments of the present disclosure;

FIG. 15 illustrates a flowchart depicting example operations for updating a trained model based on simulated data in accordance with at least some example embodiments of the present disclosure; and FIG. 16 illustrates a flowchart depicting example operations for aborting application of a trained model to a simulated environment upon detection of simulated error data object(s) in accordance with at least some example embodiments of the present disclosure.

DETAILED DESCRIPTION

Embodiments of the present disclosure now will be described more fully hereinafter with reference to the accompanying drawings, in which some, but not all, embodiments of the disclosure are shown. Indeed, embodiments of the disclosure may be embodied in many different forms and should not be construed as limited to the embodiments set forth herein, rather, these embodiments are provided so that this disclosure will satisfy applicable legal requirements. Like numbers refer to like elements throughout.

Overview

In various contexts, entities operate within an environment to perform one or more tasks. In one example context, entities operate within a warehouse environment to pick items, relocate such items, remove such items from the environment, and/or the like. Such entities may include human actors, AI controlled robots, autonomous vehicles, manually driven vehicles, and/or the like. Each of such entities may receive instructions for how to operate within the warehouse environment to accomplish such tasks. In some embodiments, one or more computing devices in the warehouse environment (e.g., AI controlled robots, autonomous vehicles, and/or the like) operate based on specially configured model(s) that are applied to such computing devices to configure such devices. For example, AI controlled robots, autonomous picking vehicles, and/or other entities may be configured to initiate particular process(es) based at least in part on data produced by model(s) applied to such entities, such as models that for perception, navigation, interaction with the environment, and/or the like.

An environment may be monitored via one or more sensor(s). The sensor(s) may capture data used to track entities, items, and/or the like within the environment, input into model(s) to control one or more entities or provide instructions to one or more entities, and/or the like. The captured data may include various types of data and various amounts of data, with each sensor continuously producing a significant amount of data (e.g., gigabytes of data individually and/or in conjunction with one another).

In some circumstances, a real-world environment, such as the warehouse environment, is monitored to track operations in the environment (e.g., interactions of the entities towards performing one or more task(s) in the environment). Based on tracked results of the environment, a user, administrator, or other entity associated with the environment may alter one or more configurations and/or aspects of the environment for any of a myriad of purposes. For example, in some contexts, an administrator of the environment may alter one or more aspects of the environment (or configuration of one or more computing devices therein) to improve one or more target operational metrics tracked during operation of the environment. However, altering aspects of an environment may be costly, dangerous, and/or permanent. Accordingly, determining whether altering an aspect of the environment provides a benefit to operations within the environment in advance of performing such altering is advantageous to implement alterations that positively affect operations in the real-world environment. Additionally, as operations continue in the real-world environment, accurately visualizing the real-world environment and operations therein as such operations update in real-time additionally is advantageous to enable accurate determination of alterations that improve operation of the real-world environment.

Embodiments of the present disclosure provide real-time simulating of a real-world environment and utilization of the simulated environment. The simulated environment may include simulated versions of the real-world environment and aspects thereof, including furniture, buildings, immovable components, machinery, and/or the like, each entity in the real-world environment, computing device(s) in the real-world environment, sensor(s) in the real-world environment, and/or the like. Each of the simulated elements may be configurable within the simulated environment via the same configuration options that may be used to configure to corresponding element in the real-world. In this regard, the simulated environment may be utilized to test alterations of any aspect the real-world environment in any manner that may be implemented in the real-world environment.

Additionally or alternatively, in some embodiments, the simulated environment is advantageously updated continuously and/or in real-time. The simulated environment may be updated based on real-time and/or continuous data transmitted over a high-throughput communications network such that all aspects of the simulated environment may be updated to represent their real-time circumstances for such elements in the real-world environment. For example, the real-time location, entity configurations, sensor locations, and computing device configurations, and/or the like, may be represented as such aspects change during operation of the real-world environment. In this regard, the simulated environment may be continuously updated, and such an updated simulated environments and/or metrics associated therewith may be visualized via one or more user interfaces to monitor the elements of the real-world environment as it updates and/or the performance of such elements with respect to one or more operational metrics.

Additionally or alternatively, in some embodiments, the simulated environment is updated and/or utilized to test implementation of one or more alterations of the corresponding real-world environment. For example, as a simulated environment is updated to reflect real-time aspects of the corresponding real-world environment, the updated simulated environment may be utilized to test configuration changes of one or more computing device(s) in the real-world environment, addition of new elements (e.g., new data-controlled robots, data-controlled robots, autonomous vehicles, human actors, and/or the like), configuration changes of existing entities (e.g., by applying new trained models), configuration changes of sensor(s) and/or addition of new sensor(s), and/or the like. By utilizing the real-time updated simulation environment, the simulation may be performed to test such alterations in a manner that most accurately reflects the current circumstances of the real-world environment. Additionally or alternatively still, in some embodiments the real-time data captured and/or otherwise determined from operation of the real-world environment may be utilized to train one or more model(s) for possible implementation within the real-world environment. Using the updated simulation environment, embodiments may test whether such updated trained models are effective and/or sufficiently improve operation of the real-world environment, and more accurately apply trained model(s) to the real-world environment in circumstances where such newly trained models sufficient improve operations.

Embodiments of the present disclosure provide various technical advantages and improvements to various technical fields. One particular advantage is that some embodiments of the present disclosure utilize real-time and/or continuously detected and/or determined data to generate an updated simulated environment that accurately reflects the corresponding real-world environment in real-time as the real-world environment continues to operate. A high-throughput communications network, such as a 5G communications network and/or Wi-Fi 6 enabled network, may be leveraged to ensure that robust, high-fidelity data may be communicated in real-time and continuously for such purposes. Some embodiments may utilize the updated simulated environment to generate accurate, real-time visualization(s) of the updated simulated environment and/or data derived therefrom (e.g., values for operational metrics). Such real-time visualizations of the updated simulated environment enable a user to make decisions based on the accurately represented current status of each aspect within the real-world environment as represented in the corresponding updated simulated environment.

Additionally or alternatively, by enabling accurate testing of alterations from the real-world environment, the updated simulated environment advantageously may be utilized to determine whether such alterations would be beneficial without requiring the cost and risk associated with testing such alterations in the real-world environment. By maintaining real-time parity between the real-world environment and a simulated environment based on a real-time data set, embodiments enable the simulated environment to provide simulation data that accurately reflects how alteration(s) would impact the corresponding real-world environment as it currently exists. Further, by testing alterations on the updated simulated environment that accurately represents the real-world environment, the performed tests more accurately reflect whether such alterations would be effective with respect to the real-world environment as it currently exists. In embodiments where the updated simulated environment is configurable in the same ways as the corresponding real-world environment, the updated simulated environment may be leveraged to accurately test the effects of any such alterations. For example, via the updated simulated environment, changes to existing entities may be tested, addition and/or deletion of entities and/or other computing devices in the real-world environment may be tested, changes to configuration of other computing devices (e.g., sensors) in the real-world environment may be tested, changes to items in the real-world environment may be tested, changes to task(s) to be performed in the real-world environment may be tested, and/or the like. In this regard, it will be appreciated that the updated simulated environment may be utilized to accurately test any desired change that may be made in the corresponding real-world environment before implementation of such a change, allowing the effects of the change to be accurately measured and processed. Additionally, in some embodiments, embodiments may automatically process data produced via the simulated environment to automatically implement one or more changes in the corresponding real-world environment.

Additionally or alternatively still, to minimize the amount of computing power utilized to update and/or otherwise alter aspects of the real-world environment, at least some embodiments of the present disclosure advantageously may utilize the updated simulated environment to accurately determine when the effects of an alteration of the real-world environment warrant implementation of such alterations in the corresponding real-world environment. For example, at least some embodiments may advantageously update (e.g., by further training) one or more trained models based on real-time data collected and/or determined from operation of the real-world environment. One or more updated trained model(s) may be tested via the updated simulated environment as such updates are completed to determine the effects of applying such updated trained model(s). In circumstances where the updated trained model(s) are determined to have particular increased accuracy and/or improve the operations during testing in the updated simulated environment, such trained model(s) are more trusted to provide the same advantages if implemented in the corresponding real-world environment. Accordingly, some embodiments of the present disclosure may determine when the updated trained model has improved above a particular desired improvement threshold, and in some embodiments automatically update one or more aspects of the real-world environment once such an improvement threshold is determined to be satisfied. In this regard, some such embodiments of the present disclosure ensure that computing resources are expended to update the real-world environment only once such expenditure of computing resources is worthwhile based on the improvements resulting therefrom.

Definitions

The term "real-world" refers to existence of an entity, object, or any other thing that is tangible within a space rather than represented as data in a simulated version of the space.

The term "high-throughput communications network" refers to one or more high-capacity, high-throughput, and/or low latency communications network(s) established to enable communication between two or more computing devices. Non-limiting examples of a high-throughput communications network include a fifth generation ("5G") cellular communications network and a Wi-Fi 6 enabled communications network satisfying the IEEE 802.11ax standard. A high-throughput communications network is configured with high bandwidth and low latency to enable consistent and/or continuous real-time communication of high fidelity data transmissions, including without limitation image transmissions, video transmissions, and/or other large size data packets.

The term "real-time" refers to capture and/or communication of data between computing devices in a sufficiently short period of time to enable continuous or near-continuous transmission of such data between the computing devices. In some embodiments, real-time refers to transmission of high-fidelity and/or large size data packets from a first computing device to a second computing device within milliseconds or within a second.

The term "environment" refers to any defined physical area within which one or more entities interact and/or otherwise operate to perform task operation(s), and that is monitored by one or more computing device(s). In some embodiments, an environment includes one or more real-time sensor(s) for capturing real-time sensor data associated with a portion of the defined physical area that is monitored by each of the real-time sensor(s).

The term "real-world environment" refers to an environment represented in the real-world. Non-limiting examples of a real-world environment include a warehouse within which human actors, autonomous vehicles, and other computing devices interact for performing one or more task operation(s).

The term "simulated environment" refers to an electronically-managed data representation of a particular real-world environment. A simulated environment includes one or more data object(s) that represent some or all entities, objects, fixtures, computing devices, and anything within the environment and/or that affects or controls one or more aspects of the environment. A simulated environment optionally includes one or more simulated data object(s) that supplement and/or replace the data representation(s) corresponding to real entities, objects, fixtures, computing devices, and/or things within the environment. In some embodiments, a simulated environment is configured and/or controlled based on one or more systems that mimic aspects of the corresponding real-world environment, for example physics system(s), lighting system(s), sound system(s), and/or other sense-related system(s) simulating data used by entities within the corresponding real-world environment.

The term "updated simulated environment" refers to a simulated environment updated based on real-time data corresponding to the real-world version of the simulated environment. The real-time data is utilized for one or more of positioning entities within the simulated environment, setting operational metrics associated with the simulated environment, or otherwise configuring the simulated environment to match aspects of the corresponding real-world environment.

The term "instance" when used with respect to a simulated environment refers to a particular data object or plurality of data objects embodying a concrete occurrence of a particular simulated environment, and that is maintained separate from other concrete occurrences of a particular simulated environment. In this regard, a simulated environment may be duplicated into any number of instances, with each instance independently configurable without directly affecting any of the other instances. It will be appreciated that each instance of a simulated environment may be configured independently or in conjunction with one or more other instances of the simulated environment or other simulated environments.

The term "alteration" refers to a change in the configuration, operation, and/or other controllable aspect of a simulated environment that differs from a corresponding real-world environment. Non-limiting examples of an alteration include a change to a configuration of a real-time sensor, a change to a configuration of a data-controlled robot, a new element simulated as compared to a corresponding real-world environment, a removed element simulated as compared to a corresponding real-world environment, a change in the layout of an environment represented in a simulated environment, and a change in task operation performed in a simulated environment as compared to a corresponding real-world environment.

The term "operation" refers to performance of tangible task(s), data-driven process(es), and/or other interaction(s) by one or more entities within an environment with the environment or between entities. In some embodiments, entities "operate" within an environment to perform one or more discrete task operation(s).

The term "simulated operation" refers to data-driven process(es) simulating any number of operation(s) performed within a simulated environment.

The term "simulated data" refers to electronically-managed data generated and/or resulting from simulated operation of a simulated environment. In some embodiments, simulated data includes simulated version(s) of any data that is collected, derived, generated, and/or otherwise received during operation of the real-world environment corresponding to the simulated environment.

The term "computing device" refers to hardware, software, firmware, and/or a combination thereof, that captures, stores, and/or processes data. In some embodiments, a computing device includes hardware, software, firmware, and/or a combination thereof, that performs particular desired functionality associated with the computing device. When used with respect to an environment, the term "computing device" refers to specific hardware, software, firmware, and/or a combination thereof, that is located within the environment or otherwise controls operations of the environment.

The term "simulated computing device" refers to an electronically-managed data representation of a particular computing device within a simulated environment corresponding to a real-world environment. In some embodiments, a simulated computing device within a simulated environment corresponds to a real-world computing device within the real-world environment corresponding to the simulated environment. The simulated computing device is configurable independent from any corresponding real-world computing device, but may be configured to represent the same configuration(s) of the corresponding real-world computing device. In some embodiments, a simulated computing device within the simulated environment solely exists within the simulated environment, such that the real-world environment includes no corresponding real-world computing device.

The term "real-time sensor" refers to one or more computing device(s) that, alone or in conjunction, operate to capture data of a particular type of data associated with an aspect of a particular environment. A real-time sensor is capable of transmitting captured sensor data to one or more directly connected computing devices for processing, and/or to access a high-throughput communications network for transmitting such captured sensor data to one or more computing device(s) remote from the real-time sensor. In some embodiments, a real-time sensor may include a single computing device or any number of computing devices communicable with one another. Non-limiting examples of a real-time sensor include an image sensor (e.g., an image camera), a video sensor (e.g., a video camera), a LiDAR sensor, a motion sensor, a location sensor, an RFID reader, and a range sensor.

The term "data-controlled robot" refers to any number of computing device(s) that maintain and/or utilize one or more machine learning, algorithmic, artificial intelligence, and/or statistical model(s) for performing operations within an environment. In some embodiments, an data-controlled robot includes and/or maintains one or more specially configured model(s) that generate results data used in determining operation(s) to be initiated for controlling one or more aspects of the data-controlled robot. In other embodiments, an data-controlled robot receives results data from external computing device(s) that maintain such one or more specially configured model(s) used in determining operation(s) to be initiated for controlling one or more aspects of the data-controlled robot. The simulated data-controlled robot is configurable independent from any corresponding real-world data-controlled robot, but may be configured to represent the same configuration(s) of the corresponding real-world data-controlled robot. In some embodiments, an data-controlled robot includes one or more arm(s), grip(s), and/or other physical component(s) controlled by the data-controlled robot that enable interaction with an environment surrounding the data-controlled robot.

The term "simulated data-controlled robot" refers to an electronically-managed data representation of a particular data-controlled robot within a simulated environment corresponding to a real-world environment. In some embodiments, a simulated data-controlled robot within a simulated environment corresponds to a real-world data-controlled robot within the real-world environment corresponding to the simulated environment. In some embodiments, a simulated data-controlled robot within the simulated environment solely exists within the simulated environment, such that the real-world environment includes no corresponding real-world data-controlled robot.

The term "automatically configuring" when used with respect to a computing device refers to setting one or more values of configurable properties, setting(s), and/or other data of the computing device, and/or initiating one or more data-driven process(es) on the computing device, to automatically cause a change in the functioning of the computing device. It will be appreciated that different types of computing devices are automatically configured in different manners that correspond to the settings, properties, and/or functionality of each type of computing device.

The term "real-time data set" refers to data received from one or more computing devices over a high-throughput communications network. A real-time data set include any number of individual portion(s) of data, and may include one or more types of data.

The terms "sensor data" and "real-time sensor data" refer to data captured by a real-time sensor that represents one or more aspects of an environment and is transmittable via a high-throughput communications network in real-time or near-real-time (e.g., within a time interval sufficient to enable continuous transmission of said data).

The term "sensor data type" refers to a categorization or data encoding of sensor data. In some embodiments, a data type for particular sensor data is based on the real-time sensor that captured such sensor data. Non-limiting examples include video data, image data, and motion data.

The term "data-controlled robot movement data" refers to electronically-managed data representing one or more aspects of current, future, and/or past movement of a data-controlled robot within an environment. Non-limiting examples of data-controlled robot movement data include pathing data, motion vector data, speed data, environment perception data, and movement status data.

The term "process" refers to any executable routine, function, and/or otherwise instruction based functionality performable by one or more computing device(s).

The term "user interface" refers to electronically-managed data renderable to one or more display(s) of a computer device or multiple computing device(s). A user interface includes any number of data objects embodying interface element(s), each interface element representing a portion of renderable data within the user interface.

The term "augmented reality interface" refers to a user interface including one or more interface element(s) rendered over or in conjunction with a captured representation of real-word elements within an environment. It will be appreciated that an augmented reality interface includes representations of real-world element(s) within an environment, and may include any number of augmented reality elements that are rendered within the captured representation of the environment but not present in the real-world environment, where such elements are entirely virtual.

The term "dashboard interface" refers to a user interface that includes interface element(s) embodying or associated with one or more operational metric(s) associated with an environment or a simulation environment.

The term "operational metric" refers to data-driven values derived from operations performed within or associated with an environment. In some embodiments, an operational metric represents a performance indicator representing a tracked rate, numerical value, or other metric quantifying or qualifying interaction(s) within the environment.

The term "real-time operational metric value" refers to a data value for an operational metric associated with current and/or real-time operation(s) occurring within an environment. In some embodiments, a real-time operational metric value is derived from real-time sensor data associated with operation(s) within the environment. In some embodiments, a real-time operational metric value is embodied by a value represented by the real-time sensor data, or is determinable utilizing one or more defined algorithm(s) based at least in part on one or more portions of real-time sensor data. A real-time operational metric value may represent a data value for an operational metric associated with a real-world environment, or associated with a simulated environment.

The term "simulated operational metric value" refers to a data value for an operational metric derived from simulated operations within a simulated environment. In some embodiments, a simulated operational metric for a simulated environment corresponds to an operational metric determined with respect to a real-world environment corresponding to the simulated environment.

The term "historical operational metric value" refers to a data value for an operational metric associated with operations of an environment at a previous timestamp or during a previous timestamp interval. A historical operational metric value may represent a data value for an operational metric associated with a real-world environment, or associated with a simulated environment.

The term "trend" with respect to a particular operational metric refers to data representing a change in one or more data value(s) associated with the particular operational metric over a timestamp interval. A trend for an operational metric is determinable from one or more historical operational metric values, simulated operational metric values, and/or real-time operational metric values.

The term "trained model" refers to one or more, or a combination of, machine learning, statistical, and/or algorithmic model(s) specially trained with respect to a particular goal function or metric. In some embodiments, a trained model is generated (or "trained") to maximize one or more goal metrics by learning patterns, trends, and/or other data interpretations from training data inputted to a model during a training process.

The term "updating" when used with respect to a trained model refers to a training process for altering the trained model based at least in part on new data utilized for training. It will be appreciated that in some embodiments each iteration of updating a model generates a new version of the trained model, and may include different valued parameter(s), hyperparameter(s), or other configuration(s) utilized by the trained model.

The term "implemented version" when used with respect to a trained model refers to a current iteration (or "version") of a trained model utilized by one or more computing device(s). It will be appreciated that in some circumstances, computing device(s) are updated independently, such that different computing device(s) may maintain and/or access different implemented versions of a particular trained model.

The term "updated version" when used with respect to a trained model refers to a newly generated iteration (or "version") of a trained model upon completion of an updating process.

The term "accuracy data" refers to data representing a determined likelihood that a particular trained model generates results data that does not produce an error data object or otherwise is determined to match or satisfy expected data.

The term "updated accuracy data" when used with respect to a trained model refers to accuracy data for an updated version of the trained model.

The term "previous accuracy data" when used with respect to a trained model refers to accuracy data for previous versions of the trained model.

The term "preferred model" refers to a trained model selected for use, deployment, and/or implementation from a set of candidate trained models. In some embodiments, a preferred model is selected based on the accuracy data for each of the candidate trained models.

The term "improvement threshold" refers to electronically-managed data representing a minimum improvement in the accuracy of a trained model for deployment of an updated version of the trained model to replace an implemented version of the trained model. In some embodiments, the improvement between a first version and a second version of a trained model is determined based on the difference between the accuracy data for each version of the trained model.

The term "error data object" refers to electronically managed data representing a failed interaction of a data-controlled robot initiated based at least in part on results data outputted by a trained model utilized by the data-controlled robot, and/or incorrect results data generated by a trained model utilized by the data-controlled robot.

The term "simulated error data object" refers to an error data object representing a failed interaction of a simulated data-controlled robot initiated based at least in part on results data outputted by a trained model utilized by the simulated data-controlled robot, or incorrect results data generated by a trained model utilized by the simulated data-controlled robot.

The term "task operation" refers to particular action(s) to be performed by one or more entities within a particular environment by interaction between the entity and at least a portion of the environment. Non-limiting examples of a task operation include a picking operation to be performed automatically or manually by one or more entities within an environment. In some embodiments, a task operation includes one or more data-driven process(es) representing performance of a particular action, including without limitation scanning of a machine-readable label (e.g., a barcode, QR code, and/or the like) on a particular object, relocating a particular object through one or more sensor(s) to another location, and/or picking an object from a current location and depositing it in another location for confirmation of the identity of the object and/or further processing of the object by another system. In some embodiments, a task operation includes or is associated with target location data embodying the location at which the task operation may be performed.

Example Systems and Apparatuses of the Disclosure

FIG. 1 illustrates a block diagram of a system that may be specially configured within which embodiments of the present disclosure may operate. Specifically, FIG. 1 depicts an example system 100 representing computing devices of a real-world environment for environment simulation and use. The system 100 includes one or more real-time sensors 104A-104N (collectively "plurality of real-time sensors 104"), one or more data-controlled robot(s) 106A-106N (collectively "data-controlled robots 106"), and a real-time simulation processing system 102. The real-time simulation processing system 102 is communicable with one or more other computing device(s), such as some or all of the data-controlled robots 106 and/or some or all of the real-time sensors 104, over the high-throughput communications network 108. In some embodiments, the real-time simulation processing system 102 communicates with only the data-controlled robots 106 via the high-throughput communications network 108, and/or only the real-time sensors 104 via the high-throughput communications network 108.

The plurality of real-time sensors 104 may include any number and/or types of real-time sensors that monitor one or more aspects of a particular environment, or a plurality of environments. Each of the real-time sensors 104 is configured to capture sensor data in real-time, and in real-time or near-real-time continuously transmit such real-time sensor data for processing. In some embodiments, for example, each of the real-time sensor(s) communicates captured real-time sensor data to one or more of the data-controlled robot(s) 106 for use in generating and/or updating an individual model maintained by one or more of the data-controlled robot(s) 106. In this regard, the real-time sensors 104 may provide various portions of real-time sensor data that may be utilized to determine a context, operations, characteristics, and/or other facets of an environment and/or interactions occurring within the environment (e.g., by the data-controlled robot(s) 106).

The real-time sensors 104 may include a myriad of different sensor types that each one or more types of sensor data. For example, the real-time sensors 104 may include one or more real-time video sensors, image sensors, LiDAR sensors, motion sensors, range sensors, RFID sensors, and/or the like, or a combination thereof. It will be appreciated that each of these types of real-time sensors may capture a different sensor data type, for example a video sensor may capture real-time video data, an image sensor may capture real-time image data, a LiDAR sensor may capture real-time LiDAR data (e.g., high-fidelity point cloud data), and the like. In this regard, a set of real-time data including real-time sensor data may be generated and/or received by one or more computing device(s), such as one or more of the data-controlled robot(s) 106, that includes various subsets of data from each particular real-time sensor of the real-time sensors 104 and/or various subsets of data of a particular sensor data type received from one or more real-time sensors of the real-time sensors 104. Additionally or alternatively, in some embodiments, the various types of real-time sensor data may provide additional context and/or enable different determination(s) to be performed based on various individual portions of data of a particular sensor data type and/or a combination of sensor data types.

In some embodiments, each real-time sensor of the real-time sensors 104 is configured for communication of captured real-time sensor data to one or more other computing devices, such as the data-controlled robot(s) 106, via the high-throughput communications network 108. Each of the real-time sensors 104 may communicate the captured real-time sensor data in a continuous, real-time manner, such that the data-controlled robot(s) (and/or other computing device(s), such as the real-time simulation processing system 102) that receive the real-time sensor data such real-time sensor data continuously and/or in real-time or near-real-time for processing. In some embodiments, each real-time sensor of the real-time sensors 104 includes hardware, software, firmware, and/or a combination thereof, that enables continuous, real-time or near-real-time transmission of the captured real-time sensor data over the high-throughput communications network 108 (e.g., high-frequency signal producing chips, antennas, and/or the like). Alternatively or additionally, in some embodiments, one or more real-time sensor(s) of the real-time sensors 104 is directly communicable with a computing device embodied in hardware, software, firmware, and/or a combination thereof, that performs the real-time or near-real-time, continuous transmission of sensor data via the high-throughput communications network 108.

The data-controlled robot(s) 106 each include any number of computing device(s) and/or system(s) that facilitate data-driven interaction within an environment. In some embodiments, the data-controlled robot(s) 106 include one or more computing device(s) embodied in hardware, software, firmware, and/or a combination thereof, that provide for aggregation of real-time sensor data into a processable real-time data set, generation and/or maintenance of one or more model(s) used for interacting with the environment, and/or interaction with an environment based at least in part on one or more individual model(s). Additionally or alternatively, in some embodiments, one or more of the data-controlled robot(s) 106 includes specialized component(s) embodied in hardware, software, firmware, and/or a combination thereof, for interacting with the environment. For example, in some embodiments, a data-controlled robot includes specialized arm(s), manipulator(s), actuator(s), and/or other mechanism(s) that enable interaction with an environment to perform a particular task operation (e.g., to lift an item, position an item, interact with an item, and/or the like). Additionally or alternatively, in some embodiments, an data-controlled robot includes specialized wheel(s), roller(s), leg(s), and/or other mechanism(s) that enable movement and/or traversal throughout an environment. Non-limiting examples of data-controlled robot(s) 106 include one or more autonomous vehicles, specially configured autonomous robots, adaptive autonomous vehicles (e.g., having multiple specialized components for performing multiple task operations), and/or the like.

In some embodiments, one or more of the data-controlled robot(s) 106 includes hardware, software, firmware, and/or a combination thereof, that receives data model(s) for use, real-time data, and/or the like. In this regard, the data-controlled robot(s) 106 may utilize the high-throughput communications network 108 to receive real-time, continuous transmissions of data (e.g., sensor data and/or model(s)) from one or more of the real-time sensors 104. Alternatively or additionally, in some embodiments, one or more of the data-controlled robot(s) 106 includes one or more on-board real-time sensors that capture real-time sensor data and directly transmit such captured sensor data for processing (e.g., without use of the high-throughput communications network 108). The data-controlled robot(s) 106 may store and/or process all received sensor data, for example regardless of whether such sensor data was received from one or more onboard real-time sensors and/or one or more external real-time sensors monitoring a particular environment. In some embodiments, one or more of the data-controlled robot(s) 106 maintains a buffer embodying the set of real-time sensor data comprising one or more portions of received real-time sensor data. Such a buffer of sensor data may be updated at occurrence of particular events and/or determinations, updated over time, or overwritten as new data is received that exceeds the buffer length by deleting older sensor data.

In some embodiments, one or more of the data-controlled robot(s) 106 includes hardware, software, firmware, and/or a combination thereof, that generates and/or updates one or more model(s). A particular data-controlled robot may maintain an individual model that generates results data utilized for performing one or more determination(s) and/or initiating one or more particular operations. In some embodiments, for example, one or more individual model(s) are trained and maintained that are subsequently utilized to initiate process(es) for interacting with the environment, such as to perform one or more task operation(s). In some embodiments, the data-controlled robot(s) 106 maintain perception model(s) that generate results data utilized in navigating throughout an environment and/or performing one or more interactions for accomplishing a task operation. Such model(s) may be embodied by any of a myriad of model types, including a reinforcement learning model, a neural network, a regression model, and/or the like.

As described herein, the data-controlled robot(s) 106 may receive a continuous, real-time set of sensor data from any of the real-time sensors 104, other real-time sensor(s) onboard the data-controlled robot(s) 106, and/or the like. In some embodiments, the data-controlled robot(s) 106 process such data to perform one or more operations to interact with the environment. Additionally, in some embodiments, the data-controlled robot(s) 106 further learn from and/or otherwise maintain the model(s) based at least in part on the newly received real-time sensor data. In some embodiments, as new real-time sensor data is received from one or more of the real-time sensors 104, the data-controlled robot(s) 106 process such newly received real-time sensor data to further train and update the one or more individual model(s) based at least in part on error data generated via the model(s) using the newly received real-time sensor data. Alternatively or additionally, in some embodiments, the data-controlled robot(s) 106 update the one or more model(s) directly based at least in part on the real-time sensor data.

The real-time simulation processing system 102 includes one or more computing device(s) embodied in hardware, software, firmware, and/or a combination thereof, that provides functionality generating a simulated environment representing a real-world environment, and utilizing the simulated environment. Specifically, in some embodiments, the real-time simulation processing system 102 provides functionality for receiving real-time data associated with a real-world environment, generating an updated simulated environment based on the real-time data, updating one or more trained model(s) based at least in part on the real-time data, generating user interface(s) visualizing a simulated environment in real-time, and utilizing the simulated environment to generate simulated data. Additionally or alternatively, in some embodiments, the real-time simulation processing system 102 provides functionality for tracking operational metric value(s) for simulated operational metrics as the simulated environment is run, comparing data associated with operation of the real-world environment with simulated operation of the simulated environment, and initiating one or more process(es) based on the results of the comparison to implement changes in the real-world environment based at least in part on the simulated environment. The real-time simulation processing system 102 may include one or more specially configured server(s), database(s), and/or other computing device(s), that receive and/or store data, generate, maintain, and/or update a simulated environment, run a simulated environment, and/or initiate process(es) based at least in part on simulated data generated using the simulated environment. Any of such data received, determined, generated, and/or otherwise accessible to the real-time simulation processing system 102 may be stored for future use (e.g., to revert and/or otherwise generate simulated environment(s)). It will be appreciated that the real-time simulation processing system 102 may be embodied entirely by one or more back-end computing systems, or in some embodiments may include one or more peripheral device(s), display(s), and/or other computing hardware, software, firmware, and/or the like that enables direct and/or indirect user input, review, and/or other interactions.

In some embodiments, the real-time simulation processing system 102 maintains any number of trained model(s) for deployment in the real-world environment and/or use in configuring one or more aspects of the real-world environment. Additionally or alternatively, such trained model(s) may be implemented within a simulated environment to test how applying such trained model(s), and/or configuring the simulated environment utilizing such trained model(s), affect operation of the real-world environment through simulation in the simulated environment. The real-time simulation processing system 102 may leverage the high-throughput communications network 108 to enable real-time and/or continuous updating of one or more simulated environment(s) and/or updating of trained model(s) based at least in part on received real-time data. The real-time simulation processing system 102 may receive and/or determine (e.g., from real-time data) operational data values corresponding to operational metrics tracking operation of a real-world environment, and/or receive and/or determine simulated operational data values corresponding to operational metrics tracking simulated operation of an updated simulated environment. The real-time simulation processing system 102 may leverage the high-throughput communications network 108 to enable continuous, real-time transmission of high-fidelity (e.g., point cloud data, high-resolution color images such as RGB and/or RGBA images, proximity data, and/or the like) data in a manner that remains sufficiently low latency, high throughput, and high bandwidth. The real-time simulation processing system 102 may receive such data to maintain an updated simulated environment that reflects the real-time updated operations in the corresponding real-world environment, updates trained model(s), and/or otherwise utilizes the real-time data.

The high-throughput communications network 108 may embody any of a myriad of low latency, high-throughput, high-bandwidth, and/or otherwise high-transmission rate network configurations. In some embodiments, a high-throughput communications network 108 includes any number of networked computing devices embodying a 5G network. In another example context, a high-throughput communications network 108 includes one or more Wi-Fi 6-enabled network access points, relay(s), and/or the like. The high-throughput communications network 108 enables continuous and/or real-time communication between the real-time sensors and the data-controlled robot(s) 106, and/ or in some embodiments between the data-controlled robot(s) 106 and the real-time simulation processing system 102. Alternatively or additionally still, in some embodiments the high-throughput communications network 108 enables direct communication between the real-time sensors 104 and the real-time simulation processing system 102. For example, in some embodiments, the high-throughput communications network 108 includes one or more base station(s), relay(s), router(s), relay(s), switch(es), cell tower(s), communication cable(s), routing station(s), and/or the like. The high-throughput communications network 108 may include a plurality of network access points and/or relay points that are proximate to one another to facilitate high-frequency transport of high fidelity transmissions over a shorter range than non-high-throughput communications networks.

FIG. 2 illustrates a block diagram of an example real-time simulation apparatus that may be specially configured in accordance with an example embodiment of the present disclosure. In some embodiments, the real-time simulation processing system 102 is embodied by one or more computing device(s), such as the real-time simulation apparatus 200 as depicted and described in FIG. 2. The real-time simulation apparatus 200 includes a processor 202, a memory 204, input/output circuitry 206, communications circuitry 208, real-time data intake circuitry 210, model management circuitry 212, and simulation management circuitry 214. The real-time simulation apparatus 200 may be configured, using one or more of the sets of circuitry 202, 204, 206, 208, 210, 212, and/or 214, to execute the operations described herein.

Although components are described with respect to functional limitations, it should be understood that the particular implementations necessarily include the user of particular computing hardware. It should also be understood that certain of the components described herein may include similar or common hardware. For example, two sets of circuitry may both leverage use of the same processor(s), network interface(s), storage medium(s), and/or the like, to perform their associated functions, such that duplicate hardware is not required for each set of circuitry. The user of the term "circuitry" as used herein with respect to components of the apparatuses described herein should therefore be understood to include particular hardware configured to perform the functions associated with the particular circuitry as described herein.

Particularly, the term "circuitry" should be understood broadly to include hardware and, in some embodiments, software for configuring the hardware. For example, in some embodiments, "circuitry" includes processing circuitry, storage media, network interfaces, input/output devices, and/or the like. Alternatively or additionally, in some embodiments, other elements of the real-time simulation apparatus 200 may provide or supplement the functionality of another particular set of circuitry. For example, the processor 202 in some embodiments provides processing functionality to any of the sets of circuitry, the memory 204 provides storage functionality to any of the sets of circuitry, the communications circuitry 208 provides network interface functionality to any of the sets of circuitry, and/or the like.

In some embodiments, the processor 202 (and/or co-processor or any other processing circuitry assisting or otherwise associated with the processor) may be in communication with the memory 204 via a bus for passing information among components of the real-time simulation apparatus 200. In some embodiments, for example, the memory 204 is non-transitory and may include, for example, one or more volatile and/or non-volatile memories. In other words, for example, the memory 204 in some embodiments includes or embodies an electronic storage device (e.g., a computer readable storage medium). In some embodiments, the memory 204 is configured to store information, data, content, applications, instructions, or the like, for enabling the real-time simulation apparatus 200 to carry out various functions in accordance with example embodiments of the present disclosure.

The processor 202 may be embodied in a number of different ways. For example, in some example embodiments, the processor 202 includes one or more processing devices configured to perform independently. Additionally or alternatively, in some embodiments, the processor 202 includes one or more processor(s) configured in tandem via a bus to enable independent execution of instructions, pipelining, and/or multithreading. The use of the terms "processor" and "processing circuitry" may be understood to include a single core processor, a multi-core processor, multiple processors internal to the real-time simulation apparatus 200, and/or one or more remote or "cloud" processor(s) external to the real-time simulation apparatus 200.

In an example embodiment, the processor 202 may be configured to execute instructions stored in the memory 204 or otherwise accessible to the processor. Alternatively or additionally, the processor 202 in some embodiments is configured to execute hard-coded functionality. As such, whether configured by hardware or software methods, or by a combination thereof, the processor 202 may represent an entity (e.g., physically embodied in circuitry) capable of performing operations according to an embodiment of the present disclosure while configured accordingly. Alternatively or additionally, as another example in some example embodiments, when the processor 202 is embodied as an executor of software instructions, the instructions may specifically configure the processor 202 to perform the algorithms embodied in the specific operations described herein when such instructions are executed.

As one particular example, the processor 202 may be configured to perform various operations associated with real-time, continuous environment simulating and/or use of the simulated environment, for example as described with respect to operation of the real-time simulation processing system 102 and/or as described further herein. In some embodiments, the processor 202 includes hardware, software, firmware, and/or a combination thereof, that receives, via a high-throughput communications network, a real-time data set associated with a real-world environment. Additionally or alternatively, in some embodiments, the processor 202 includes hardware, software, firmware, and/or a combination thereof, that stores real-time data of the real-time data set in one or more data repository. Additionally or alternatively, in some embodiments, the processor 202 includes hardware, software, firmware, and/or a combination thereof, that derives at least one operational metric value corresponding to at least one operational metric based at least in part on the real-time data set. Additionally or alternatively, in some embodiments, the processor 202 includes hardware, software, firmware, and/or a combination thereof, that updates at least one trained model based at least in part on the real-time data set. Additionally or alternatively, in some embodiments, the processor 202 includes hardware, software, firmware, and/or a combination thereof, that generates an updated simulated environment. Additionally or alternatively, in some embodiments, the processor 202 includes hardware, software, firmware, and/or a combination thereof, that initiates at least one process based at least in part on the updated simulated environment.

In some embodiments, the real-time simulation apparatus 200 includes input/output circuitry 206 that may, in turn, be in communication with processor 202 to provide output to the user and, in some embodiments, to receive an indication of a user input. The input/output circuitry 206 may comprise one or more user interface(s) and may include a display that may comprise the interface(s) rendered as a web user interface, an application user interface, a user device, a backend system, or the like. In some embodiments, the input/output circuitry 206 may also include a keyboard, a mouse, a joystick, a touch screen, touch areas, soft keys a microphone, a speaker, or other input/output mechanisms. The processor 202 and/or input/output circuitry 206 comprising the processor may be configured to control one or more functions of one or more user interface elements through computer program instructions (e.g., software and/or firmware) stored on a memory accessible to the processor (e.g., memory 204, and/or the like). In some embodiments, the input/output circuitry 206 includes or utilizes a user-facing application to provide input/output functionality to a client device and/or other display associated with a user. In some embodiments, the input/output circuitry 206 is optionally excluded, for example in embodiments where the real-time simulation apparatus 200 is entirely autonomous and no user input and/or output is desired. In some embodiments, the input/output circuitry 206 includes or is embodied by a client device in communication with the real-time simulation apparatus 200 that receives data for rendering via the client device.

The communications circuitry 208 may be any means such as a device or circuitry embodied in either hardware or a combination of hardware and software that is configured to receive and/or transmit data from/to a network and/or any other device, circuitry, or module in communication with the real-time simulation apparatus 200. In this regard, the communications circuitry 208 may include, for example, a network interface for enabling communications with a wired or wireless communications network. For example, the communications circuitry 208 may include one or more network interface card(s), antenna(s), bus(es), switch(es), router(s), modem(s), and supporting hardware, firmware, and/or software, or any other device suitable for enabling communications via one or more communications network(s). Additionally or alternatively, the communications circuitry 208 may include circuitry for interacting with the antenna(s) and/or other hardware or software to cause transmission of signals via the antenna(s) or to handle receipt of signals received via the antenna(s). In some embodiments, the communications circuitry 208 enables transmission of data (e.g., to a one or more data-controlled robot(s) and/or other computing device associated with the real-time simulation apparatus 200) and/or receipt of data (e.g., real-time, continuous sensor data from one or more real-time sensor(s), and/or the like) in communication with the real-time simulation apparatus 200. In some embodiments, the communications circuitry 208 enables transmission of data and/or receiving of data via one or more high-throughput communications network(s).

The real-time data intake circuitry 210 includes hardware, software, firmware, and/or a combination thereof, that supports various functionality associated with real-time data receipt, aggregation, and/or storing. In some embodiments, the real-time data intake circuitry 210 includes hardware, software, firmware, and/or a combination thereof, that receives and/or requests real-time sensor data from one or more real-time sensor(s). In some embodiments, the real-time data intake circuitry 210 continuously receives and/or requests such real-time sensor data from the one or more real-time sensor(s), such that the available real-time sensor data available for processing is consistently updated. Additionally or alternatively, in some embodiments, the real-time data intake circuitry 210 includes hardware, software, firmware, and/or a combination thereof, that communicates directly or indirectly from one or more real-time sensor(s) onboard a data-controlled robot, one or more real-time sensor(s) located at fixed and/or mobile locations in the real-world environment, and/or the like. Additionally or alternatively, in some embodiments, the real-time data intake circuitry 210 includes hardware, software, firmware, and/or a combination thereof, that communicates with one or more external system(s) that store operational metric value(s) for operational metric(s) associated with operation of the real-world environment. Such system(s) may be embodied in the real-world environment, as remote and/or cloud system(s) external to the real-world environment, and/or the like. Additionally or alternatively, in some embodiments, the real-time data intake circuitry 210 includes hardware, software, firmware, and/or a combination thereof, that maintains a buffer of any number of portions of real-time data from any number of source computing device(s). Additionally or alternatively, in some embodiments, the real-time data intake circuitry 210 includes hardware, software, firmware, and/or a combination thereof, that stores real-time data associated with a particular real-world environment in one or more data repositories, and/or retrieves real-time data associated with a real-world environment for processing. It will be appreciated that, in some embodiments, real-time data intake circuitry 210 may include a separate processor, specially configured field programmable gate array (FPGA), or a specially programmed application specific integrated circuit (ASIC).

The model management circuitry 212 includes hardware, software, firmware, and/or a combination thereof, that supports various functionality associated with updating, utilizing, and/or deploying one or more trained model(s). For example, in some embodiments, the model management circuitry 212 includes hardware, software, firmware, and/or a combination thereof, that updates training of a particular model based at least in part on real-time data received by and/or otherwise accessible via the real-time simulation apparatus 200. Additionally or alternatively, in some embodiments, the model management circuitry 212 includes hardware, software, firmware, and/or a combination thereof, that stores updated trained model(s). Additionally or alternatively, in some embodiments, the model management circuitry 212 includes hardware, software, firmware, and/or a combination thereof, that determines accuracy data associated with a version of a trained model. Additionally or alternatively, in some embodiments, the model management circuitry 212 includes hardware, software, firmware, and/or a combination thereof, that applies a version of a trained model to configure one or more aspects of a simulated environment and/or one or more aspects of a real-world environment. For example, in some embodiments, the model management circuitry 212 includes hardware, software, firmware, and/or a combination thereof, to apply a trained model to configure operation of a data-controlled robot, a real-time sensor, or simulated representations thereof. Additionally or alternatively, in some embodiments, the model management circuitry 212 includes hardware, software, firmware, and/or a combination thereof, that determines improvements in accuracy between one or more version(s) of a trained model. Additionally or alternatively, in some embodiments, the model management circuitry 212 includes hardware, software, firmware, and/or a combination thereof, that detects error(s) generated by and/or resulting from use of a trained model, and/or updates the trained model based on such error data object(s). It will be appreciated that, in some embodiments, the model management circuitry 212 may include a separate processor, specially configured field programmable gate array (FPGA), or a specially programmed application specific integrated circuit (ASIC).

The simulation management circuitry 214 includes hardware, software, firmware, and/or a combination thereof, that supports various functionality associated with updating and/ or utilizing a simulated environment. For example, in some embodiments, the real-time simulation apparatus 200 includes hardware, software, firmware, and/or a combination thereof, that updates a simulated environment based at least in part on real-time data. Additionally or alternatively, in some embodiments, the real-time simulation apparatus 200 includes hardware, software, firmware, and/or a combination thereof, that executes and/or otherwise runs operations of the simulated environment. Additionally or alternatively, in some embodiments, the real-time simulation apparatus 200 includes hardware, software, firmware, and/or a combination thereof, that generates simulated data based at least in part on simulated operation of the simulated environment. Additionally or alternatively, in some embodiments, the real-time simulation apparatus 200 includes hardware, software, firmware, and/or a combination thereof, that alters one or more aspects of a simulated environment based at least in part on real-time data, accessible trained model(s), and/or the like. Additionally or alternatively, in some embodiments, the real-time simulation apparatus 200 includes hardware, software, firmware, and/or a combination thereof, that generates multiple different simulated environments, each updated simulated environment altered in a different aspect than one or more other updated simulated environments. Additionally or alternatively, in some embodiments, the real-time simulation apparatus 200 includes hardware, software, firmware, and/or a combination thereof, that generates simulated operational metric value(s) for operational metrics based at least in part on running an updated simulated environment. Additionally or alternatively, in some embodiments, the real-time simulation apparatus 200 includes hardware, software, firmware, and/or a combination thereof, that automatically triggers altering of one or more aspects of a real-world environment based at least in part on data determined, generated, and/or otherwise identified via running a simulated environment. It will be appreciated that, in some embodiments, the simulation management circuitry 214 may include a separate processor, specially configured field programmable gate array (FPGA), or a specially programmed application specific integrated circuit (ASIC).

Additionally or alternatively, in some embodiments, one or more of the sets of circuitries 202-214 are combinable. Alternatively or additionally, in some embodiments, one or more of the sets of circuitry perform some or all of the functionality described associated with another component. For example, in some embodiments, one or more of the sets of circuitry 202-214, such as two or more of the real-time data intake circuitry 210, the model management circuitry 212, and/or the simulation management circuitry 214, are combined into a single module embodied in hardware, software, firmware, and/or a combination thereof. Similarly, in some embodiments, one or more of the sets of circuitry, for example the real-time data intake circuitry 210, model management circuitry 212, and/or the simulation management circuitry 214 are combined such that the processor 202 performs one or more of the operations described above with respect to each of these modules.

Example Environments of the Disclosure

Having described example systems, apparatuses, and data flows in accordance with the present disclosure, example visualizations of environments within which embodiments of the present disclosure may operate will now be discussed. The depicted environments may include or be associated with any number and/or types of real-time sensors, entities operating within the environment, item configurations within the environment, layouts, and/or the like. It will further be appreciated that the environments within which embodiments of the present disclosure operate may include or be associated with any number and/or types of computing devices, for example additional and/or alternative to the AI robots as depicted and described. In this regard, the specific environment visualizations as depicted and described herein are for illustrative purposes, and should not limit the scope and/or spirit of this disclosure.

FIG. 3 illustrates an example visualization of a warehouse environment in an example context for environment simulation in accordance with at least some example embodiments of the present disclosure. Specifically, FIG. 3 depicts a visualization of an example environment 300 within which a plurality of data-controlled robots operate. In one example context, the environment 300 embodies a warehouse environment within which one or more data-controlled robot(s) operate to interact with the environment and facilitate performance of particular task operation(s) (e.g., item picking, identification, selection, repositioning, and/or removal from the environment 300). It will be appreciated that embodiments described herein may provide advantages within any of a myriad of environments. Accordingly, the specific environments depicted and described are for purposes of illustration and should not limit the scope or spirit of this disclosure.

The environment 300 may include any of a myriad of physical objects, including items, environmental elements, furniture, and/or the like. For example, the environment 300 may include one or more objects located throughout the environment at a fixed position, or that are otherwise not intended to be moved. Non-limiting examples of such objects include environment boundaries (e.g., walls, ceilings, floors, and/or the like that define the environment 300), furniture pieces, warehouse shelving units, conveyor belts, fixed machinery, and/or the like. Alternatively or additionally, in some embodiments, the environment 300 may include one or more items at one or more locations throughout. The items may embody products, goods, and/or other objects with which an data-controlled robot or other entity within the environment 300 (e.g., a human picker) may interact, for example to perform one or more task operation(s). In one example context, the data-controlled robots operate within the environment 300 to pick item(s) in the environment 300 for extraction, pick item(s) in the environment 300 for movement to a different location within the environment 300 or another environment, pick item(s) for packaging and shipping from the environment 300 to another location, and/or the like. In this regard, it will be appreciated that the environment 300 may include any number of such object(s), item(s), and/or other components to facilitate performance of such tasks.

The environment 300 includes a plurality of networking devices 304A-304J (collectively "networking devices 304"). The networking devices 304 embody at least a portion of a high-throughput communications network that is accessible to communicate data between any of the myriad of computing devices in or associated with the environment 300. For example, in some embodiments, the high-throughput communications network embodied by the plurality of networking devices 304 facilitates real-time and/or continuous transmission of sensor data from each of a myriad of real-time sensors within the environment 300 to one or more data-controlled robot(s) within the environment 300. Additionally or alternatively, in some embodiments, the high-throughput communications network embodied by the plurality of networking devices 304 facilitates real-time and/or continuous transmission from one or more data-controlled robot(s) to one or more external device(s) and/or system(s) (not depicted) associated with the environment 300, for example a real-time simulation processing system 102 embodied by the real-time simulation apparatus 200 as described herein. In some embodiments, the real-time simulation processing system 102 embodied by the real-time simulation apparatus 200 is located within the environment 300, proximate to the environment 300 (e.g., in a separate room, building, and/or other location within a particular threshold distance from the environment 300), and/or in a remote, non-proximate location facilitated by one or more additional networking device(s), for example embodying a high-throughput communications network. In some example contexts, the plurality of networking devices 304 facilitates continuous, real-time or near-real-time transmission of a sensor data to one or more data-controlled robot(s) and/or a real-time data central learning system, and/or facilitates continuous, real-time or near-real-time transmission of data associated with or embodying a model to and/or from one or more data-controlled robot(s) to a real-time simulation apparatus 200, where the data-controlled robot(s) and/or real-time simulation apparatus 200 is on-premises with respect to the environment 300. In other example contexts, the networking devices 304 facilitate such transmission to one or more data-controlled robot(s) at a different location, and/or a real-time simulation processing system embodied as a cloud-based system providing such functionality as depicted and described.

Each of the networking devices 304 may be affixed in any of a myriad of manners within the environment 300. For example, in some embodiments, one or more of the plurality of networking devices 304 may be affixed, either temporarily or permanently, to static or generally non-moving portions of the environment 300 (e.g., a wall, a ceiling, large tiered shelving objects, machinery, and/or the like). Additionally or alternatively, in some embodiments, one or more of the plurality of networking devices 304 may be affixed, either temporarily or permanently, to moving objects within the environment 300 (e.g., a moving data-controlled robot, a portion of an data-controlled robot, another autonomous vehicle, a manually-controlled vehicle, a moving element of a piece of machinery, and/or the like). The environment 300 may include any amount of networking devices arranged within the environment 300 to sufficiently provide high-throughput communications network services at all desired locations within the environment 300. The networking devices 304 may function in tandem to provide data transmission, relaying, and/or other communication throughout the environment 300.

The environment 300 further includes a plurality of data-controlled robot(s) 306A-306D (collectively "data-controlled robots 306"). The data-controlled robots 306 may operate within the environment 300 to perform any of a myriad of action(s), interact within the environment 300, and/or otherwise perform one or more task operation(s). In some embodiments, for example, one or more of the data-controlled robot(s) traverses throughout the environment 300 to interact with one or more item(s) within the environment 300 as part of performing a task operation assigned to the data-controlled robot. Additionally or alternatively, in some embodiments, one or more of the data-controlled robots 306 traverse throughout the environment 300 to perform any of a myriad of independent action(s), for example to traverse through the environment 300 to another environment, inspect the environment 300 for issues within the environment 300, and/or the like. In some embodiments, a data-controlled robot of the data-controlled robots 306 maintains data indicating and/or embodying the task operation assigned to the data-controlled robot.

In some embodiments, each of the data-controlled robots 306 operates based at least in part on one or more specially configured model(s) applied to and/or maintained by the data-controlled robot of the data-controlled robots 306. For example, in some embodiments, one or more of the data-controlled robots 306 utilizes an individual model embodying a machine learning model that generates results data utilized to initiate process(es) for interacting with the environment of the data-controlled robot. Alternatively or additionally, in some embodiments the individual model embodies an artificial intelligence model that initiates such process(es) for interacting with the environment 300 directly. In one example context, the artificial intelligence model may be specially configured to initiate operation(s) that perform and/or otherwise attempt performance of interaction(s) for completing one or more task operation(s) assigned to the data-controlled robot. For example, the artificial intelligence model may produce results data that represents or informs generated instructions for moving one or more specialized components of the data-controlled robot to interact with the environment 300 in a particular manner, for example to move a mechanical arm, grabber, movement mechanisms, and/or the like to identify and pick a particular item from within the environment 300. It will be appreciated that the artificial intelligence model may be implemented utilizing any of a myriad of artificial intelligence model implementations. In some embodiments, the artificial intelligence model embodies a reinforcement learning model that is specially configured to learn based on a particular defined goal metric or representation corresponding to a successfully completed task operation and/or portion thereof. Non-limiting examples of such reinforcement learning model implementations include safe reinforcement learning models, association reinforcement learning models, deep reinforcement learning models, inverse reinforcement learning models, and/or the like.

It will be appreciated that, in some such embodiments, an data-controlled robot uses an individual model while simultaneously training said individual model based on such use. For example, one or more portions of sensor data may be processed by an individual model to interact with the environment 300 so as to progress or perform a particular task operation. In some embodiments, in circumstances where interactions and/or operations are performed without error the data-controlled robot may update the individual model to "reward" such a positive interaction (e.g., by updating to increase the likelihood such an interaction is repeated). Alternatively or additionally, in some embodiments, in circumstances where interactions and/or operations are performed and an error is detected the data-controlled robot may update the individual model to "punish" such a negative interaction (e.g., by updating to decrease the likelihood the error is repeated). In some embodiments, an data-controlled robot may cease learning for a period of time (e.g., while being set to a particular mode purely for operation), or may cease learning once particular criteria is satisfied (e.g., an accuracy threshold is reached). In yet other embodiments, one or more of the data-controlled robots continuously trains individual model(s) as it operates, thus continuously improving the likelihood that the data-controlled robot successfully interacts with the environment without errors as the individual model is improved.

In some embodiments, alternatively or additionally, the data-controlled robots 306 receive a trained model for storing and/or use from one or more external system(s), such as the real-time simulation processing system 102 as described herein. For example, in some embodiments, the data-controlled robots 306 receive a trained model that is indicated via simulated operation of a simulated environment to improve one or more operational metrics. In this regard, new version(s) of a trained model and/or new type(s) of trained models may accurately be tested via the simulation environment before deployment to the real-world environment depicted as environment 300.

An environment may include any number of data-controlled robots, each of which may be the same type of data-controlled robot and/or a different type of data-controlled robot. In this regard, each data-controlled robot of the data-controlled robots 306 may include any number of specialized component(s), mechanism(s), computing device(s), sensor(s), and/or the like, that enable the data-controlled robot to perform one or multiple action(s) related to accomplishing any number of task operations. For example, in some embodiments, one or more of the data-controlled robots 306 includes any number of onboard real-time sensors that provide sensor data utilized for perception, processing via one or more model(s), and/or the like. Additionally or alternatively, the one or more of the data-controlled robots 306 includes hardware, software, firmware, and/or the like for communicating in real-time and/or continuously with other real-time sensors external to the data-controlled robot, for example via a high-throughput communications network. In some embodiments, additionally or alternatively still, one or more of the data-controlled robots 306 includes specialized mechanism(s) that enable interaction with the environment 300. For example, one or more of the data-controlled robots 306 may include a robotic arm, an instruction-controlled forklift, a conveyor, and/or the like. Such specialized mechanism(s) may be controlled by sub-devices and/or circuitry of the data-controlled robot, for example embodied in hardware, software, firmware, and/or any combination thereof. In some embodiments, another type of data-controlled robot includes an autonomously-controlled vehicle, or semi-autonomous vehicle, that enables transportation of a user. Some such data-controlled robots may additionally or alternatively output instructions, user interfaces, and/or other data associated with action(s) to be performed by the user, for example to progress or complete a particular task operation.

It will be appreciated that in some contexts, an environment may include only a single type of entity. For example, the environment 300 may include data-controlled robots 306 each embodying entirely autonomous data-controlled robots. Alternatively, in some contexts, the environment 300 may include a plurality of data-controlled robot types. For example, the environment 300 may include data-controlled robots 306 embodying one or more fully autonomous data-controlled robots, one or more semi-autonomous data-controlled robots, and separately include one or more human actor(s) (for example, the human actor 310) and/or manually-controlled vehicles, machinery, and/or the like. In some such contexts, the semi-autonomous data-controlled robots and/or human actors may receive data-driven instructions, user interfaces, and/or other information generated based at least in part by one or more specialized models trained as described herein for progressing and/or completing a particular task operation.

The environment 300 further includes human actor 310. The human actor 310 may interact with the environment 300 and/or the data-controlled robots 306 in any of a myriad of manners. For example, in some embodiments, the human actor 310 provides a dynamic environmental element that data-controlled robots 306 are required to account for—such as by avoiding collisions with such human actors such as the human actor 310, avoiding interfering with the human actor 310, and/or the like. Additionally or alternatively, the data-controlled robots 306 may interact with one or more human actors, such as the human actor 310, to perform one or more action(s) that progress and/or complete one or more task operation(s). Alternatively or additionally still, in some embodiments, the human actor 310 interacts with the environment 300 independently based on instructions, user interface(s), and/or other data provided to the human actor 310 via an associated client device and/or other computing device. In some such embodiments, the human actor 310 receives instructions, data, and/or user interfaces indicating interaction(s) to be performed by the human actor generated based at least in part on use of one or more model(s) specially configured in the manner described herein.

The environment 300 further includes a plurality of real-time sensors. Such a plurality of real-time sensors includes the real-time video sensors 302A-302E, the real-time motion sensors 308A-308B, and real-time image sensor 312. It will be appreciated that any of a myriad of other real-time sensors and/or sensor types may be located throughout the environment 300, for example one or more LiDAR sensors, range sensors, proximity-based data sensors (e.g., RFID sensors, Bluetooth beacons, and/or the like). Additionally or alternatively, the environment 300 may include one or more other real-time sensors onboard and/or associated with one or more of the data-controlled robots 306, for example onboard video/image sensors, onboard LiDAR sensors, onboard location sensors, onboard range sensors, and/or the like embodied by a sub-component of any of the data-controlled robots 306. All real-time sensors within the environment 300—whether onboard or external to one or more data-controlled robots such as the data-controlled robots 306—are collectively referred to as "the Real-Time Sensors."

The Real-Time Sensors of the environment 300 provide real-time sensor data that may be processed for any of a myriad of purposes. In some embodiments, the real-time sensor data may be processed for monitoring and/or determining a status of the environment 300, scenarios occurring in the environment 300, a perception of the environment 300, and/or the like. In one example context, the real-time sensor data is transmitted from the Real-Time Sensors of the environment 300 to one or more of the data-controlled robots 306 for use in processing via one or more model(s) maintained by the data-controlled robots 306. For example, the data-controlled robots 306 may process the real-time sensor data received from the Real-Time Sensors via one or more specially configured model(s) that perform perception of the environment 300 and/or a particular portion thereof (e.g., the area around the particular data-controlled robot processing the data), initiate one or more process(es) for interacting with the environment 300, and/or the like.

It will be appreciated, as depicted and described herein, that the Real-Time Sensors include any of a myriad of sensor types, each sensor type capable of capturing a different type of sensor data. Non-limiting examples of such sensor types include real-time image sensors, real-time video sensors, real-time motion sensors, real-time range sensors, real-time LiDAR sensors, real-time location sensors, real-time RFID sensors, and/or the like. Each of these sensors may capture image data (e.g., still images, video frames, and/or the like), video data, motion data, range data, LiDAR data, location data, RFID data, and/or the like from within or otherwise associated with the environment 300. The various types of real-time sensor data provide context to aspects of the operations within the environment 300. Each of the Real-Time Sensors may transmit real-time sensor data to one or more computing devices (e.g., data-controlled robots, or in some contexts a real-time data central learning system) continuously, such that these computing devices receive a continuous set of sensor data that includes the sensor data from each of the Real-Time Sensor over time for further processing. In this regard, based at least in part on the continuously updated real-time sensor data, the data-controlled robots or other computing devices may perform real-time, up-to-date determinations and/or process(es) based on such data. For example, one or more data-controlled robots may receive one or more continuous streams of real-time sensor data, and process such real-time sensor data via one or more specially configured individual models to perform one or more determination(s) regarding the status, events, and/or aspects of the environment 300, generate results data utilizing such individual model(s) based at least in part on such real-time sensor data, and/or initiate process(es) for interacting with the environment 300 based at least in part on the real-time sensor data, or the like.

The plurality of real-time sensors may be positioned at various locations throughout the environment 300, including without limitation affixed either permanently or temporarily to static and/or non-moving objects in the environment 300, affixed to one or more of the data-controlled robots 306 in the environment 300, embodied onboard one or more of the data-controlled robots 306 in the environment 300, and/or the like. For example, as illustrated, the environment 300 includes a plurality of real-time video sensors 302A, 302B, and 302C affixed along the left wall in the depicted visualization of the environment 300, a plurality of real-time video sensors 302D and 302E together with a fixed real-time image sensor 312 affixed along the right wall in the depicted visualization. Additionally, the environment 300 includes a plurality of real-time motion sensors 308A and 308B affixed on large objects positioned in the environment 300, for example on side portions of large warehouse shelving units at locations where gaps in such shelving units are present. These fixed real-time sensors may remain in a known location and capture particular real-time sensor data representing a particular aspect of the environment 300 within a particular area monitored by the respective real-time sensor (s). In some embodiments, one or more of the fixed real-time sensors may pan, tilt, zoom, and/or otherwise rotate orientation and/or adjust the area(s) within the environment 300 monitored by the real-time sensor(s) without altering the location at which the real-time sensor is positioned. It will be appreciated that, in this regard, all of the Real-Time Sensors or a subset thereof that alone or in combination provide real-time sensor data embodying at least a portion of real-time data processable by data-controlled robots 306 and/or a real-time simulation processing system using one or more specially configured model(s), such as to generate results data, initiate process(es) for interacting within the environment 300, and/or the like.

FIG. 4 illustrates an example visualization of a simulated warehouse environment in an example context for environment simulation in accordance with at least some example embodiments of the present disclosure. Specifically, FIG. 4 depicts a simulated environment 400 that represents all aspects of the corresponding real-world environment represented by environment 300. In this regard, the simulated environment 400 includes simulated versions of all computing devices, objects, and/or the like in the corresponding real-world environment embodied by the environment 300. Specifically, the simulated environment 400 includes simulated versions of all objects in the environment 300, a plurality of simulated networking devices 404A-404J corresponding to the networking devices 304A-304J, a plurality of simulated data-controlled robot(s) 406A-406D corresponding to the data-controlled robots 306A-306D, a simulated human actor 410 corresponding to the human actor 310, and a simulated plurality of real-time sensors, for example simulated real-time video sensors 402A-402E corresponding to real-time video sensors 302A-302E, simulated real-time motion sensors 408A-408B corresponding to real-time motion sensors 308A-308B, and simulated real-time image sensor 412 corresponding to real-time image sensor 312.

In some embodiments, the simulated environment 400 is constructed based at least in part on real-time data received from the real-time sensors within the corresponding real-world environment, such as the environment 300. Alternatively or additionally, in some embodiments the simulated environment 400 includes one or more static object(s) at known locations within the corresponding real-world environment. For example, furniture and/or immovable object(s) may be represented in the simulated environment 400 at known locations. Alternatively or additionally, in some embodiments, the simulated environment 400 is embodied including and/or associated with map data that indicates paths along which entities may traverse, location of item(s) and/or position(s) within the environment, and/or the like. It will be appreciated that in some embodiments, a portion of the simulated environment 400 is statically defined whereas another portion of the simulated environment (e.g., locations of moving entities) is determined at least in part on real-time data received associated with the corresponding real-world environment.

Each of the simulated representations corresponding to the real-world environment may be configured in the same manner as the corresponding real-world representation. For example, in some embodiments, configuration data is received from and/or identified for one or more of the real-world entities, and utilized to configure the corresponding simulated representation in the simulated environment 400. Alternatively or additionally, in some embodiments, one or more of the simulated representations may be reconfigured to test alteration(s) to the real-world environment. For example, in some embodiments, one or more of the simulated data-controlled robots 406 may be reconfigured to utilize a new version or type of a trained model during simulated operation. In this regard, the simulated environment 400 may be run to determine the effects of such an alteration (e.g., improvements and/or detriments to the value associated with particular operational metrics). Alternatively or additionally, in some embodiments, one or more of the simulated representations of the plurality of Real-time sensors is reconfigured to determine the effects of such configuration changes. In this regard, it will be appreciated that any alterable configuration and/or change that may be performed in the real-world environment represented by the environment 300 may be simulated via the simulated environment 400.

Additionally or alternatively, in some embodiments, the simulated environment 400 is generated and/or altered to include elements not present in the corresponding real-world environment. For example, as illustrated, the simulated environment 400 includes additional simulated data-controlled robots 452A and 452B. Such additional simulated data-controlled robots may be utilized to simulate the effects of adding two new data-controlled robots in the real-world environment represented by environment 300 without having to do so in the real-world. Such a test may be performed before such action(s) are actually performed with respect to the real-world first.

In some embodiments, multiple instances of a simulated environment are maintained by a real-time simulation processing system. For example, in some embodiments, the real-time simulation processing system 102 maintains a first simulated environment that exactly represents the configuration of the corresponding real-world environment. For example, a real-time simulation processing system may store the simulated environment 400 with the additional simulated data-controlled robots 452A and 452B removed to accurately reflect the real-world environment represented by environment 300. Similarly, one or more instances of the simulated environment may be maintained to test various alteration(s) to the real-world environment, such as addition of new data-controlled robots as depicted with respect to the simulated environment 400. Alternatively or additionally, reconfiguration of one or more existing real-time sensor(s), reconfiguration of one or more data-controlled robot(s), and/or the other alteration(s) may be tested via an instance of a simulated environment.

In some embodiments, a real-time simulation processing system maintains and utilizes the one or more simulated environments for various purposes. For example, in some embodiments, the real-time simulation processing system runs each instance of the simulated environment(s) and determines, stores, and/or tracks simulated data produced during simulated operation of each. In this regard, the real-time simulation processing system may determine how each simulated environment is performing with respect to one or more operational metrics, whether alteration(s) are determined effective at improving operations of the real-world environment, and/or the like. Additionally or alternatively, a simulated environment reflecting the exact configuration of a corresponding real-world environment may be maintained and/or utilized for visualizing at least portion(s) of said real-world environment, data associated with process(es) performed therein, operational metric value(s) for operation in the real-world environment, and/or the like. For example, as illustrated, the simulated environment 400 may be utilized to determine simulated operational metric value(s) for particular operational metrics to determine whether such operational metrics improve with addition of the two new simulated data-controlled robots 452A and 452B.

In some embodiments, a real-time simulation processing system is configurable to switch between one or more modes, each mode associated with a different instance of a simulated environment. For example, in some embodiments, the real-time simulation processing system may be set to a first mode to provide data and/or visualizations associated with a simulated environment that accurately reflects aspects of the corresponding real-world environment. Alternatively or additionally, the real-time simulation processing system may be set to a second mode that provides data and/or visualization associated with simulated operation of another instance of a simulated environment that is reconfigured in one or more aspects from the corresponding real-world environment. In some embodiments, the real-time simulation processing system may maintain various instances of a simulated environment, each reconfigured in a different manner from the corresponding real-world environment to perform multiple tests of alteration(s) at once.

It will be appreciated that the particular alterations depicted in FIG. 4 are provided as example alterations, and in other embodiments simulated environments may be generated with any of a myriad of other alterations. In some embodiments, for example, a simulated environment includes identical data-controlled robots and/or sensors as a real-world environment, but includes different items for interaction by simulated entities within the simulated environment. In this regard, the simulated environment may be run to determine how such entities interact with such other items. Alternatively or additionally, in some embodiments a simulated environment includes the same number of data-controlled robots and/or sensors as a real-world environment, but alters the configuration of one or more of the data-controlled robots. Alternatively or additionally still, in some embodiments, a simulated environment includes one or more new types of data-controlled robots (e.g., data-controlled robots with different specialized hardware for interacting with the real-world environment) that differ from the corresponding real-world environment. Alternatively or additionally, in some embodiments, a simulated environment is embodied as a different layout as the corresponding real-world environment. In this regard, embodiments may generate and maintain any number of simulated environments that each test any of a myriad of different alteration(s) from the real-world.

Example Data Flows of the Disclosure

Having described example systems and apparatuses in accordance with the present disclosure, example visualizations of the data flows between such systems, devices, and/or apparatuses of the present disclosure will now be discussed. The depicted data flow(s) represent specific example data flows for aggregating and processing real-time sensor data transmitted over a high-throughput communications network (e.g., a continuous set of sensor data) and associated with a particular environment. It will be appreciated that, in other embodiments, such data flows may differ without deviating from the scope and spirit of this disclosure. For example, in some embodiments, other types of sensor data may be received and/or processed. Additionally or alternatively, in some embodiments, the generated output data types may differ based on the same and/or different input data. In this regard, the specific data flow(s) depicted herein should not limit the scope or spirit of this disclosure.

FIG. 5 illustrates an example data flow for updating a trained model in accordance with at least some example embodiments of the present disclosure. Specifically, FIG. 5 illustrates processing of real-time data 502 by the real-time simulation processing system 102 to generate an updated trained model 508. In some embodiments, the real-time simulation processing system 102 maintains a data repository 504 that stores a currently implemented version of the trained model 506. In this regard, the trained model 506 may represent a version of a model that is currently applied to and/or in use by one or more computing device(s), such as data-controlled robot(s), real-time sensor(s), and/or the like.

The real-time data 502 may be collected and/or received from any of a number of computing devices associated with a particular real-world environment. For example, in some embodiments, the real-time data 502 embodies a real-time data set that includes at least real-time sensor data from one or more real-time sensors in or associated with the real-world environment. Additionally or alternatively, in some embodiments, the real-time data 502 includes operational metric values for operational metrics associated with the real-world environment. Additionally or alternatively still, in some embodiments, the real-time data 502 may include configuration data, status data, and/or other information associated with configuration and/or operation of one or more elements within a real-world environment. In some embodiments, the real-time simulation processing system 102 stores some or all of the real-time data 502 in one or more data repositories, such as the data repository 504.

The real-time data 502 may be received over a high-throughput communications network. In this regard, the real-time data 502 may represent continuous and/or real-time communication of data representing aspects of the real-world environment. In this regard, the real-time data 502 may be used for real-time training and/or to maintain at least one instance of a simulated environment that accurately represents all aspects of the corresponding real-world environment.

The real-time simulation processing system 102 may retrieve the trained model 506 for updating, such as from the data repository 504. In some embodiments, the real-time simulation processing system 102 further trains the trained model 506 to generate the updated trained model 508. In this regard, the updated trained model 508 may include data trends, patterns, and/or the like, learned from the real-time data 502. It will be appreciated that, in some embodiments, any of a myriad of other known model training methodologies may be utilized to trained the updated trained model 508.

In some embodiments, the real-time simulation processing system 102 stores the updated trained model 508. In some embodiments, the updated trained model 508 replaces the stored version of the trained model 506. Alternatively or additionally, in some embodiments, the real-time simulation processing system 102 stores the updated trained model 508 together with the trained model 506. For example, the real-time simulation processing system 102 may stores the currently implemented version of trained model 506 and the updated version represented by the updated trained model 508 separately. In some embodiments, the real-time simulation processing system 102 continues to store the versions of the model separately until the updated trained model 508 is deployed to a real-world environment, such as when the accuracy data between the updated trained model 508 and the trained model 506 satisfies an improvement threshold and/or when simulated data associated with simulated operation utilizing the updated trained model satisfies an improvement threshold as described herein. It will be appreciated that, in this regard, the real-time simulation processing system 102 may store and/or maintain any number of versions of a particular trained model.

FIG. 6 illustrates an example data flow for trained model validation via simulation for deployment in accordance with at least some example embodiments of the present disclosure. As illustrated, in some embodiments, the real-time simulation processing system 102 determines and/or generates accuracy data corresponding to each version of a trained model. For example, the real-time simulation processing system 102 may determine updated accuracy data associated with the updated trained model 508 (e.g., represented by the accuracy data 602) and previous accuracy data associated with the currently implemented version of the trained model 506. In some embodiments, one or more of the portions of accuracy data 604 and/or 602 are stored, for example in the data repository 504. Such stored accuracy data may have been previously determined, for example at the time of training the corresponding version of the trained model. Alternatively or additionally, in some embodiments the real-time simulation processing system 102 determines the accuracy data for one or more versions of the trained model in real-time (e.g., by executing one or more test cases that determine such accuracy data).

Optionally, in some embodiments, the real-time simulation processing system 102 determines whether the accuracy data 602 and accuracy data 604 satisfy an improvement threshold. For example, the improvement threshold may embody a minimum improvement in accuracy between model versions that must be attained before a new version of the trained model is deployed and/or tested via simulation. In some embodiments, for example, a 1% improvement in accuracy is embodied by an improvement threshold. The real-time simulation processing system 102 may determine a difference between the accuracy data 604 representing the previous accuracy data for the currently implemented version of the trained model 506 with the accuracy data 602 representing the updated accuracy data for the updated version embodied by updated trained model 508. In some such embodiments, the real-time simulation processing system compares the difference between accuracy data 604 and accuracy data 602 to determine whether the improvement threshold is satisfied. In some embodiments, in circumstances where the improvement threshold is satisfied at optional decision 606, the real-time simulation processing system 102 continues to test and/or deploy the model(s) for use. In some embodiments, this improvement threshold embodies a first improvement threshold with respect to improvement in the accuracy of the updated trained model, before use of a second improvement threshold with respect to improvement in the value of an operational metric upon implementation of the updated trained model.

It will be appreciated that a data model may perform more accurately with respect to test cases, but may not increase operational metric values when actually implemented for use. Accordingly, in some embodiments, one or more versions of trained model(s) may be compared based on results from simulated and/or live testing in a real-world environment. For example, in some embodiments, the real-time simulation processing system 102 receives and/or otherwise identifies real-time operational metric values for one or more operational metrics based on operation of a real-world environment. The real-world environment may utilize a currently implemented version of the trained model 506, for example to control one or more data-controlled robots in the real-world environment. The real-time simulation processing system 102 may apply the updated trained model 508 to one or more computing devices in a simulated environment, for example to alter functionality of one or more simulated data-controlled robots corresponding to the data-controlled robots in the real-world environment that utilize the trained model 506. In this regard, the simulated environment may be run to generated simulated data that embodies simulated operational metric values for the same operational metrics. Such simulated operational metric values may be compared with the real-time operational metric values determined via operation of the real-world environment to determine comparison results 608 indicating which operational metric values represented preferred and/or improved values. In other words, the real-time simulation processing system 102 may compare the simulated operational metric values with corresponding real-time operational metric values to determine whether the reconfiguration in the manner represented by the simulated environment is determined to be an alteration that positively affects operations performed therein, as defined by particular operational metrics. In some embodiments, the comparison results 608 indicate whether the simulated environment generated simulated operational metric values that satisfy a second improvement threshold based at least in part on corresponding real-time operational metric values for the same operational metrics (e.g., a 2% improvement in simulated operational metric value, and/or the like). In some such embodiments, the updated trained model 508 is determined as a sufficient improvement in circumstances where use of the updated trained model 508 results in improvement to an operational metric value for a particular operational metric that satisfies a corresponding improvement threshold.

In some embodiments, the real-time simulation processing system 102 sets a preferred model at decision 610 based on the comparison results 608. The preferred model may represent the version of the trained model that yielded preferable (e.g., improved) operational metric values as compared to utilization of the other model. For example, in circumstances where the updated trained model 508 is applied to a simulated environment and the comparison results 608 indicate simulated operation of the simulated environment yielded an improvement in one or more operational metric values corresponding to particular operational metrics, the updated trained model 508 may be set as a preferred model. Alternatively, in circumstances where the updated trained model is applied to a simulated environment and the comparison results 608 indicate simulated operation of the simulated environment did not perform as well as the real-world operation utilizing the currently implemented version of the trained model 506, the currently implemented version of the trained model 506 may be set as a preferred model. In this regard, the real-time simulation processing system 102 may apply the preferred model to one or more computing devices in the real-world environment, such that the real-world environment is utilizes the preferred model for performing operations therein. In this regard, the updated trained model 508 may replace the currently implemented version of the trained model 506 once the test of said updated trained model 508 via a simulated environment indicates that use of the updated trained model 508 will result in sufficient improvement in one or more operational metrics.

It will be appreciated that, in some embodiments, the real-time simulation processing system 102 does not perform the training of one or more data model(s). In some embodiments, the real-time simulation processing system 102 receives trained model(s) and/or versions thereof from another system that performs the training and routes the trained model to the real-time simulation processing system 102 for processing. In some such embodiments, the real-time simulation processing system 102 may conserve the computing resources that would otherwise be expended to perform such training.

FIG. 7 illustrates an example data flow for simulated environment updating in accordance with at least some example embodiments of the present disclosure. In some embodiments, the real-time simulation processing system 102 stores and/or generates one or more instances of a simulated environment for use, for example the simulated environment 702. In some embodiments, the simulated environment 702 accurately represents aspects of a corresponding real-world environment. Alternatively or additionally, in some embodiments, the simulated environment 702 includes alteration(s) from the corresponding real-world environment. For example, the simulated environment 702 may include one or more additional and/or removed element(s), reconfigured computing device(s), different trained model(s) applied to data-controlled robot(s), and/or the like.

In some embodiments, the real-time simulation processing system 102 may generate the updated simulated environment 704 based at least in part on the set of real-time data 502. In this regard, the updated simulated environment 704 may represent updated configuration(s), location(s), and/or other determinable aspects of elements in a corresponding real-world environment. In some embodiments, the real-time data 502 is continuously and/or in real-time received over a high-throughput communications network. The high-throughput communications network may enable a continuous and/or real-time stream of the real-time data 502. In this regard, the updated simulated environment 704 may remain up-to-date as the corresponding real-time environment continues to operate. By utilizing the updated simulated environment 704, visualizations may be generated that accurately represent current, real-time aspects of the corresponding real-world environment. Additionally or alternatively, the updated simulated environment 704 may further be altered in one or more aspects to test alteration(s), and more accurately simulate how such alteration(s) are likely to effect the corresponding the effects of operations of the corresponding real-world environment should such alteration(s) be implemented therein.

In some embodiments, the real-time simulation processing system 102 stores the updated simulated environment 704 as it is generated. In some embodiments, the real-time simulation processing system 102 separately maintains an instance of the updated simulated environment 704 that represents the current aspects of the corresponding real-world environment. Additionally or alternatively, the real-time simulation processing system 102 may maintain any number of additional instances of the updated simulated environment 704 that are reconfigured and/or otherwise changed to test one or more particular alteration(s) from the real-world environment. It will be appreciated that the real-time simulation processing system 102 may maintain and/or run simulated operation of each stored updated simulated environment 704 for testing the alteration(s) represented in each instance.

FIG. 8 illustrates an example data flow for applying a trained model to at least a portion of a simulated environment in accordance with at least some example embodiments of the present disclosure. In some embodiments, one or more trained model(s) 802 are applied to alter the updated simulated environment 704 and test the results of such alteration(s). The real-time simulation processing system 102 may generate a new instance of the updated simulated environment 704 for testing, thus branching off from another version of the updated simulated environment that represents the current aspects of the corresponding real-world environment. In this regard, the trained model(s) 802 may be applied to one or more simulated computing device(s) of the updated simulated environment 704 to alter configuration of such computing devices. For example, in some embodiments the real-time simulation processing system 102 applies one or more of the trained model(s) 802 to simulated data-controlled robots within the updated simulated environment 704 to cause the simulated data-controlled robots to utilize the trained model(s) during simulated operation of the updated simulated environment 704.

The real-time simulation processing system 102 may generate simulated data 804 utilizing the updated simulated environment 704. In some embodiments, the simulated data 804 is generated by running simulated operation of the updated simulated environment 704. In this regard, the elements within the updated simulated environment 704 may interact in a simulated manner, similar to the interactions performed in the corresponding real-world environment, and based at least in part on the alteration(s) applied to the updated simulated environment 704 (e.g., use of one or more of the trained model(s) 802). The simulated data 804 may include one or more data portions. For example, in some embodiments, the simulated data 804 includes simulated operational metric values corresponding to one or more operational metrics. The simulated operational metric values may be determined and/or generated by the real-time simulation processing system 102 based on the simulated operation of the updated simulated environment 704. Alternatively or additionally, in some embodiments, the simulated data 804 includes simulated real-time data, such as simulated real-time sensor data produced by the simulated real-time sensors in the updated simulated environment 704, and/or the like. Alternatively or additionally, in some embodiments the simulated data 804 includes simulated error data object(s) detected and/or generated during simulated operation of the updated simulated environment 704. In this regard, the simulated data 804 may include simulated version(s) of any data generated, captured, and/or otherwise derived during operation of the corresponding real-world environment.

In some embodiments, multiple trained models of the trained model(s) 802 are tested at once. In this regard, the real-time simulation processing system 102 may generate multiple instances of the updated simulated environment 704 and alter each instance based on one of the trained model(s) 802. For example, in some embodiments a first instance of the updated simulated environment 704 is generated that includes a first trained model of the trained model(s) 802 applied to each simulated data-controlled robot in the first instance, a second instance of the updated simulated environment 704 is generated that includes a second trained model of the trained model(s) 802 applied to each simulated data-controlled robot in the second instance, and so on. As such, each instance of the updated simulated environment 704 may be independently simulated and resulting simulated data 804 generated for each instance. The various instances of the updated simulated environment 704 may be compared to determine which instances performed best with respect to one or more operational metrics, minimized error data object(s), and/or the like. It will be appreciated that instances of the updated simulated environment 704 that include one or more alteration(s) may similarly be visualized, as described herein.

In some embodiments, one or more instances of an updated simulated environment are utilized to determine which trained model(s) to apply for use in a corresponding real-world environment, and/or when to apply a trained model for use in a corresponding real-world environment. FIG. 9 illustrates an example data flow for deploying an updated trained model to data-controlled robots in a real-world environment in accordance with at least some example embodiments of the present disclosure. Specifically, FIG. 9 illustrates a plurality of data-controlled robots 904A-904D (collectively "data-controlled robots 904"). Each data controlled robot may maintain one or more individual model(s) utilized for interacting within a real-world environment. For example, a data controlled robot may maintain a perception data model, a movement data model, a task performing data model, and/or the like, that control and/or influence operation of the data-controlled model for interacting with the environment.

In some embodiments, the real-time simulation processing system 102 applies one or more model(s) to one or more of the data-controlled robots 904 for use. In this regard, the real-time simulation processing system 102 may apply a trained model to a data-controlled robot by transmitting the trained model to the data-controlled robot over one or more communications networks, causing the data-controlled robot to replace a currently implemented version of the model (if any) with the newly received updated version of the trained model. The data-controlled robot may thus store the updated trained model for further use until another updated version of the trained model is received from the real-time simulation processing system 102.

As illustrated, for example, the real-time simulation processing system 102 transmits the updated trained model 902 to each of the data-controlled robots 904 for use over a communications network 910. In some embodiments, the communications network 910 embodies a high-throughput communications network, such as the high-throughput communications network 108 as depicted and described with respect to FIG. 1. In other embodiments, the communications network embodies a lower-throughput communications network, such as a 4G, LTE, Wi-Fi 5, or other communications network that facilitates a lower-bandwidth communication. In some such embodiments, the lower-bandwidth may be sufficient due to inconsistent transmission of the updated trained model 902 to the data-controlled robots 904, thus allowing the transmission of updated trained model 902 without requiring additional and/or alternative hardware embodying a high-throughput communications network, or enabling such communication over legacy, existing network implementations.

In some embodiments, the real-time simulation processing system 102 transmits the updated trained model 902 to the data-controlled robots at particular time interval(s). For example, the real-time simulation processing system 102 may transmit the updated trained model 902 weekly, daily, or at any other defined timestamp interval. Additionally or alternatively, in some embodiments, the real-time simulation processing system 102 transmits the updated trained model 902 in circumstances where particular conditions are determined by the real-time simulation processing system 102 to be met. For example, in some embodiments, the real-time simulation processing system 102 determines whether accuracy data associated with the updated trained model 902 sufficiently satisfies an improvement threshold as compared to a currently implemented version of the trained model already utilized by the data-controlled robots 904. In circumstances where the improvement threshold is not met (e.g., the updated trained model 902 is not associated with updated accuracy data that is a sufficient improvement over previous accuracy data for a currently implemented version), the updated trained model 902 may not be transmitted and the real-time simulation processing system 102 may continue to update the updated trained model 902. Additionally or alternatively, for example in some embodiments, the real-time simulation processing system determines whether simulated data generated via a simulated environment that utilizes the updated trained model 902 sufficiently satisfies a different improvement threshold as compared to data generated during operation of the corresponding real-world environment that utilizes a currently implemented version of the model. In circumstances where the second improvement threshold is not met (e.g., the updated trained model 902 is applied to an updated simulated environment, but the resulting simulated data does not include simulated operational metric values that is/are a sufficient improvement over real-time operational metric values for the same operational metrics determined from operation of the real-world environment), the updated trained model 902 again may not be transmitted and the real-time simulation processing system 102 may continue to update the updated trained model 902. In some embodiments where such circumstances are satisfied (e.g., the updated trained model 902 is determined to have sufficiently increased accuracy data, and is tested via a simulated environment and results in sufficient improved simulated operational metric values, for example), the real-time real-time simulation processing system 102 may apply the updated trained model 902 to the data-controlled robots 904 associated with the real-world environment.

It will be appreciated that each data-controlled robot may maintain and/or utilize its own instance of a trained model. For example, the data-controlled robot 904A may receive the updated trained model 902 and store a corresponding instance of the updated trained model 906A. Similarly, the data-controlled robot 904B may receive the updated trained model 902 and store a corresponding instance of the updated trained model 906B. Similarly still, the data-controlled robot 904C and 904D each receive the updated trained model 902, and store the corresponding instances of the updated trained model 906C and 906D respectively. In this regard, each data-controlled robot may utilize its individually maintained instance/version of the updated trained model for interacting with the real-world environment. Additionally or alternatively, in some embodiments, each data-controlled robot may be updated independently and/or learn independently. For example, in some embodiments, each of the data-controlled robots 904 utilizes its corresponding instance of the updated trained model 906A-906D to interact with the real-world environment, and learns as such operations fail and/or otherwise produce error data object(s). As such, each instance of the updated trained model 906A-906D may diverge as the individual instances learn from different error data object(s) based on the interactions of the corresponding data-controlled robots 904.

In some such embodiments, the real-time simulation processing system 102 may determine which data-controlled robots to apply the updated trained model 902 to on an individual basis. For example, in some embodiments, the real-time simulation processing system 102 aggregates individual accuracy data for each individual instance of the updated trained model 906A-906D maintained by each of the data-controlled robots 904. In this regard, once the real-time simulation processing system 102 generates a newly updated trained model, the real-time simulation processing system 102 may apply the updated trained model 902 only to the data-controlled robots maintaining instances of the trained model associated with accuracy data that, when compared to the updated trained model 902 to be applied, indicates sufficient improvement in accuracy to satisfy one or more applicable improvement threshold(s).

Example Processes of the Disclosure

Having described example systems, apparatuses, environments, data flows in accordance with the present disclosure, example processes in accordance with the present disclosure will now be discussed. It will be appreciated that each of the flowcharts depicts an example computer-implemented process that may performed by one or more of the apparatuses, systems, devices, and/or computer program products described herein, for example using one or more of the specially configured components thereof. The blocks depicted indicate operations of each process. Such operations may be in any of a number of ways, including, without limitation, in the order and manner as depicted and described herein. In some embodiments, one or more blocks of any of the processes described herein occur in-between one or more blocks of another process, before one or more blocks of another process, in parallel with one or more blocks of another process, and/or as a sub-process of a second process. Additionally or alternatively, any of the processes may include some or all operational steps described and/or depicted, including one or more optional blocks in some embodiments. With regard to the flowcharts illustrated herein, one or more of the depicted blocks may be optional in some, or all, embodiments of the disclosure. Optional blocks are depicted with broken (or "dashed") lines. Similarly, it should be appreciated that one or more of the operations of each flowchart may be combinable, replaceable, and/or otherwise altered as described herein.

FIG. 10 illustrates a flowchart depicting example operations of an example process for generating and utilizing a simulated environment in accordance with at least some example embodiments of the present disclosure. Specifically, FIG. 10 illustrates operations of an example process 1000. In some embodiments, the example process 1000 is embodied by computer program code stored on a non-transitory computer-readable storage medium of a computer program product configured for execution to perform the process as depicted and described. Alternatively or additionally, in some embodiments, the process 1000 is performed by one or more specially configured computing devices, such as the real-time simulation apparatus 200 alone or in communication with one or more other component(s), device(s), system(s), and/or the like. In this regard, in some such embodiments, the real-time simulation apparatus 200 is specially configured by computer-coded instructions (e.g., computer program instructions) stored thereon, for example in the memory 204 and/or another component depicted and/or described herein and/or otherwise accessible to the real-time simulation apparatus 200, for performing the operations as depicted and described. In some embodiments, the real-time simulation apparatus 200 is in communication with one or more external apparatus(es), system(s), device(s), and/or the like, to perform one or more of the operations as depicted and described. For example, the real-time simulation apparatus 200 may be in communication with any number of real-time sensor(s), data-controlled robots, other computing device(s), and/or the like. For purposes of simplifying the description, the process 1000 is described as performed by and from the perspective of an real-time simulation apparatus 200, for example embodying a real-time simulation processing system 102 monitoring a particular real-world environment.

The process 1000 begins at operation 1002. At operation 1002, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to receive, via a high-throughput communications network, a real-time data set associated with a real-world environment. The real-time data set may be received from any number of computing device(s), such as one or more external real-time sensor(s), system(s) that monitor operation(s) of the real-world environment, and/or the like. In this regard, the real-time data set may include any number of data portions, each data portion including the same data types and/or different data types. For example, the real-time data set may include real-time sensor data, operational metric value(s) corresponding to operational metric(s) associated with operation of the real-world environment, and/or the like. Utilizing the high-throughput communications network, the real-time simulation apparatus 200 may continuous and/or in real-time receive such real-time data of the real-time data set as it is captured, generated, and/or derived.

At optional operation 1004, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to store the real-time data set in at least one data repository. The stored real-time data may be used for any of a myriad of purposes. For example, in some embodiments, the real-time simulation apparatus 200 retrieves the stored real-time data set at a later point in time to re-train a model based at least in part on the stored real-time data. Additionally or alternatively, the real-time simulation apparatus 200 may retrieve the stored real-time data set for use in testing alteration(s) via one or more simulated environment(s) as described herein.

At optional operation 1006, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to derive at least one operational metric value corresponding to at least one operational metric. The operational metric(s) may represent various operation(s) of the real-world environment with which the real-time data set is associated. The at least one operational metric value may be derived based at least in part on at least a portion of the real-time data set. In some embodiments, the at least one operational metric value may be derived based at least in part on real-time sensor data of the real-time data set. For example, the real-time data may be processed to determine completion of certain task operation(s), determination of particular operations completed, and/or the like.

At optional operation 1008, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to update at least one trained model. In some embodiments, the at least one trained model is updated based at least in part on the real-time data set received by the real-time simulation apparatus 200. For example, the trained model may be updated based on a particular goal metric, such that the trained model is updated to learn from execution of the trained model utilizing the real-time data set. In this regard, the trained model may be updated to improve accuracy data representing the likelihood that the trained model generates accurate data and/or does not produce an error data object from processing the real-time data set. The trained model may learn from data pattern(s), trend(s), relationship(s), and/or the like represented in the real-time data set. In some embodiments, a trained model is updated for perception of an environment, execution of one or more interaction(s) with an environment, configuration of one or more computing device(s), and/or the like.

At operation 1010, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to generate an updated simulated environment based at least in part on the real-time data set associated with the real-world environment. In some embodiments, the real-time simulation apparatus 200 generates an updated simulated environment that accurately reflects location(s), configuration(s), and/or the like, of entities, computing device(s), and/or the like within the real-world environment. For example, the simulated environment may be updated to accurately reflect, based at least in part on the real-time data set, the location of each data-controlled robot in the real-world environment, the status of each entity in the real-world environment (e.g., a state of a finite set of states, a step in a process being performed, and/or the like), configurations of computing device(s) in the real-world environment, operational metric value(s) for operational metrics associated with operation in the real-world environment, and/or the like. In this regard, the updated simulated environment may accurately represent each element of the corresponding real-world environment.

At operation 1012, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to initiate at least one process based at least in part on the updated simulated environment. In some embodiments, the real-time simulation apparatus 200 initiates one or more process(es) for visualizing at least a portion of the updated simulated environment. Additionally or alternatively, in some embodiments, the real-time simulation apparatus 200 initiates one or more process(es) for applying a trained model to the updated simulated environment and/or running an updated simulated environment. In some embodiments, additionally or alternatively, the real-time simulation apparatus 200 initiates one or more process(es) for testing one or more alteration(s) via the updated simulated environment. Additionally or alternatively, in some embodiments, the real-time simulation apparatus 200 automatically causes alteration of one or more aspect(s) of the real-world environment based at least in part on simulated data generated from running an updated simulation environment.

In some embodiments, the process 1000 ends upon completion of the operation 1012. Alternatively or additionally, in some embodiments, the process 1000 repeats any number of times. In this regard, in some such embodiments, the real-time simulation apparatus 200 may continuously maintain an updated simulated environment for visualization, run simulated environment(s) configured based on various alteration(s), and/or the like, to enable continuous real-time visualization and/or testing of such alteration(s) for deploying alteration(s) in the real-world environment in circumstances where such alteration(s) result in improvement of operations in the real-world environment.

FIG. 11 illustrates a flowchart depicting example operations of an example process for rendering user interface(s) associated with a simulated environment in accordance with at least some example embodiments of the present disclosure. Specifically, FIG. 11 depicts operations of an example process 1100. In some embodiments, the process 1100 is embodied by computer program code stored on a non-transitory computer-readable storage medium of a computer program product configured for execution to perform the process as depicted and described. Alternatively or additionally, in some embodiments, the process 1100 is performed by one or more specially configured computing devices, such as the real-time simulation apparatus 200. Such computing devices may perform the operations of the described processes alone or in communication with one or more other component(s), device(s), system(s), and/or the like. In this regard, in some such embodiments, the computing device(s) is/are specially configured by computer-coded instructions (e.g., computer program instructions) stored thereon, for example in a memory and/or another component depicted and/or described herein and/or otherwise accessible to the computing device(s), for performing the operations as depicted and described. In some embodiments, the computing device(s) is/are in communication with one or more external apparatus(es), system(s), device(s), and/or the like, to perform one or more of the operations as depicted and described. For example, in one example context, the real-time simulation apparatus 200 is in communication with one or more real-time sensors, data-controlled robot(s), and/or the like. For purposes of simplifying the description, the process 1100 is described as performed by and from the perspective of the real-time simulation apparatus 200.

The process 1100 begins at operation 1102 or 1104, in some embodiments. In some embodiments, the process 1100 begins after one or more operations depicted and/or described with respect to any of the other processes described herein. For example, in some embodiments as depicted, the process 1100 begins after execution of operation 1010. In this regard, some or all of the process 1100 may replace or supplement one or more blocks depicted and/or described with respect to any of the other processes described herein. Upon completion of the process 1100, the flow of operations may terminate. Additionally or alternatively, in some embodiments, upon completion of the process 1100, flow may return to one or more operations of another process, for example operation 1012. In some embodiments, the process 1100 restarts upon completion. It should be appreciated that, in some embodiments, the process 1100 embodies a subprocess of one or more other process(es), such as the process 1000.

At operation 1102, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to cause rendering of a user interface representing at least a portion of the updated simulated environment. In some embodiments, the user interface is rendered via a display of a client device communicable with the real-time simulation apparatus 200. The user interface may include a native application interface, a web interface, and/or the like. In some embodiments, the user interface is rendered as an augmented reality interface including representations of real-world elements and augmented reality elements representing virtual elements (e.g., of a simulated environment). In this regard, the user interface may depict the various data object(s) embodying virtual representation(s) of the elements within the corresponding real-world environment.

In some embodiments, the flow ends after operation 1102. In other embodiments, flow proceeds to operation 1104. In some embodiments, for example, the flow continues in embodiments where a dashboard interface is rendered in addition to, as part of, and/or otherwise in conjunction with the user interface described with respect to operation 1102.

At operation 1104, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to identify at least one real-time operational metric value associated with the updated simulated environment. The real-time operational metric value may embody a simulated operational metric determined from simulated operation of the updated simulated environment. For example, the real-time simulation apparatus 200 may run an updated simulated environment to identify the at least one real-time operational metric value corresponding to at least one operational metric based at least in part on simulated operation of the updated simulated environment. Each real-time operational metric may represent an aspect of how the updated simulated environment performs as configured. Non-limiting example real-time operational metric value(s) include real-time values corresponding to operational metric(s) for item movement per time interval, completed task operation(s) per time interval, derived metrics defined by one or more algorithm(s), and/or the like.

At operation 1106, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to retrieve at least one historical operational metric value associated with the real-world environment. The at least one historical operational metric value and the at least one real-time operational metric value may correspond to the same operational metric. In this regard, the real-time operational metric value embodying a simulated operational value associated with the particular operational metric may be contrasted with the historical operational value corresponding to current configuration(s), aspect(s), and operation of the real-world environment as-is.

At operation 1108, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to cause rendering of a dashboard interface. The dashboard interface may include interface element(s) indicating at least the real-time operational metric value associated with the updated simulated environment, and the at least one historical metric value associated with the real-world environment. In this regard, the dashboard interface may depict the differences in operation between the updated simulated environment and the real-world environment. In some embodiments, as the updated simulated environment is further updated and/or changed, the dashboard interface may be dynamically updated to reflect the simulated operational metric value(s) determined from the simulated operation of the updated simulation environment.

In some embodiments, a dashboard interface includes one or more interface element(s) depicting trend(s) for operational metric values. The trends may indicate changes over time in the operational metric value(s) corresponding to operational metric(s). Such trends may be depicted for real-time operational metric values corresponding to operational metrics for operation of a real-world environment (e.g., derived from real-time data aggregated from the real-world environment), simulated trends from simulated operation of one or more updated simulated environment including one or more alteration(s) from the real-time environment, and/or the like.

FIG. 12 illustrates a flowchart depicting example operations for applying a trained model to a simulated environment in accordance with at least some example embodiments of the present disclosure. Specifically, FIG. 12 depicts operations of an example process 1200. In some embodiments, the process 1200 is embodied by computer program code stored on a non-transitory computer-readable storage medium of a computer program product configured for execution to perform the process as depicted and described. Alternatively or additionally, in some embodiments, the process 1200 is performed by one or more specially configured computing devices, such as the real-time simulation apparatus 200. Such computing devices may perform the operations of the described processes alone or in communication with one or more other component(s), device(s), system(s), and/or the like. In this regard, in some such embodiments, the computing device(s) is/are specially configured by computer-coded instructions (e.g., computer program instructions) stored thereon, for example in a memory and/or another component depicted and/or described herein and/or otherwise accessible to the computing device(s), for performing the operations as depicted and described. In some embodiments, the computing device(s) is/are in communication with one or more external apparatus(es), system(s), device(s), and/or the like, to perform one or more of the operations as depicted and described. For example, in one example context, the real-time simulation apparatus 200 is in communication with one or more real-time sensors, data-controlled robot(s), and/or the like. For purposes of simplifying the description, the process 1200 is described as performed by and from the perspective of the real-time simulation apparatus 200.

The process 1200 begins at operation 1202. In some embodiments, the process 1200 begins after one or more operations depicted and/or described with respect to any of the other processes described herein. For example, in some embodiments as depicted, the process 1200 begins after execution of operation 1010. In this regard, some or all of the process 1200 may replace or supplement one or more blocks depicted and/or described with respect to any of the other processes described herein. Upon completion of the process 1200, the flow of operations may terminate. Additionally or alternatively, in some embodiments, upon completion of the process 1200, flow may return to one or more operations of another process, for example operation 1012. In some embodiments, the process 1200 restarts upon completion. It should be appreciated that, in some embodiments, the process 1200 embodies a subprocess of one or more other process(es), such as the process 1000.

At optional operation 1202, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to identify updated accuracy data associated with an updated version of a trained model and previous accuracy data associated with an implemented version of the trained model. In some embodiments, the updated version of the trained model embodies a version of the trained model updated based on recently received real-time data. The implemented version of the trained model may embody a version of the trained model that is currently applied to configure one or more computing device(s) in the corresponding real-world environment. In this regard, the updated accuracy data may represent how accurate the updated version of the trained model functions with respect to a particular goal metric and/or function. Similarly, the previous accuracy data may represent how accurate the implemented version of the trained model functions with respect to the particular goal metric and/or function. In some embodiments, the updated accuracy data and/or the previous accuracy data is retrieved from one or more data repositories, such as in circumstances where such accuracy data was previously determined. Additionally or alternatively, in some embodiments, the updated accuracy data and/or the previous accuracy data is identified by generating such accuracy data utilizing one or more test algorithm(s) and/or data set(s).

At operation 1204, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to determine whether an improvement threshold is satisfied. The improvement threshold may be tested based at least in part on the updated accuracy data and the previous accuracy data. In some embodiments, for example, the real-time simulation apparatus 200 maintains and/or otherwise identifies the improvement threshold and utilizes the improvement threshold to determine whether the difference between the updated accuracy data and the previous accuracy data is sufficient to satisfy the improvement threshold. For example, in some embodiments, the real-time simulation apparatus 200 compares the difference between the updated accuracy data and the previous accuracy data to determine whether the updated version of the trained model performs sufficient improved as compared to the previous version (e.g., by exceeding the improvement threshold). In one example context, the improvement threshold embodies a percentage increase indicated as sufficient to warrant utilizing the updated version of the trained model to test one or more alteration(s) via the updated simulation environment.

In some embodiments, in circumstances where the real-time simulation apparatus 200 at operation 1204 determines the improvement threshold is not satisfied, the flow may continue to operation 1210. Alternatively, in some embodiments, the flow may end in circumstances where the real-time simulation apparatus 200 determines the improvement threshold is not satisfied. In some embodiments, in circumstances where the real-time simulation apparatus 200 at operation 1204 determines the improvement threshold is satisfied, the flow may continue to operation 1206.

At optional operation 1206, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to store the updated version of the trained model for applying. The real-time simulation apparatus 200 may store the updated version in one or more data repositories and/or as a local data property for use in applying the updated version of the trained model to an updated simulated environment to alter one or more aspects of the updated simulated environment for testing, and/or for applying to one or more elements of a real-world environment (e.g., to alter one or more configurations of a computing device in the real-world environment).

At operation 1208, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to apply a trained model to at least a portion of the updated simulated environment. In some embodiments, the real-time simulation apparatus 200 applies a version of the trained model that is stored by the real-time simulation apparatus 200. For example, the real-time simulation apparatus 200 may apply the updated version of the trained model that is stored at operation 1206. In some embodiments, the real-time simulation apparatus 200 applies the trained model to one or more simulated computing device(s) of the updated simulated environment to alter a configuration of the simulated computing device. For example, a version of the trained model may be applied to a simulated computing device to enable the simulated computing device to utilize the version of the trained model during simulated operation. In one example context, an updated version of the trained model is applied to a simulated data-controlled robot to cause the simulated data-controlled robot to utilize the updated version of the trained model during simulated operation for simulated interaction(s) within the updated simulated environment.

At optional operation 1210, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to run the updated simulated environment over a timestamp interval. By running the updated simulated environment, the real-time simulation apparatus 200 may generate simulated data that represents the results of simulated interaction(s) within the simulated environment, simulated data captured within the simulated environment, and/or the like. It will be appreciated that running the updated simulated environment may represent simulating individual operation of each element as configured in the updated simulated environment, for example with some or all elements corresponding to real-world elements in the corresponding real-world environment represented via the updated simulated environment. In this regard, the updated simulated environment may be run to test alteration(s) to the real-world environment via the updated simulated environment, for example by applying an updated version of the trained model to update configuration of simulated version(s) of one or more real-time sensor(s), data-controlled robot(s), and/or the like in the updated simulated environment. The timestamp interval may correspond to real time passage, or may be a simulated timestamp interval (e.g., with each timestep processed in a simulated manner).

At operation 1212, the real-time simulation apparatus 200 includes means, such as the real-time data intake circuitry 210, the model management circuitry 212, the simulation management circuitry 214, the communications circuitry

208, the input/output circuitry 206, the processor 202, and/or the like, or a combination thereof, to determine at least one simulated operational metric value associated with the updated simulated environment. In some embodiments, the at least one simulated operational metric value is determined based at least in part on simulated operation of at least one simulated computing device in the updated simulated environment utilizing the trained model. The simulated operational metric value(s) may be determined during running of the updated simulated environment, for example as described at operation 1210. In this regard, the at least one simulated operational metric value may represent the results of the simulated operation of the updated simulated environment with alteration(s) to the functioning of the at least one simulated computing device by utilizing and/or being configured by the updated version of the trained model. The at least one simulated operational metric value may thus represent any aspect measured from the simulated operation of the updated simulated environment, and may accurately reflect said aspect if the same update was made to actual computing device(s) in the corresponding real-world environment.

FIG. 13 illustrates a flowchart depicting example operations for determining a preferred model in accordance with at least some example embodiments of the present disclosure Specifically, FIG. 13 depicts operations of an example process 1300. In some embodiments, the process 1300 is embodied by computer program code stored on a non-transitory computer-readable storage medium of a computer program product configured for execution to perform the process as depicted and described. Alternatively or additionally, in some embodiments, the process 1300 is performed by one or more specially configured computing devices, such as the real-time simulation apparatus 200. Such computing devices may perform the operations of the described processes alone or in communication with one or more other component(s), device(s), system(s), and/or the like. In this regard, in some such embodiments, the computing device(s) is/are specially configured by computer-coded instructions (e.g., computer program instructions) stored thereon, for example in a memory and/or another component depicted and/or described herein and/or otherwise accessible to the computing device(s), for performing the operations as depicted and described. In some embodiments, the computing device(s) is/are in communication with one or more external apparatus(es), system(s), device(s), and/or the like, to perform one or more of the operations as depicted and described. For example, in one example context, the real-time simulation apparatus 200 is in communication with one or more real-time sensors, data-controlled robot(s), and/or the like. For purposes of simplifying the description, the process 1300 is described as performed by and from the perspective of the real-time simulation apparatus 200.

The process 1300 begins at operation 1302. In some embodiments, the process 1300 begins after one or more operations depicted and/or described with respect to any of the other processes described herein. For example, in some embodiments as depicted, the process 1300 begins after execution of operation 1206. In this regard, some or all of the process 1300 may replace or supplement one or more blocks depicted and/or described with respect to any of the other processes described herein. Upon completion of the process 1300, the flow of operations may terminate. Additionally or alternatively, in some embodiments, upon completion of the process 1300, flow may return to one or more operations of another process, for example operation 1002. In some embodiments, the process 1300 restarts upon completion. It should be appreciated that, in some embodiments, the process 1230 embodies a subprocess of one or more other process(es), such as the process 1200.

At operation 1302, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to apply a first trained model to at least a portion of a first instance of the updated simulated environment. In this regard, the first trained model may be applied to alter configuration(s) and/or performance of one or more simulated computing device(s) in the first instance of the updated simulated environment. For example, the first trained model may be applied to one or more simulated data-controlled robot(s) of the first instance of the updated simulated environment such that the simulated data-controlled robot(s) utilize the first trained model to perform interactions during simulated operation of the first instance of the updated simulated environment.

At operation 1304, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to determine a first at least one simulated operational metric value associated with the first instance of the updated simulated environment. The first at least one simulated operational metric value may correspond to a particular at least one simulated operational metric. In this regard, the first at least one simulated operational metric value may represent any measurable and/or determinable aspects of the simulated operation of the first instance of the updated simulated environment. The simulated operation may depend at least in part on simulated operation of a first at least one simulated computing device in the first instance of the updated simulated environment, where the first at least one simulated computing device utilizes the first trained model. In this regard, the at least one simulated operational metric may be based at least in part on how the at least one simulated computing device performs upon configuration and/or utilization of the first trained model. For example, in some embodiments the real-time simulation apparatus 200 applies the first trained model to one or more simulated data-controlled robot(s) within the first instance of the updated simulated environment at operation 1302, such that the first at least one simulated operational metric value is derived based at least in part on measurable performance of the one or more simulated data-controlled robot(s) that rely on the first trained model.

At operation 1306, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to apply a second trained model to at least a portion of a second instance of the updated simulated environment. In this regard, the second trained model may be applied to alter configuration(S) and/or performance of one or more simulated computing device(s) in the second instance of the updated simulated environment. In some circumstances, the first instance and the second instance of the updated simulated environment are otherwise similarly configured. For example, the second trained model may be applied to one or more simulated data-controlled robot(s) of the second instance of the updated simulated environment, such that the simulated data-controlled robot(s) utilize the second trained model to perform interactions during simulated operation of the second instance of the updated simulated environment. It will be appreciated that the first instance of the updated simulated model and the second instance of the updated simulated model may be maintained separately, such that the simulated operation of such instances is performed independently.

At operation 1308, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to determine a second at least one simulated operational metric value associated with the second instance of the updated simulated environment. The second at least one simulated operational metric value may correspond to the same at least one operational metric as the first at least one simulated operational metric value as described with respect to operation 1304. The second at least one simulated operational metric value may be measured and/or otherwise determined during simulated operation of the second instance of the updated simulated environment. It will be appreciated that, for example, the second at least one simulated operational metric may be based at least in part on how the second at least one simulated computing device performs upon configuration and/or utilization of the second trained model. Based on the differences between the first trained model and the second trained model, the resulting simulated operation of each of the first instance of the updated simulated environment and the simulated operation of the second instance of the updated simulated environment may differ.

At operation 1310, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to determine a preferred model of the first trained model and the second trained model. The preferred model may represent either the first trained model or the second trained model based on which of the models resulted in preferred metric values. In some embodiments, the preferred model is determined based at least in part on the first at least one simulated operational metric value and the second at least one simulated operational metric value. For example, the real-time simulation apparatus 200 may compare the first operational metric value generated based on simulated operation of the first instance of the updated simulated environment and the second operational metric value generated based on simulated operation of the second instance of the updated simulated environment to identify which metric value indicates a more preferable result for a particular operational metric. In this regard, the model corresponding to the simulated operational metric value that represents the more preferable result (e.g., a higher metric value in some circumstances such as tasks performed per hour, or a lower metric value in other circumstances such as error percentage) may be determined as the preferred model. The preferred model may be stored for use in applying to one or more simulated environment(s) and/or one or more real-world environments (e.g., to alter one or more computing devices thereof).

FIG. 14 illustrates a flowchart depicting example operations for automatically configuring computing device(s) based on operation of a simulated environment in accordance with at least some example embodiments of the present disclosure. Specifically, FIG. 14 depicts operations of an example process 1400. In some embodiments, the process 1400 is embodied by computer program code stored on a non-transitory computer-readable storage medium of a computer program product configured for execution to perform the process as depicted and described. Alternatively or additionally, in some embodiments, the process 1400 is performed by one or more specially configured computing devices, such as the real-time simulation apparatus 200. Such computing devices may perform the operations of the described processes alone or in communication with one or more other component(s), device(s), system(s), and/or the like. In this regard, in some such embodiments, the computing device(s) is/are specially configured by computer-coded instructions (e.g., computer program instructions) stored thereon, for example in a memory and/or another component depicted and/or described herein and/or otherwise accessible to the computing device(s), for performing the operations as depicted and described. In some embodiments, the computing device(s) is/are in communication with one or more external apparatus(es), system(s), device(s), and/or the like, to perform one or more of the operations as depicted and described. For example, in one example context, the real-time simulation apparatus 200 is in communication with one or more real-time sensors, data-controlled robot(s), and/or the like. For purposes of simplifying the description, the process 1400 is described as performed by and from the perspective of the real-time simulation apparatus 200.

The process 1400 begins at operation 1402. In some embodiments, the process 1400 begins after one or more operations depicted and/or described with respect to any of the other processes described herein. For example, in some embodiments as depicted, the process 1400 begins after execution of operation 1010. In this regard, some or all of the process 1400 may replace or supplement one or more blocks depicted and/or described with respect to any of the other processes described herein. Upon completion of the process 1400, the flow of operations may terminate. Additionally or alternatively, in some embodiments, upon completion of the process 1400, flow may return to one or more operations of another process, for example operation 1012. In some embodiments, the process 1400 restarts upon completion. It should be appreciated that, in some embodiments, the process 1400 embodies a subprocess of one or more other process(es), such as the process 1000.

At optional operation 1402, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to reconfigure at least a portion of the updated simulated environment. In some embodiments, the updated simulated environment is reconfigured by applying one or more model(s) to the updated simulated environment, such as to alter operation of one or more simulated real-time sensor(s), one or more data-controlled robot(s), and/or the like. In this regard, one or more simulated computing device may be reconfigured, for example for utilizing the applied trained model. Alternatively or additionally, in some embodiments, the updated simulated environment is reconfigured by adding one or more simulated entities within the updated simulated environment, such as a new simulated computing device, new simulated real-time sensor, new simulated data-controlled robot, and/or the like. In other embodiments, simulated items (e.g., to be picked by the simulated data-controlled robots) may be updated to test new task operation(s), and/or the same task operation for a new type of item.

At optional operation 1404, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to run the updated simulated environment over a timestamp interval. The updated simulated environment may be run as described herein with respect to operation 1210. The updated simulated environment may produce simulated data accordingly, such as simulated operational metric value(s), simulated real-time data, results of simulated task operation(s), and/or the like. The simulated data may be based at least in part on the reconfiguration performed at operation 1402.

At operation 1406, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to determine at least one simulated operational metric value associated with the updated simulated environment. The at least one simulated operational metric value may be determined based at least in part on the simulated operation of the updated simulated environment after reconfiguration. In this regard, the at least one simulated operational metric value may be determined from and/or represented by results data outputted via running updated simulated environment, for example at operation 1404.

At operation 1408, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to receive at least one operational metric value associated with operation of the real-world environment. In some embodiments, the operational metric value associated with operation of the real-world is received as real-time data, for example from another system that monitors the at least one operational metric associated with the real-world environment based on real-time sensor data therefrom. Alternatively or additionally, in some embodiments, the real-time simulation apparatus 200 receives real-time sensor data associated with the real-time environment and receives the at least one operational metric value by determining the at least one operational metric value from the real-time sensor data. It will be appreciated that, dependent on how the updated simulated environment is reconfigured, the at least one simulated metric value may indicate better or worse performance than the corresponding operational metric value for the corresponding real-world environment.

At operation 1410, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to determine comparison results by comparing the at least one operational metric value associated with operation of the real-world environment with at least one simulated operational metric value associated with the updated simulated environment after reconfiguration. In some embodiments, the comparison results indicates which of the operational metric value and/or simulated operational metric value for a particular operational metric is higher (or in some contexts, lower) indicating better performance. Alternatively or additionally, in some embodiments, the comparison results indicate which of the operational metric value and/or simulated operational metric value is closer in value to a target value, thus indicating better performance. In this regard, the comparison results may indicate whether the reconfiguration improved performance based on a particular operational metric based on simulated data from the updated simulated environment.

At operation 1412, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to determine whether the comparison results indicate improvement in the at least one operational metrics, for example based on the simulated operational metric values compared to the operational metric values for the real-world environment. In circumstances where the comparison results indicate an improvement in the operational metrics, flow proceeds to operation 1414. In circumstances where the comparison results do not indicate an improvement in the operational metrics, the flow continues to the end block or terminates.

At operation 1414, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to automatically configure at least one computing device in the real-world environment in accordance with the reconfiguration of the updated simulated environment. In this regard, the real-world environment may be updated in a manner that reflects the reconfiguration performed via the updated simulated environment, and that via comparison indicated improvement in one or more operational metrics. In some embodiments, the real-time simulation apparatus 200 automatically configures one or more data-controlled robot(s) by applying a new or updated trained model to such data-controlled robot(s). Alternatively or additionally, the real-time simulation apparatus 200 may activate one or more real-time sensor(s), and/or change a configuration setting of one or more real-time sensor(s), in accordance with the reconfiguration tested via the updated simulated environment. It will be appreciated that, upon automatically configuring the at least one computing device in the real-world environment, the performance of operations within the real-world environment may be improved as indicated from the updated simulated environment. Alternatively, in some embodiments, the real-time simulation apparatus 200 generates a request for user authorization to reconfigure one or more elements of the real-world environment. In a circumstance where the real-time simulation apparatus 200 receives data indicating approval of the request for user authorization, the real-time simulation apparatus 200 causes reconfiguration and/or otherwise initiates changes in the real-world environment.

FIG. 15 illustrates a flowchart depicting example operations for updating a trained model based on simulated data in accordance with at least some example embodiments of the present disclosure. Specifically, FIG. 15 depicts operations of an example process 1500. In some embodiments, the process 1500 is embodied by computer program code stored on a non-transitory computer-readable storage medium of a computer program product configured for execution to perform the process as depicted and described. Alternatively or additionally, in some embodiments, the process 1500 is performed by one or more specially configured computing devices, such as the real-time simulation apparatus 200. Such computing devices may perform the operations of the described processes alone or in communication with one or more other component(s), device(s), system(s), and/or the like. In this regard, in some such embodiments, the computing device(s) is/are specially configured by computer-coded instructions (e.g., computer program instructions) stored thereon, for example in a memory and/or another component depicted and/or described herein and/or otherwise accessible to the computing device(s), for performing the operations as depicted and described. In some embodiments, the computing device(s) is/are in communication with one or more external apparatus(es), system(s), device(s), and/or the like, to perform one or more of the operations as depicted and described. For example, in one example context, the real-time simulation apparatus 200 is in communication with one or more real-time sensors, data-controlled robot(s), and/or the like. For purposes of simplifying the description, the process 1500 is described as performed by and from the perspective of the real-time simulation apparatus 200.

The process 1500 begins at operation 1502. In some embodiments, the process 1500 begins after one or more operations depicted and/or described with respect to any of the other processes described herein. For example, in some embodiments as depicted, the process 1500 begins after execution of operation 1010. In this regard, some or all of the process 1500 may replace or supplement one or more blocks depicted and/or described with respect to any of the other processes described herein. Upon completion of the process 1500, the flow of operations may terminate. Additionally or alternatively, in some embodiments, upon completion of the process 1500, flow may return to one or more operations of another process, for example operation 1012. In some embodiments, the process 1500 restarts upon completion. It should be appreciated that, in some embodiments, the process 1500 embodies a subprocess of one or more other process(es), such as the process 1000.

At operation 1502, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to apply a trained model to at least one simulated data-controlled robot of the updated simulated environment. In some embodiments, applying the trained model causes the at least one simulated data-controlled robot to utilize the trained model during simulated operation to perform simulated interactions within the updated simulated environment. The at least one simulated data-controlled robot may store the trained model applied to it for such use. In some embodiments, the trained model may be an entirely new model, a new version of a previous model, and/or the like. In this regard, the simulated data-controlled robot may function in a new manner based at least in part on utilizing the trained model.

At operation 1504, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to generate simulated data associated with simulated operation of the at least one simulated data-controlled robot of the updated simulated environment. In some embodiments, the updated simulation environment is run to generate the simulated data. The simulated data may include results of simulated interaction(s) performed by the at least one simulated data-controlled robot during simulated operation of the updated simulated environment, such as indications of whether simulated interaction(s) were successful or resulted in error data object(s). Alternatively or additionally, the simulated data may include simulated real-time data associated with simulated operation of the updated simulated environment. It will be appreciated that any combination of simulated data may be generated during simulated operation of a simulated environment, for example simulated versions of data that corresponds to any type of data available and/or monitored during operation of the corresponding real-world environment.

At operation 1506, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to update the trained model based at least in part on the simulated data associated with simulated operation of the at least one simulated data-controlled robot. In one example context, as the simulated data-controlled robot detects and/or otherwise experiences error data object(s) resulting from its simulated operation, the trained model may be further trained based on the error data object(s) resulting from the simulated operation. Additionally or alternatively, in some embodiments, the trained model is updated based at least in part on simulated real-time data generated via the simulated operation of the at least one simulated data-controlled robot. It will be appreciated that, in some embodiments, only particular types of simulated data may be used for training. For example, in some embodiments, simulated image data may not be suitable for use in training due to a high probability of being inconsistent, poorly simulated, and/or otherwise not including all features required for accurate training.

FIG. 16 illustrates a flowchart depicting example operations for aborting application of a trained model to a simulated environment upon detection of simulated error data object(s) in accordance with at least some example embodiments of the present disclosure. Specifically, FIG. 16 depicts operations of an example process 1600. In some embodiments, the process 1600 is embodied by computer program code stored on a non-transitory computer-readable storage medium of a computer program product configured for execution to perform the process as depicted and described. Alternatively or additionally, in some embodiments, the process 1600 is performed by one or more specially configured computing devices, such as the real-time simulation apparatus 200. Such computing devices may perform the operations of the described processes alone or in communication with one or more other component(s), device(s), system(s), and/or the like. In this regard, in some such embodiments, the computing device(s) is/are specially configured by computer-coded instructions (e.g., computer program instructions) stored thereon, for example in a memory and/or another component depicted and/or described herein and/or otherwise accessible to the computing device(s), for performing the operations as depicted and described. In some embodiments, the computing device(s) is/are in communication with one or more external apparatus(es), system(s), device(s), and/or the like, to perform one or more of the operations as depicted and described. For example, in one example context, the real-time simulation apparatus 200 is in communication with one or more real-time sensors, data-controlled robot(s), and/or the like. For purposes of simplifying the description, the process 1600 is described as performed by and from the perspective of the real-time simulation apparatus 200.

The process 1600 begins at operation 1602. In some embodiments, the process 1600 begins after one or more operations depicted and/or described with respect to any of the other processes described herein. For example, in some embodiments as depicted, the process 1600 begins after execution of operation 1008. In this regard, some or all of the process 1600 may replace or supplement one or more blocks depicted and/or described with respect to any of the other processes described herein. Upon completion of the process 1600, the flow of operations may terminate. Additionally or alternatively, in some embodiments, upon completion of the process 1600, flow may return to one or more operations of another process, for example operation 1002. In some embodiments, the process 1600 restarts upon completion. It should be appreciated that, in some embodiments, the process 1600 embodies a subprocess of one or more other process(es), such as the process 1000.

At operation 1602, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to apply a trained model to at least one simulated data-controlled robot of the updated simulated environment. The trained model may be applied in the manner described herein with respect to operation 1502.

At operation 1604, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to detect at least one simulated error data object associated with simulated operation of the at least one simulated data-controlled robot. In some embodiments, the at least one simulated error data object triggers a process for aborting testing of the trained model and/or simulated operation of the updated simulated environment. In some embodiments, the at least one simulated error data object is tracked to determine whether the proportion and/or percentage of simulated interaction(s) resulting in a simulated error data object exceeds a particular threshold (e.g., a current proportion or percentage determined from interactions during operation of the corresponding real-world environment, a minimum accuracy threshold, and/or the like). Alternatively or additionally, in some embodiments, the real-time simulation apparatus 200 detects other condition(s) associated with the trained model to abort the simulated operation and/or deployment of the trained model. For example, in some embodiments, the real-time simulation apparatus 200 determines whether the accuracy data for the version of the trained model being tested satisfies an improvement threshold when compared with previous accuracy data for an implemented version of the trained model.

At operation 1606, the real-time simulation apparatus 200 includes means, such as the real-time data intake circuitry 210, the model management circuitry 212, the simulation management circuitry 214, the communications circuitry 208, the input/output circuitry 206, the processor 202, and/or the like, or a combination thereof, to continue updating the trained model without applying the trained model to any portion of the updated simulated environment. In some embodiments, the process is aborted and flow returns to operation 1002 as described herein. In this regard, real-time data may continue be received and utilized to further update the trained model. Additionally or alternatively, in some embodiments, the trained model is further updated based at least in part on simulated data, as described herein, generated before aborting the simulated operation of the updated simulated environment. In this regard, the trained model may continue to be updated until an improvement threshold is met with respect to tested accuracy data for an updated version of the trained model, an improvement threshold is met with respect to operational metric values and corresponding simulated operational metric values, and/or the at least one simulated error data object(s) are reduced or eliminated. Such embodiments may reduce the computing resources expended on testing and/or applying trained model to configure one or more aspects of a real-world environment that provide marginal improvements or increase error(s) during operation.

Conclusion

Although an example processing system has been described above, implementations of the subject matter and the functional operations described herein can be implemented in other types of digital electronic circuitry, or in computer software, firmware, or hardware, including the structures disclosed in this specification and their structural equivalents, or in combinations of one or more of them. Embodiments of the subject matter and the operations described herein can be implemented in digital electronic circuitry, or in computer software, firmware, or hardware, including the structures disclosed in this specification and their structural equivalents, or in combinations of one or more of them. Embodiments of the subject matter described herein can be implemented as one or more computer programs, i.e., one or more modules of computer program instructions, encoded on computer storage medium for execution by, or to control the operation of, information/data processing apparatus. Alternatively, or in addition, the program instructions can be encoded on an artificially-generated propagated signal, e.g., a machine-generated electrical, optical, or electromagnetic signal, which is generated to encode information/data for transmission to suitable receiver apparatus for execution by an information/data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described herein can be implemented as operations performed by an information/data processing apparatus on information/data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a repository management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or information/data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communications network.

The processes and logic flows described herein can be performed by one or more programmable processors executing one or more computer programs to perform actions by operating on input information/data and generating output. Processors suitable for the execution of a computer program include, by way of example, both general and special purpose microprocessors, and any one or more processors of any kind of digital computer. Generally, a processor will receive instructions and information/data from a read-only memory or a random access memory or both. The essential elements of a computer are a processor for performing actions in accordance with instructions and one or more memory devices for storing instructions and data. Generally, a computer will also include, or be operatively coupled to receive information/data from or transfer information/data to, or both, one or more mass storage devices for storing data, e.g., magnetic, magneto-optical disks, or optical disks. However, a computer need not have such devices. Devices suitable for storing computer program instructions and information/data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described herein can be implemented on a computer having a display device, e.g., a CRT (cathode ray tube) or LCD (liquid crystal display) monitor, for displaying information/data to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described herein can be implemented in a computing system that includes a back-end component, e.g., as an information/data server, or that includes a middleware component, e.g., an application server, or that includes a front-end component, e.g., a client computer having a graphical user interface or a web browser through which a user can interact with an implementation of the subject matter described herein, or any combination of one or more such back-end, middleware, or front-end components. The components of the system can be interconnected by any form or medium of digital information/data communication, e.g., a communications network. Examples of communications networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communications network. The relationship of client and server arises by virtue of computer programs running on the respective computers and having a client-server relationship to each other. In some embodiments, a server transmits information/data (e.g., an HTML page) to a client device (e.g., for purposes of displaying information/data to and receiving user input from a user interacting with the client device). Information/data generated at the client device (e.g., a result of the user interaction) can be received from the client device at the server.

While this specification contains many specific implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. An apparatus comprising at least one processor and at least one memory, the at least one memory having computer-coded instructions stored thereon that, in execution with the at least one processor causes the apparatus to:

retrieve a trained model corresponding to a real-world environment;

receive, via a communications network, a real-time data set associated with the real-world environment;

updating the trained model based on the real-time data to generate an updated trained model;

generate an updated simulated environment based on the real-time data set associated with the real-world environment; and initiate at least one process based on the updated simulated environment, wherein to initiate the at least one process based on the updated simulated environment, the apparatus is caused to:

apply the trained model and the updated trained model to at least a portion of the updated simulated environment;

determine at least first simulated operational metric value associated with the updated simulated environment based on a simulated operation of at least one simulated computing device in the updated simulated environment utilizing the trained model;

determine at least second simulated operational metric value associated with the updated simulated environment based on the simulated operation of the at least one simulated computing device in the updated simulated environment utilizing the updated trained model;

identify a first accuracy data associated with the updated trained model and a second accuracy data associated with the trained model, wherein the first accuracy data is determined by comparing the at least first simulated operational metric value associated with the trained model and at least one real-time operational metric value, wherein the second accuracy data is determined by comparing the at least second simulated operational metric value associated with the updated trained model and the at least one real-time operational metric value;

determine a difference between the first accuracy data and the second accuracy data; and compare the difference with an improvement threshold value, wherein the apparatus applies the updated trained model to the at least portion of the updated simulated environment if the difference is equal or greater than the improvement threshold value.

2. The apparatus according to claim 1, wherein to initiate the at least one process based on the updated simulated environment, the apparatus is caused to:

cause rendering of a user interface representing the at least portion of the updated simulated environment.

3. The apparatus according to claim 1, wherein to initiate the at least one process based on the updated simulated environment the apparatus is caused to:

identify the at least one real-time operational metric value associated with the updated simulated environment, the at least one real-time operational metric value corresponding to at least one operational metric;

retrieve at least one historical operational metric value associated with the real-world environment, the at least one historical operational metric value corresponding to the at least one operational metric; and cause rendering of a dashboard interface comprising data representing a trend of the at least one operational metric based on the at least one real-time operational metric value and the at least one historical operational metric value.

4. The apparatus according to claim 1, wherein to initiate the at least one process based on the updated simulated environment, the apparatus is caused to:

cause rendering of an augmented reality interface representing the at least portion of the updated simulated environment.

5. The apparatus according to claim 1, the apparatus further caused to:

cause rendering of a dashboard interface comprising at least the at least second simulated operational metric value associated with the updated simulated environment.

6. The apparatus according to claim 1, the apparatus further caused to:

receive the at least one real-time operational metric value associated with the simulated operation of the real-world environment, the at least one real-time operational metric value corresponding to at least one operational metric;

determine the first accuracy data by comparing the at least one real-time operational metric value associated with the simulated operation of the real-world environment with the at least first simulated operational metric value associated with the trained model;

determine the second accuracy data by comparing the at least one real-time operational metric value associated with the simulated operation of the real-world environment with the at least second simulated operational metric value associated with the updated trained model; and in response to determining the difference between the first accuracy data and the second accuracy data, compare the at least first simulated operational metric value associated with the trained model and the at least second simulated operational metric value associated with the updated trained model:

automatically configure at least one computing device in the real-world environment utilizing the updated trained model.

7. The apparatus according to claim 1, the apparatus further caused to:

identify the first accuracy data associated with the updated trained model and the second accuracy data associated with the trained model;

determine the difference between the first accuracy data and the second accuracy data; and compare the difference with the improvement threshold value, wherein if the difference is smaller than the improvement threshold value, continue to update the trained model without applying the trained model to the portion of the updated simulated environment.

8. The apparatus according to claim 1, wherein to initiate the at least one process based on the updated simulated environment, the apparatus is caused to:

reconfigure the at least portion of the updated simulated environment;

determine the at least second simulated operational metric value associated with the updated simulated environment based on the simulated operation of the updated simulated environment after reconfiguration;

receive the at least one real-time operational metric value associated with the simulated operation of the real-world environment;

determine comparison results by comparing the at least one real-time operational metric value associated with operation of the real-world environment with the at least second simulated operational metric value associated with the updated simulated environment after a reconfiguration; and in response to determining the comparison results indicate the at least second simulated operational metric value improves the at least one operational metric compared to the at least one real-time operational metric value associated with the simulated operation of the real-world environment:

automatically configure at least one computing device in the real-world environment in accordance with the reconfiguration of the updated simulated environment.

9. The apparatus according to claim 1, wherein to initiate the at least one process based on the updated simulated environment, the apparatus is caused to:

apply the trained model to at least one simulated data-controlled robot of the updated simulated environment;

detect at least one simulated error data object associated with simulated operation of the at least one simulated data-controlled robot; and in response to detecting the at least one simulated error data object, continue to update the trained model without applying the trained model to the portion of the updated simulated environment.

10. The apparatus according to claim 1, the apparatus further caused to:

apply the trained model to at least one simulated data-controlled robot of the updated simulated environment;

generate simulated data associated with the simulated operation of the at least one simulated data-controlled robot of the updated simulated environment; and update the trained model based on the simulated data associated with the simulated operation of the at least one simulated data-controlled robot.

11. The apparatus according to claim 1, wherein to initiate the at least one process based on the updated simulated environment, the apparatus is caused to:

apply the trained model to the at least portion of a first instance of the updated simulated environment;

determine the at least first simulated operational metric value associated with the first instance of the updated simulated environment based on a simulated operation of a first the at least one simulated computing device in the first instance of the updated simulated environment utilizing the trained model, the at least first simulated operational metric value corresponding to at least one operational metric;

apply the updated trained model to the at least portion of a second instance of the updated simulated environment;

determine the at least second simulated operational metric value associated with the second instance of the updated simulated environment based on the simulated operation of a second the at least one simulated computing device in the second instance of the updated simulated environment utilizing the updated trained model, the at least second simulated operational metric value corresponding to the at least one operational metric; and determine a preferred model of the trained model and the updated trained model based on the at least first simulated operational metric value and the at least second simulated operational metric value.

12. The apparatus according to claim 1, the apparatus further caused to:

store the real-time data set, the real-time data set retrieved during generation of a second updated environment.

13. The apparatus according to claim 1, wherein the real-time data set comprises a plurality of sensor data types, the plurality of sensor data types comprising LiDAR data, distance data, pressure sensor data, temperature data, and/or image data.

14. The apparatus according to claim 1, wherein the real-time data set comprises data-controlled robot movement data, the at least one real-time operational metric value, and real-time sensor data.

15. The apparatus according to claim 1, the apparatus further caused to:

derive at the one real-time operational metric value corresponding to at least one operational metric, the at least one real-time operational metric value derived based on real-time sensor data of the real-time data set.

16. The apparatus according to claim 1, wherein to initiate the at least one process based on the updated simulated environment, the apparatus is caused to:

cause rendering of a user interface representing the at least portion of the updated simulated environment, the user interface dynamically updating as new real-time data is received; and simultaneously while causing rendering of the user interface:

apply the trained model to the at least portion of the updated simulated environment; and determine the at least second simulated operational metric value associated with the updated simulated environment based on a simulated operation of the at least one simulated computing device in the updated simulated environment utilizing the trained model.

17. A computer-implemented method comprising:

retrieving a trained model corresponding to a real-world environment;

receiving, via a communications network, real-time data set associated with the real-world environment;

updating the trained model based on the real-time data to generate an updated trained model;

generating an updated simulated environment based on the real-time data set associated with the real-world environment; and initiating at least one process based on the updated simulated environment, wherein, to initiate the at least one process based on the updated simulated environment, the computer-implemented method further comprises:

applying the trained model and the updated trained model to at least a portion of the updated simulated environment;

determining at least first simulated operational metric value associated with the updated simulated environment based on a simulated operation of at least one simulated computing device in the updated simulated environment utilizing the trained model;

determining at least second simulated operational metric value associated with the updated simulated environment based on the simulated operation of the at least one simulated computing device in the updated simulated environment utilizing the updated trained model;

identifying a first accuracy data associated with the updated trained model and a second accuracy data associated with the trained model, wherein the first accuracy data is determined by comparing the at least first simulated operational metric value associated with the trained model and at least one real-time operational metric value, wherein the second accuracy data is determined by comparing the at least second simulated operational metric value associated with the updated trained model and the at least one real-time operational metric value;

determining a difference between the first accuracy data and the second accuracy data; and comparing the difference with an improvement threshold value and apply the updated trained model to the at least portion of the updated simulated environment if the difference is equal or greater than the improvement threshold value.

18. A computer program product comprising at least one non-transitory computer-readable storage medium having computer program code stored thereon that, in execution with at least one processor, configures the computer program product for:

retrieving a trained model corresponding to a real-world environment;

receiving, via a communications network, a real-time data set associated with the real-world environment;

updating the trained model based on the real-time data to generate an updated trained model;

generating an updated simulated environment based on the real-time data set associated with the real-world environment; and initiating at least one process based on the updated simulated environment, wherein to initiate the at least one process based on the updated simulated environment, the processor further configures the computer program product to:

apply the trained model and the updated trained model to at least a portion of the updated simulated environment;

determine at least first simulated operational metric value associated with the updated simulated environment based on a simulated operation of at least one simulated computing device in the updated simulated environment utilizing the trained model;

determine at least second simulated operational metric value associated with the updated simulated environment based on the simulated operation of the at least one simulated computing device in the updated simulated environment utilizing the updated trained model;

identify a first accuracy data associated with the updated trained model and a second accuracy data associated with the trained model, wherein the first accuracy data is determined by comparing the at least first simulated operational metric value associated with the trained model and at least one real-time operational metric value, wherein the second accuracy data is determined by comparing the at least second simulated operational metric value associated with the updated trained model and the at least one real-time operational metric value;

determine a difference between the first accuracy data and the second accuracy data; and compare the difference with an improvement threshold value, wherein the at least one processor applies the updated trained model to the at least portion of the updated simulated environment if the difference is equal or greater than the improvement threshold value.

\* \* \* \* \*